(12) United States Patent
Nishi

(10) Patent No.: US 6,522,386 B1
(45) Date of Patent: Feb. 18, 2003

(54) EXPOSURE APPARATUS HAVING PROJECTION OPTICAL SYSTEM WITH ABERRATION CORRECTION ELEMENT

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/502,042

(22) Filed: Feb. 11, 2000

Related U.S. Application Data

(63) Continuation-in-part of application No. 09/488,570, filed on Jan. 21, 2000, which is a continuation of application No. PCT/JP98/03305, filed on Jul. 24, 1998.

(30) Foreign Application Priority Data

Jul. 24, 1997 (JP) .............................. 9-198154

(51) Int. Cl.[7] ........................ G03B 27/68; G03B 27/42; G03B 27/72
(52) U.S. Cl. .............................. 355/52; 355/53; 355/71
(58) Field of Search ............................ 355/52, 53, 55, 355/67, 71; 356/124, 515; 430/30

(56) References Cited

U.S. PATENT DOCUMENTS

| | | | |
|---|---|---|---|
| 4,458,994 A | 7/1984 | Jain et al. ...................... 354/4 |
| 4,924,257 A | 5/1990 | Jain .............................. 355/53 |
| 4,962,318 A | 10/1990 | Nishi ........................... 250/548 |
| 5,117,255 A | 5/1992 | Shiraishi et al. ............... 355/53 |
| 5,191,374 A | 3/1993 | Hazama et al. ................ 355/43 |
| 5,194,839 A | 3/1993 | Tanaka ......................... 335/43 |
| 5,220,454 A | 6/1993 | Ichihara et al. ............. 359/487 |
| 5,307,207 A | 4/1994 | Ichihara ...................... 359/622 |
| 5,383,217 A | 1/1995 | Uemura ........................ 372/58 |
| 5,392,119 A * | 2/1995 | McArthur et al. .......... 356/515 |
| 5,473,410 A | 12/1995 | Nishi ........................... 355/53 |
| 5,473,424 A | 12/1995 | Okumura ............... 356/139.03 |

(List continued on next page.)

FOREIGN PATENT DOCUMENTS

| JP | A-57-198631 | 12/1982 |
|---|---|---|
| JP | A-1-235289 | 9/1989 |
| JP | A-1-259533 | 10/1989 |

(List continued on next page.)

OTHER PUBLICATIONS

SPIE, vol. 1088, Optical/Laser Microlithography II (1989), "Step and Scan": A Systems overview of a new lithography tool, Buckley et al., pp. 424–433.

*Primary Examiner*—Rodney Fuller
(74) *Attorney, Agent, or Firm*—Oliff & Berridge PLC

(57) ABSTRACT

A static image distortion characteristic is averaged in the width of a projection area in a scanning direction and becomes a dynamic image distortion characteristic, when a mask pattern is scan-exposed onto a photosensitized substrate by a projection exposure apparatus. At least a random component included in the dynamic image distortion characteristic is corrected by a arranging an image correction plate obtained by locally polishing the surface of a transparent parallel plate. Correction plates which minimize other aberrations beforehand are manufactured and installed within a projection optical path, considering that also the other aberrations are averaged and become dynamic aberration characteristics at the time of scan-exposure.

13 Claims, 31 Drawing Sheets

U.S. PATENT DOCUMENTS

| | | | |
|---|---|---|---|
| 5,477,304 A | 12/1995 | Nishi | 355/53 |
| 5,506,684 A | 4/1996 | Ota et al. | 356/401 |
| 5,528,118 A | 6/1996 | Lee | 318/568.17 |
| 5,534,970 A | 7/1996 | Nakashima et al. | 355/53 |
| 5,623,853 A | 4/1997 | Novak et al. | 74/490.09 |
| 5,677,757 A | 10/1997 | Taniguchi et al. | 355/71 |
| 5,680,200 A * | 10/1997 | Sugaya et al. | 355/53 |
| 5,691,802 A | 11/1997 | Takahashi | 355/53 |
| 5,729,331 A | 3/1998 | Tanaka et al. | 355/53 |
| 5,739,899 A | 4/1998 | Nishi et al. | 355/53 |
| 5,744,924 A | 4/1998 | Lee | 318/568.17 |
| 5,841,520 A | 11/1998 | Taniguchi | 355/53 |
| 5,864,433 A | 1/1999 | Takahashi et al. | 359/637 |
| 5,874,820 A | 2/1999 | Lee | 318/575 |
| 5,995,263 A | 11/1999 | Tokuda et al. | 359/196 |
| 6,104,472 A * | 8/2000 | Suzuki | 355/53 |
| 6,245,470 B1 * | 6/2001 | Kamon | 430/30 |
| 6,256,086 B1 * | 7/2001 | Sumiyoshi | 355/55 |
| 6,262,793 B1 | 7/2001 | Sasaya et al. | 355/53 |
| 6,268,903 B1 * | 7/2001 | Chiba et al. | 355/53 |
| 6,333,776 B1 | 12/2001 | Taniguchi | 355/52 |

FOREIGN PATENT DOCUMENTS

| | | |
|---|---|---|
| JP | A-2-54103 | 2/1990 |
| JP | A-2-135723 | 5/1990 |
| JP | A-2-229423 | 9/1990 |
| JP | A-2-294013 | 12/1990 |
| JP | A-3-282527 | 12/1991 |
| JP | A-4-127514 | 4/1992 |
| JP | A-4-134813 | 5/1992 |
| JP | A-4-196513 | 7/1992 |
| JP | A-4-277612 | 10/1992 |
| JP | A-4-307720 | 10/1992 |
| JP | A-6-132195 | 5/1994 |
| JP | A-6-349702 | 12/1994 |
| JP | A-7-57986 | 3/1995 |
| JP | A-7-66110 | 3/1995 |
| JP | A-7-142354 | 6/1995 |
| JP | A-7-201699 | 8/1995 |
| JP | A-8-8157 | 1/1996 |
| JP | A-8-124831 | 5/1996 |
| JP | A-8-166475 | 6/1996 |
| JP | A-8-203805 | 8/1996 |
| JP | A-8-288192 | 11/1996 |
| JP | A-8-304705 | 11/1996 |
| JP | A-8-330224 | 12/1996 |
| JP | A-9-92601 | 4/1997 |
| JP | A-9-115820 | 5/1997 |
| JP | A-9-148234 | 6/1997 |
| JP | A-9-153448 | 6/1997 |
| JP | A-10-27743 | 1/1998 |
| JP | A-10-142555 | 5/1998 |
| JP | A-10-154657 | 6/1998 |
| JP | A-10-294269 | 11/1998 |

* cited by examiner

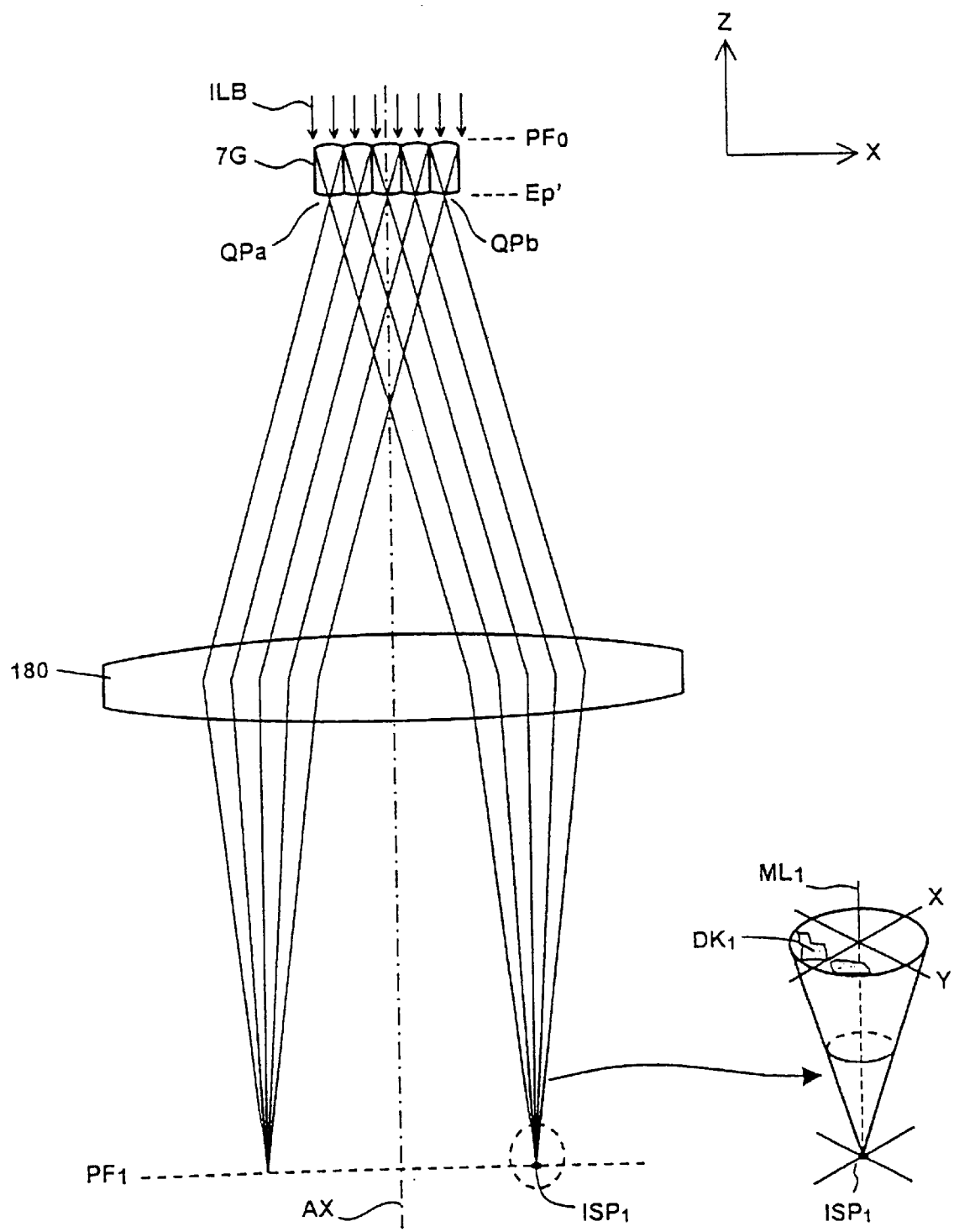
F I G. 7

EXPOSURE APPARATUS HAVING PROJECTION OPTICAL SYSTEM WITH ABERRATION CORRECTION ELEMENT

CROSS REFERENCE TO RELATED APPLICATION

This application is a continuation-in-part of U.S. application Ser. No. 09/488,570, filed Jan. 21, 2000, which in turn is a continuation of international application no. PCT/JP98/03305, filed Jul. 24, 1998, which is incorporated by reference in this application.

BACKGROUND OF THE INVENTION

1. Field of the Invention

The present invention relates to an exposure method and apparatus for accurately exposing a sensitized substrate with a pattern formed on a mask through a projection optical system, and is particularly preferable for a scan-exposure method used in a lithography process for manufacturing a circuit device such as a semiconductor circuit element, a liquid crystal display element, etc.

2. Description of the Related Art

Currently, on a semiconductor device manufacturing scene, a step-and-scan projection exposure apparatus which scan-exposes the whole of a circuit pattern of a reticle to one shot area on a wafer, by using an ultraviolet pulse laser beam having a wavelength of 248 nm from a KrF excimer laser light source or an ultraviolet pulse laser beam having a wavelength of 193 nm from an ArF excimer laser light source as an illumination light, and by performing one-dimensional scanning for a reticle (original version, mask substrate) and a semiconductor wafer, on which a circuit pattern is drawn relatively to a projection field of a reduction projection lens system, is a promising exposure apparatus for manufacturing a circuit device.

Such a step-and-scan projection exposure apparatus has been commercialized and marketed as a micra-scan exposure apparatus which is equipped with a reduction projection optical system composed of a dioptric element (lens element) and a catoptric element (concave mirror, etc.), and is provided by Perkin Elmer Corporation. As explained in detail, for example, on pp. 424–433 in Vol. 1088 of SPIE in 1989, the micra-scan exposure apparatus exposes a shot area on a wafer by scanning and moving a reticle and the wafer at a speed rate according to a projection magnification (reduced to one-fourth) while projecting part of the pattern of the reticle onto the wafer through an effective projection area restricted to an arc slit shape.

Additionally, as a step-and-scan projection exposure method, a method combined with the method which uses an excimer laser light as an illumination light, restricts to a polygon (hexagon) the effective projection area of a reduced projection lens system having a circular projection field, and makes both ends of the effective projection area in a non-scanning direction partially overlap, what is called, a scan-and-stitching method is known, for example, by the Japanese laid-open Publication No. 2-229423 (Jain). Additionally, examples of a projection exposure apparatus adopting such a scan-exposure method are disclosed also by the Japanese laid-open Publications No. 4-196513 (NC:Nishi), No. 4-277612 (NC:Nishi), No. 4-277612 (NC:Nishi), No. 4-307720 (NC:Ota), etc.

With the apparatus which restricts an effective projection area of a projection optical system to an arc or a rectilinear slit shape among projection exposure apparatuses of a scan-exposure type, an image distortion of a pattern transferred onto a wafer as a result of scan-exposure depends on each aberration type of the projection optical system itself or an illumination condition of an illumination optical system as a matter of course. Such an image distortion became an important error budget also for a stepper of a method (stationary exposure method) with which a circuit pattern image on a reticle, which is included in a projection field, is collectively transferred in a shot area on a wafer in a state where a mask and the wafer are made stationary.

Accordingly, a projection optical system mounted in a conventional stepper is optically designed so that the image distortion vector (the direction and the amount of the deviation from the ideal position of each point image at an ideal lattice point), which occurs in each lattice point image, becomes averagely small in an entire projection field. Lens elements and optical members are processed with high accuracy, and assembled as the projection optical system by repeating complicated and time-consuming tests in order to include the image distortion vector within a tolerable range when being designed.

To ease, however little, the difficulty in the manufacturing of such a projection optical system, which requires high accuracy, the method for actually measuring the image distortion characteristic of an assembled projection optical system, for inserting the optical correction plate (quartz plate), which is polished to partially deflect the principal ray passing through each point in a projection field, in a projection optical path so that the actually image distortion characteristic becomes a minimum at each point in the projection field is disclosed, for example, by the Japanese Unexamined Patent Publication No. 8-203805 (NC).

Additionally, the Japanese laid-open Publication No. 6-349702 (Nikon) discloses the method for adjusting aberration characteristics of a projection optical system by rotating some of lens elements configuring the projection optical system about an optical axis in order to improve the image distortion characteristic occurring in a resist image on a photosensitized substrate, which is transferred by scan-exposure. Furthermore, as disclosed by the Japanese laid-open Publications No. 4-127514 (NC:Taniguchi) and No. 4-134813 (N:shiraishi), it is also known that a projection magnification, a distortion aberration, etc. are adjusted by infinitesimally moving some of lens elements configuring a projection optical system.

However, there is a problem in that even if an aberration characteristic is adjusted by rotating some of lens elements configuring a projection optical system or by decentering or tilting an optical axis, this does not always guarantee that a satisfactory aberration characteristic (image distortion characteristic) can be obtained. Furthermore, it is difficult to partially adjust and modify respective characteristics such as a local image distortion, etc. within a projection area.

Therefore, if the optical correction plate disclosed by the Japanese Unexamined Patent Publication No. 8-203805 (NC:Nikon) is manufactured and inserted in a projection optical path, it is anticipated that a local image distortion characteristic within an effective projection area can be easily improved. However, the conventional optical correction plate explained in the Japanese Unexamined Patent Publication No. 8-203805 (NC:Nikon) is not assumed to be applied to the projection optical system used for scan-exposure. Accordingly, if an optical correction plate is manufactured with the method disclosed in this publication as it is, its design and manufacturing become extremely complicated. Especially, the accuracy for processing the shape of a local surface of the optical correction plate with a wavelength order (order of nanometer to micrometer) becomes stricter.

SUMMARY OF THE INVENTION

The present invention was developed in the above described background. A first object of the present invention is to provide an exposure method and apparatus which can accurately expose a substrate with a pattern formed on a mask.

A second object of the present invention is to provide an exposure method and apparatus which can form a mask pattern image on a substrate in a desired state.

A third object of the present invention is to provide an exposure method and apparatus which comprises an optical correction element suitable for a scan-exposure method, and can easily reduce a projection aberration occurring at the time of scan-exposure.

A further object of the present invention is to provide an exposure method for easily reducing an image distortion error occurring when being scan-exposed by using the projection optical system including optical correction elements suitable for a scan-exposure method.

A still further object of the present invention is to provide a projection exposure apparatus including such optical correction elements, and the method for manufacturing a circuit device by using the projection exposure apparatus.

A still further object of the present invention is to provide an image formation performance automatic measurement system for use in a lithography device, which measures an image distortion error of a projection optical system including an optical correction element yet to be processed in a state of being mounted in a projection exposure apparatus of a scanning type, and can automatically simulate a process condition such as a plane shape of an optical correction element to be processed and an installment condition (tilt, etc.) for the projection optical system based on the result of the measurement.

A still further object of the present invention is to easily self-test the performance of a projection exposure apparatus periodically or depending on need by using such an image formation performance automatic measurement system.

A still further object of the present invention is to immediately obtain a change in an image formation performance, which can possibly occur while a projection exposure apparatus is being used on a manufacturing line, especially, a change in a random image distortion error (aberration characteristic).

According to one aspect of the present invention, a pattern of a mask (R) is scan-exposed onto a substrate (W) by moving the mask(R) and the substrate (W) in a scanning direction in a state where the mask (reticle R) is arranged on an object plane side of a projection optical system (PL) having a predetermined image formation characteristic, the substrate (wafer W) is arranged on its image plane side, a partial image of the mask (R) which is projected onto the image plane side is restricted to within a projection area (EIA) having a predetermined width in a one-dimensional scanning direction, and at least one optical correction element (an image distortion correction plate G1, an astigmatism/coma correction plate G3, or an image plane curvature correction plate G4), which is optically processed so that an average aberration characteristic obtained by averaging the projection aberrations at a plurality of image points existing in sequence in the scanning direction becomes a predetermined state at each of a plurality of positions in a non-scanning direction intersecting the scanning direction of the projection area (EIA), is arranged in an image formation optical path by a projection optical system (PL).

According to the present invention of the above described configuration, it becomes possible to satisfactorily correct projection aberrations influenced by the aberrations of both of an illumination optical system and a projection optical system, especially, a dynamic distortion characteristic, an astigmatism characteristic, a coma characteristic, and an image plane curvature characteristic at the time of scan-exposure, thereby accurately exposing a mask pattern onto a substrate.

According to another aspect of the present invention, in an exposure method for exposing a substrate (W) by projecting a pattern of a mask (R) onto the substrate (W) through a projection optical system (PL), a mask pattern image is projected through the projection optical system in a state where the mask (R) and the substrate (W) are arranged, and an astigmatism correction plate (G3) for correcting a random astigmatism characteristic of each image at a plurality of positions within a projection area (EIA) of the projection optical system is arranged between the mask (R) and the substrate (W) in order to expose the substrate.

According to the present invention, it becomes possible to satisfactorily correct a random astigmatism characteristic within a projection area, thereby accurately exposing a mask pattern onto a substrate.

According to a further aspect of the present invention, in an exposure method for exposing a substrate (W) by projecting a pattern of a mask (R) onto the substrate (W) through a projection optical system (PL), a mask pattern image is projected through a projection optical system in a state where the mask (R) and the substrate (W) are arranged, and a coma correction plate (G3) for correcting a random coma characteristic of each image at a plurality of positions within a projection area (EIA) of the projection optical system (PL) is arranged between the mask (R) and the substrate (W) in order to expose the substrate.

According to the present invention, it becomes possible to satisfactorily correct a random coma characteristic within a projection area, thereby accurately exposing a mask pattern onto a substrate.

BRIEF DESCRIPTION OF THE DRAWING

FIG. 7 is a schematic explaining an optical path from a fly-eye lens configuring an illumination optical system to an illuminated plane, and an NA difference of an illumination light focusing on one point on the irradiated surface;

DESCRIPTION OF THE PREFERRED EMBODIMENTS

Figure 1:
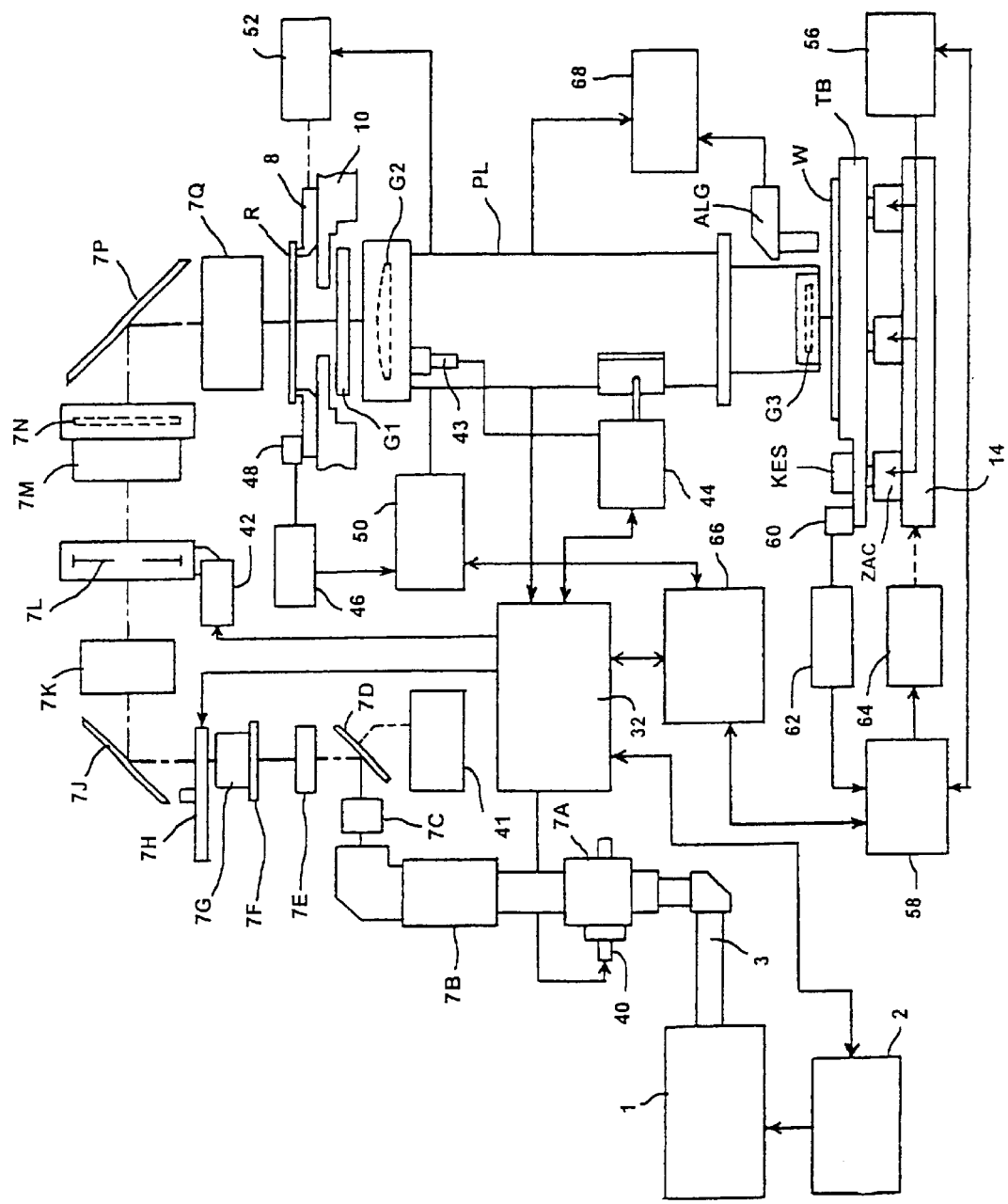
FIG. 1 is a schematic showing the detailed configuration of the main body of a projection exposure apparatus.

The entire configuration of a projection exposure apparatus which is preferable for practicing the present invention is explained by referring to FIG. 1. A projection exposure apparatus shown in FIG. 1 is intended to transfer the whole of a circuit pattern of a reticle in respective shot areas on a wafer W with a step-and-scan method by relatively scanning the reticle and the wafer W in a one-dimensional direction against a field of a projection optical system PL while projecting a partial image of the circuit pattern drawn on the reticle as a mask substrate onto the semiconductor wafer W as a photosensitized substrate through the projection optical system PL. In FIG. 1, it is assumed that the optical axis direction of the projection optical system PL is Z direction, the scanning direction of the reticle R on the plane vertical to the optical axis of the projection optical system PL is Y direction, and the direction vertical to the scanning direction of the reticle R is X direction.

In FIG. 1, after an ultraviolet pulse light output from an excimer laser light source 1 passes through a tube 3 and is adjusted to be a predetermined peak intensity by a variable beam attenuator 7A, it is modified to be a predetermined sectional shape by a beam modifier 7B. The sectional shape is set to be similar to the entire shape of an entrance of a first fly-eye lens system 7C for making the intensity distribution of an illumination light even. Note that the excimer laser light source 1 pulse-emits, representatively, a KrF excimer laser beam having a wavelength of 248 nm or an ArF excimer laser beam having a wavelength of 193 nm.

Additionally, examples of an exposure apparatus which uses excimer laser as a light source are disclosed by the Japanese laid-open Publications No. 57-198631 (IBM), No. 1-259533 (NC: Ichihara), No. 2-135723 (NC: Hazama), No. 2-294013 (NC: Uemura), etc., while examples of an exposure apparatus which uses an excimer laser light source for step-and-scan exposure are disclosed by the Japanese laid-open Publications No. 2-229423, No. 6-132195, No. 7-142354, etc. Accordingly, also to the exposure apparatus shown in FIG. 1, the fundamental techniques disclosed by the above described publications can be applied as they are or by being partially modified.

An ultraviolet pulse light emitted from many point light sources, which is generated on an exit side of the first fly-eye lens system 7C, enters a second fly-eye lens system 7G via a vibration mirror 7D for smoothing interference fringes or a weak speckle occurring on an irradiated plane (a reticle plane or a wafer plane), a collective lens system 7E, an illumination NA correction plate 7F for adjusting the directionality (illumination NA difference) of a numerical aperture on the plane irradiated by an illumination light. The second fly-eye lens system 7G configures a double fly-eye lens system together with the first fly-eye lens system 7C and the collective lens system 7E. The configuration where such a double fly-eye lens system and the vibration mirror 7B are combined is disclosed in detail, for example, by the Japanese laid-open Publications No. 1-235289 (NC: Ichihara) and No. 7-142454 (NC: Ozawa).

On the exit side of the second fly-eye lens system 7G, a switch-type illumination a diaphragm plate 7H for restricting the shape of a light source plane to an annular shape, a small circle, a large circle, etc. or for forming a four separated light source planes is arranged. The ultraviolet pulse light passing through the diaphragm plate 7H is reflected by a mirror 7J, and irradiates the aperture of an illumination field diaphragm (reticle blind) 7L by a collective lens 7K with an uniform intensity distribution.

Note that, however, interference fringes or a weak speckle with a contrast of several percent depending on the coherency of the ultraviolet pulse light from the excimer laser light source 1 may be superposed on the intensity distribution.

Accordingly, on the wafer plane, exposure amount unevenness may occur due to the interference fringes or weak speckle. However, the exposure amount unevenness is smoothed by vibrating the vibration mirror 7D in synchronization with the moving of the reticle or the wafer W at the time of scan-exposure and the oscillation of an ultraviolet pulse light, as disclosed by the above described patent publication No. 7-142354.

The ultraviolet pulse light which passes through the aperture of the reticle blind 7L in this way is irradiated on the reticle R via a collective lens system 7M, an illumination telecentric correction plate (a quartz parallel plate which can be tilted) 7N, a mirror 7P, and a main condenser lens system 7Q. At that time, an illumination area similar to the aperture of the reticle blind 7L is formed on the reticle R. In this preferred embodiment, the illumination area is defined to be a slit shape or a rectangular shape, which extends in the direction orthogonal to the moving direction of the reticle R at the time of scan-exposure. If the width of the shading band in the periphery of a circuit pattern on the reticle is desired to be narrowed or if the scan moving stroke of the reticle is desired to be reduced as short as possible, it is desirable that the mechanism for changing the width of the scanning direction of the reticle blind during scan-exposure is arranged, for example, as recited in the Japanese laid-open Publication No. 4-196513.

The aperture of the reticle blind 7L is set to be conjugate to the reticle R by the collective lens system 7M and the condenser lens system 7Q. Also this aperture is formed to be a slit shape or a =rectangular shape, which extends in the X direction. By such an aperture of the reticle blind 7L, part of the circuit pattern area on the reticle R is illuminated, and the image luminous flux from the illuminated part of the circuit pattern is reduced to one-fourth or one-fifth and projected onto the wafer W through the projection lens system PL.

In this embodiment, it is assumed that the projection lens system PL is a telecentric system on both of the object plane (reticle R) side and the image plane (wafer W) side, and has a circular projection field. Additionally, the projection lens system PL is assumed to be composed of only a dioptric element (lens element) in this embodiment. However, the projection lens system PL may be a catadioptric system where a dioptric element and a catoptric element are combined, as disclosed by the Japanese laid-open Publication No. 3-282527 (NC).

In a position close to the object plane of his projection lens system PL, a telecentric unit lens system G2 which can infinitesimally move or tilt is arranged. By the movement of the lens system G2, the magnification (the aberration of isotropic distortion) or the aberration of non-isotropic distortion such as a barrel-shaped, a spool-shaped, a trapezoid-shaped distortion, etc. of the projection lens system PL can be adjusted finely. Additionally, in a position close to the image plane of the projection lens system PL, an astigmatism/coma aberration correction plate G3 for reducing an astigmatism aberration or coma aberration, which may frequently occur in an area, which is close to the periphery of a projection field, where an image height of a projection image is especially high, and for especially reducing a random astigmatism or coma aberration.

In this embodiment, an image distortion correction plate G1 for effectively reducing a random distortion component included in a projection image formed on an effective image projection area (stipulated by the aperture portion of the reticle blind 7L) within a circular field, is arranged between the lens system G2 of the projection lens system PL and the reticle R. This correction plate G1 is made by locally polishing the surface of a quartz or fluorite parallel plate having a thickness of approximately several millimeters, and infinitesimally deflects the image luminous flux which passes through the polished portion.

For the respective optical components which configure the above described illumination or projection optical paths, a driving mechanism 40 for switching or continually varying a beam attenuation filter of the variable beam attenuator 7A, a driving system 41 for controlling the vibrations (deflection angle) of the vibration mirror 7B, a driving mechanism 42 for moving a blind blade in order to continually vary the shape of the aperture of the reticle blind 7L, especially a slit width, and a driving mechanism 43 for infinitesimally moving the lens system G2 within the projection lens system PL described above are arranged in the system according to this embodiment.

Additionally, in this embodiment, also a lens controller 44 for correcting an isotropic distortion aberration (projection magnification) by sealing a particular air chamber within the projection lens system PL from the open air, and applying a gas pressure within the sealed chamber, for example, in a range of approximately ±20 mmHg. This lens controller 44 also serves as a controlling system for the driving system 43 of the lens system G2, and controls a magnification change by switching between the driving of the lens system G2 and the pressure control of the sealed chamber within the projection lens system PL, or by using both of them.

However, if the ArF excimer laser light source with a wavelength of 193 nm is used as an illumination light, the mechanism for increasing/decreasing the pressure within the particular air chamber within the projection lens system PL may be omitted. This is because the insides of the illumination paths and the lens barrel of the lens system PL are replaced by nitrogen or helium gas.

To part of a reticle stage 8 supporting the reticle R, a movable mirror 48 for reflecting a measurement beam from a laser interferometer 46 for measuring a move position or a move amount is installed. In FIG. 1, the interferometer 46 is illustrated to be suitable for a measurement in the x direction (non-scanning direction). Actually, however, an interferometer for measuring a position in the Y direction and an interferometer for measuring the e direction (rotation direction) are arranged, and movable mirrors corresponding to the respective interferometers are securely disposed to the reticle stage 8. Accordingly, in the explanation provided below, the measurements of the X, Y, and e directions are assumed to be individually made by the laser interferometer 46 at the same time for the sake of convenience.

The positional information (or the speed information) of the reticle stage 8 (that is, the reticle R) measured by the interferometer 46 is transmitted to a stage controlling system 50. The stage controlling system 50 fundamentally controls a driving system (such as a linear motor, a voice coil motor, a piezo motor, etc.) 52 so that the positional information (or the speed information) output from the interferometer 46 matches an instruction value (target position or target speed).

In the meantime, a table TB for supporting and flattering the wafer W with vacuum absorption is arranged on a wafer stage 14. This table TB is infinitesimally moved in the Z direction (the optical axis direction of the projection optical system PL) and tilted relative to the X-Y plane by three actuators (piezo, voice coil, etc.) ZAC arranged on the wafer stage 14. These actuators ZAC are driven by a driving system 56, and a driving instruction to the driving system 56 is issued from a controlling system 58 of the wafer stage.

Although not shown in FIG. 1, a focus leveling sensor for detecting a deviation (focus error) or a tilt (leveling error) in the Z direction between the image plane of the projection optical system PL and the surface of the wafer W is arranged in the neighborhood of the projection optical system PL, and the controlling system 58 controls the driving system 56 in response to a focus error signal or a leveling error signal from that sensor. An example of such a focus/leveling detection system is disclosed in detail by the Japanese laid-open Publication NO. 7-201699 (NC: Okumura).

Additionally, to part of the table TB, a movable mirror 60 used to measure the coordinate position of the wafer W, which changes with the moving of the wafer stage 14 on the X-Y plane, is secured. The position of the movable mirror 60 is measured by a laser interferometer 62. Here, the movable mirror 60 is arranged to measure the movement position (or speed) of the stage 14 in the X direction. Actually, however, also the movable mirror for measuring a movement position in the Y direction is arranged, and a critical dimension measurement beam is irradiated from the laser interferometer also to the movable mirror for the Y direction in a similar manner.

Additionally, the laser interferometer 62 comprises a differential interferometer for measuring an infinitesimal rotation error (including also a yawing component), which can occur on the X-Y plane due to an X-Y move of the wafer stage 14 or an infinitesimal move of the table TB, in real time. The respectively measured positional information of the X, Y, and θ directions of the wafer W are transmitted to the wafer stage controlling system 58. This controlling system 58 outputs a driving signal to the driving system (such as three linear motors) 64 for driving the wafer stage 14 in the X and the Y directions based on the positional or speed information measured by the interferometer 62 and an instruction value.

Furthermore, a synchronous controlling system 66 monitors the states of the respective positions and speeds of the reticle R and the wafer W, which are measured by the respective interferometers 46 and 62 in real time, in order to make the control of the driving system 52, which is performed by the reticle stage controlling system 50, and the control of the driving system 64, which is performed by the wafer stage controlling system 58, reciprocally function, especially when the reticle stage 8 and the wafer stage 14 are synchronously moved at the time of scan-exposure, and manages the reciprocal relationship therebetween to be a predetermined one. The synchronous controlling system 66 is controlled by respective command and parameter types from a minicomputer 32.

In this embodiment, an image detector KES for photoelectrically detecting a test pattern image or an alignment mark image on the reticle R, which are projected through the projection optical system PL, is secured to part of the table TB. This image detector KES is attached so that its surface is as high as the surface of the wafer W.

On the surface of the image detector KES, a shading plate is formed. On the shading plate, a multi-slit or a rectangular aperture (knife-edge aperture) through which part of an image projected by the projection optical system PL passes is formed, and image luminous flux which passes through the slit or the aperture is detected as a quantity of light.

In this embodiment, the image formation performance of the projection optical system PL or the illumination characteristic of the illumination optical system can be measured by the image detector KES, and the optical elements and mechanisms of the respective types shown in FIG. 1 can be adjusted based on the measurement result. Examples of the configuration of the image detector and a measurement using the image detector are disclosed in detail by the Japanese laid-open Publications No. 9-115820 (Nikon) and No. 9-153448 (Nikon).

Additionally, in the system configuration according to this embodiment shown in FIG. 1, an alignment optical system ALG of an off-axis type for optically detecting an alignment mark formed in each shot area on the wafer W, or a reference mark formed on the surface of the image detector KES, is arranged very much close to the projection optical system PL. This alignment optical system ALG irradiates a non-photosensitized illumination light (overall or spot illumination) to a resist layer on the wafer W through an objective lens, and photoelectrically detects a light reflected from the alignment or reference mark through the objective lens.

The photoelectrically detected mark detection signal is waveform-processed by a signal processing circuit 68 according to a predetermined algorithm, and the coordinate position (shot alignment position) of the wafer stage 14, such that the center of the mark matches the detection center (indication mark, a reference pixel on the image plane, a reception slit, a spot light, etc.) within the alignment optical system ALG, or the positional deviation amount of the wafer mark or the reference mark from the detection center is obtained in cooperation with the interferometer 62. Thus obtained information of the alignment position or the position deviation amount is transmitted to the minicomputer 32, and is used to align the position of the wafer stage 14 or to set the start position of scan-exposure for each shot area on the wafer W.

Next, the method for manufacturing the image distortion correction plate G1 as one characteristic configuration in this embodiment will be briefly explained.

As described above, the correction plate G1 is configured to be a plate on which part of the surface of a quartz or fluorite parallel plate is polished with the precision of a wavelength order, and a predetermined infinitesimal slope is formed on part of the surface, and is intended to change an image distortion on an image plane by deflecting the principal ray of local image luminous flux, which passes through the infinitesimal slope.

An example of the method for manufacturing this correction plate G1 or its operation is disclosed in detail by the Japanese laid-open publication No. 8-203805 (Nikon).

In case of scan-exposure, an image distortion which statically occurs at each of a plurality of images arranged in the move direction of the wafer W at the time of scan-exposure emerges as a dynamic image distortion which is averaged or accumulated within an effective exposure field (exposure slit width). Accordingly, a random image distortion consequently remains even if a static distortion characteristic is corrected in case of scan-exposure.

Therefore, in this embodiment, close attention is paid not to the static distortion characteristic (distortion aberration characteristic) within the effective projection area EIA at the time of scan-exposure, but to the dynamic distortion characteristic which occurs due to the accumulation (averaging) in the scanning direction of the projection area EIA, and the image distortion correction plate G1 is polished so that the dynamic distortion characteristic becomes almost "0" or the distortion characteristic becomes regular by correcting the random component included in the dynamic distortion characteristic.

For the process of the image distortion correcting plate G1, the operation for measuring an image distortion causing a dynamic distortion characteristic is required at first. There are two types of the method of the measurement operation: the offline measurement by test printing (test exposure), and the onbody measurement using the image detector KES secured onto the wafer table TB of the projection exposure apparatus shown in FIG. 1.

The method of the test exposure is intended to obtain a static image distortion at each point within a circular field or at each point within the effective projection area EIA of the projection optical system PL by statically exposing a test mark formed at an ideal lattice point on a test reticle onto a wafer W through the projection optical system PL, by conveying the exposed wafer W to a measurement device different from the projection exposure apparatus after developing the wafer W, and by measuring the coordinate position or the position deviation amount of the printed test mark.

In the meantime, the method using the image detector KES is intended to obtain a static image distortion vector by moving the wafer stage 14 in the X and the Y directions in order to scan an image with the knife-edge of the image detector KES while projecting the image of a pattern of a test mark (a line and space pattern having a cycle in the X direction, a line and space pattern having a cycle in the Y direction, a RANPASU mark or a vernier mark used to examine a resolution or an overlapping accuracy, etc.) formed at each ideal lattice point on a test reticle , and by analyzing the waveform of the photoelectric signal output from the image detector KES at that time.

After the static image distortion vector is obtained, a dynamic distortion characteristic is obtained by averaging each image distortion in the scanning direction (Y direction) within the rectangular effective projection area EIA with the use of a computer (a computer, a workstation, etc.). Thereafter, the portion of the surface corresponding to the image distortion correction plate G1 is polished in correspondence with the position in the non-scanning direction (X direction) based on the obtained dynamic distortion characteristic.

As described above, the polished image distortion correction plate G1 is relocated in the initial position within the projection optical path, that is, the position located when the distortion characteristic is measured before being polished, and the measurement operation of the distortion characteristic using a test reticle is again performed to examine the dynamic distortion characteristic.

However, the distortion component must be reduced almost to "0" by the adjustment of the tilt of the image distortion correction plate G1, the up-and-down movement and the infinitesimal tilt of the lens element G2 or the subtle change of the magnification by pressure control. Therefore, it is examined how much a random distortion component is included in the dynamic distortion characteristic re-measured after the adjustment. If the random component is within a standard value, the sequence of the manufacturing process of the image distortion correction plate G1 is terminated.

In the meantime, if the random component in the dynamic distortion characteristic is not within the standard value, the image distortion correction plate G1 is again polished based on the re-measured distortion error data depending on need.

Explained next is the optical condition of the illumination optical system of the projection exposure system, which must be considered when a distortion characteristic is measured in this embodiment. As explained earlier by referring to FIG. 1, the illumination optical system of the projection exposure apparatus of this type is normally configured as a Kohler's illumination system which images a plane light source image (actually a set of 5 to 10 thousand luminance points) formed on the exit side of the second fly-eye lens 7G at an entrance pupil or an exit pupil of the projection optical system PL. With this system, an even illuminance distribution of approximately ±1 percent is respectively obtained at the position of the blind 7L as the first irradiated plane, the position of the pattern plane of the reticle R as the second illuminated plane, and the position on the image plane (wafer plane) of the projection optical system PL as the third irradiated plane if no contrast of the interference fringes (or speckle) caused by the coherence of an excimer laser beam is assumed to exist.

However, with the recent improvement of the density and the minuteness of a semiconductor device, problems have arisen not only in the evenness of the illuminance distribution on an irradiated plane but also in the deviation from a telecentric condition of an illumination light irradiated on the irradiated plane (especially on the wafer plane), that is, a telecentric error. Note that, however, this telecentric error is construed as including also a telecentric error possessed by the projection optical system PL itself.

Especially, in recent years, the respective types of an illumination σ diaphragm plate (hereinafter referred to as a spatial filter) 7H such as an annular aperture, a 4-aperture, a small circular aperture, a large circular aperture, etc. are arranged to be exchangeable on the exit side of the second fly-eye lens 7G as shown in FIG. 1, and the shape of the illumination light source plane is changed according to the pattern on the reticle R.

In this case, the telecentric correction plate 7H may be inserted in the potical path in the neighborhood of the condenser lens system shown in FIG. 1, wherein the telecentric correction plate 7H is polished with a method similar to the method for manufacturing the image distortion correction plate G1 so as to correct a telecentric error of the illumination light at each point on the irradiated plane, and wherein the telecentric error of the illumination light reaching the wafer W is measured at the each point of the irradiated plane in a state where the spatial filter 7H is not inserted in the optical path or in a state where the large circular aperture of the spatial filter 7H is inserted in the optical path. Or, in this case, an aspheric process, such that the measured telecentric error is corrected, may be performed for a particular lens element included in the condenser lens system 7K, 7Q, etc. shown in FIG. 1.

Accordingly, it becomes necessary to accurately measure the telecentric error of an illumination light on the image plane side of the projection optical system PL. For that measurement, the above described image detector KES and test reticle TR can be used as they are. To obtain the telecentric error, the X-Y coordinate position of a projection image is repeatedly measured by scanning the projection image of a line and space (L&S) pattern on the test reticle TR with the rectangular aperture of the image detector KES while changing the position of the wafer table TB in the Z direction by a predetermined amount (such as 0.5 μm) based on the detection result of a focus detection system of an oblique incident light type, so that the change in the X-Y coordinate position of one L&S pattern image according to the change of the position in the Z direction, that is, the direction and the amount of the tilt of the principal ray of the L&S pattern image to the Z axis are measured.

Figure 2:
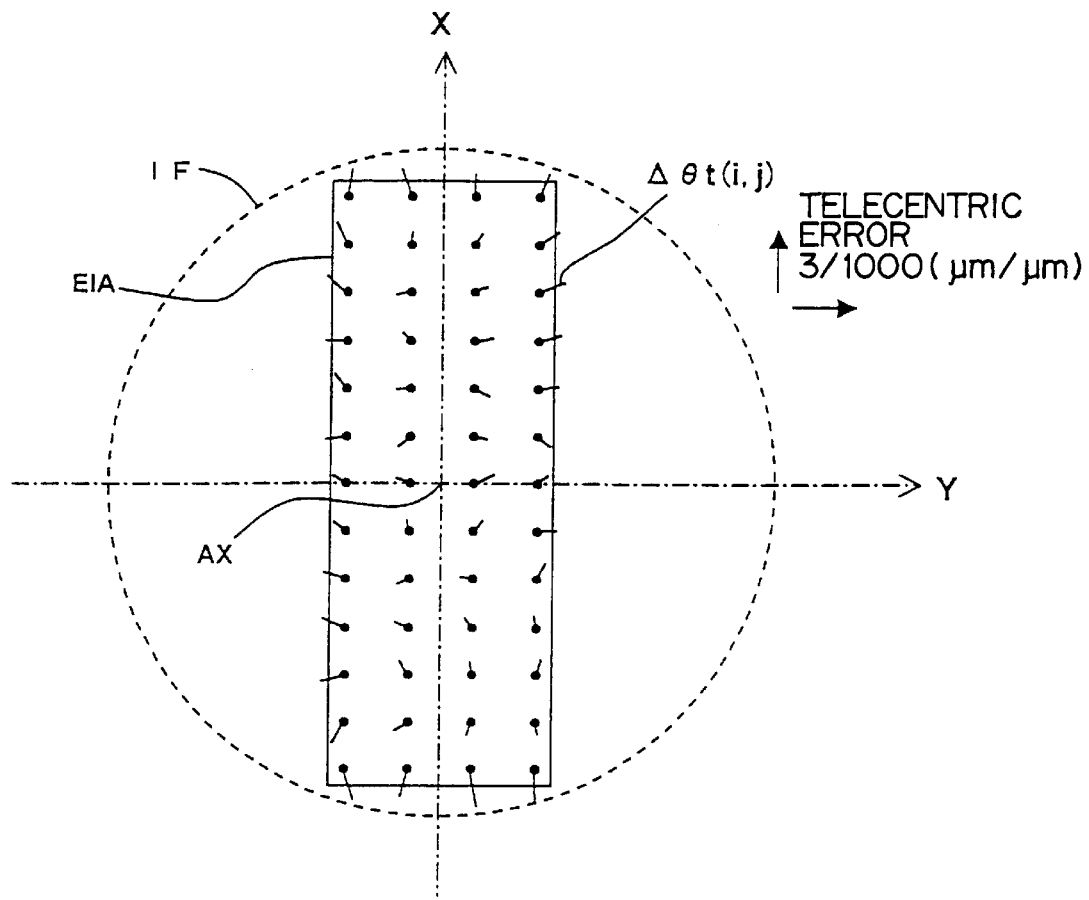
FIG. 2 shows one example of a telecentric error of a projection optical system, which is measured by an image detector.

By making such a telecentric error (a tilt error of an image formation principal ray) measurement for each projection image of the L&S pattern arranged at each ideal lattice point on the test reticle TR, the telecentric error distribution within the projection image plane or the effective projection area EIA can be known, for example, as FIG. 2. FIG. 2 exemplifies the exaggerated distribution of a local telecentric error occurring within the effective area EIA. Black points in this figure represent ideal lattice points or points conforming thereto, and a segment extending from each of the black points represents a telecentric error vector (direction and magnitude) $\Delta\theta t(i,j)$.

This telecentric error vector $\Delta\theta t(i,j)$ represents how much the principal ray at a projection image point shifts in the X and the Y directions per distance of 1000 μm in the Z direction as an example. The overall tendency of the vector map shown in FIG. 2 exhibits the coexistence of a component which is similar to a distortion characteristic and can be function-approximated and a random component.

Accordingly, by measuring a telecentric error vector map like the one shown in FIG. 2, the coordinate position within the projection field IF where a telecentric error to be modified (corrected) occurs is determined, and the correction amount of the of a principal ray at the determined coordinate position is calculated, and the infinitesimal slope of a wavelength order may be formed by locally polishing the surface of the telecentric correction plate 7N (or lens element) based on the result of the calculation.

Additionally, it is desirable to simulate the polished state of the telecentric correction plate 7N by measuring the telecentric error characteristic of an illumination light with the image detector KES, to perform an actual polishing process based on the result of the simulation, and to perform the polishing process (modification polishing) again for the telecentric correction plate 7N in consideration of the result of observing and measuring the state of the resist image by using an optical or an electric microscope when test printing (scan-exposure) is performed with the processed telecentric correction plate 7N inserted.

As described above, the method for performing a polishing process based on both of the result of photoelectric detection of a spatial intensity distribution of a projection image, and a measurement result of the quality of an image which is actually etched on a resist layer by test printing can be applied also to the manufacturing of the image distortion correction plate G1 as well as the telecentric correction plate 7N, thereby maximizing the projection performance when an actual device pattern is scan-exposed onto the wafer W.

Additionally, the telecentric correction plate 7N can collectively correct a telecentric error (offset amount) which equally occurs at each point within the projection field if this plate is arranged to be tiltable in a direction arbitrary to the plane vertical to the optical axis AX of the illumination system, similar to the image distortion correction plate G1 described earlier.

In the meantime, with the measurement of an L&S pattern projection image, which uses the image detector KES, an image plane astigmatism or coma aberration occurring at each point within the projection field IF or within the rectangular projection area EIA, an image plane curvature, etc. can be measured. Accordingly, also the astigmatism/coma correction plate G3 to be provided at the bottom of the projection optical system PL, which is shown in FIG. 1, is polished so that the dynamic aberration characteristic is reduced to "0" by averaging the aberration mount at the time of scan-exposure, or a random component in the dynamic aberration characteristic is corrected, or the aberration amount is reduced to "0" in a static state based on the astigmatism/coma aberration amount measured at each point within the projection field IF or the rectangular projection area EIA, similar to the image distortion correction plate G1, the astigmatism/coma correction plate G3 is inserted in the bottom of the projection optical system PL after being polished.

Figure 3:
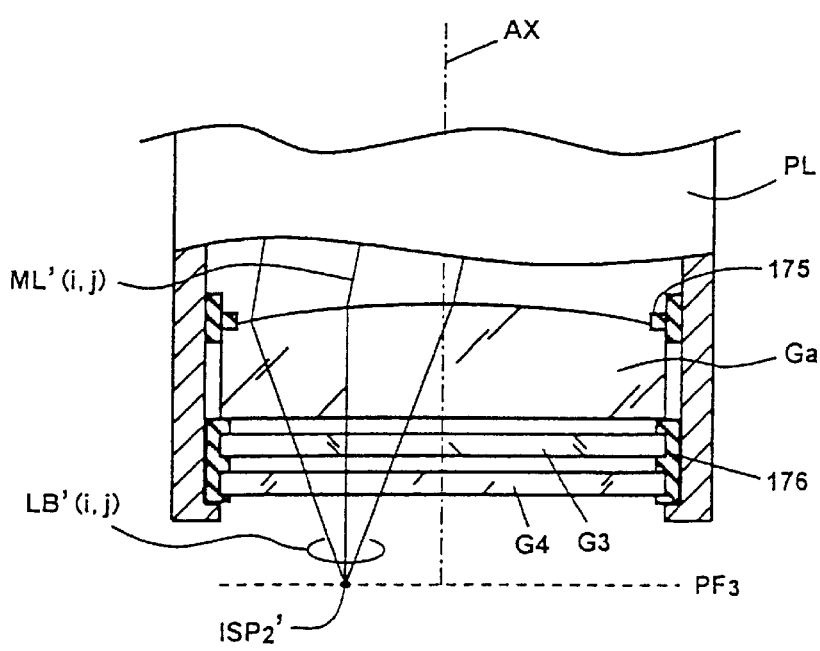
FIG. 3 is a partial sectional view showing the state of an astigmatism/coma correction plate arranged on an image plane side of a projection optical system, and an image plane curvature correction plate.

Furthermore, although omitted in FIG. 1, the image plane curvature correction plate (quartz plate) G4 having the plane shape for correcting the curvature of a projection image plane is attached to the bottom of the projection optical system PL in parallel with the astigmatism/coma correction plate G3. FIG. 3 is a partial sectional view showing the bottom of the projection optical system PL, and the state where a lens element Ga closest to the projection image plane PF3 is secured within the lens barrel of the projection optical system PL through a ring-shaped metal support 175, and the state where the astigmatism/coma correction plate G3 and the image plane curvature correction plate G4 are secured between the lens element Ga and the image plane PF3 within the lens the lens barrel with a ring-shaped metal support 176.

With the scan-exposure method, since a static image plane curvature characteristic is added and averaged in a scanning direction, there is a possibility that a non-linear (random) image plane curvature error, which cannot be completely modified only by correcting an image tilt and an image plane curvature with the replacement of a lens element like a static exposure method, remains.

Accordingly, in this embodiment, an image plane curvature correction plate is processed to accurately correct a non-linear (random) image plane curvature error in consideration of a dynamic image plane curvature characteristic.

Here, it is assumed that the image plane PF3 is a best focus plane which is optically conjugate to the pattern plane of the reticle R, and a primary ray ML'(i,j) of the image formation luminous flux LB'(i,j), which converges at an image point ISP2', is parallel to the optical axis AX between the lens element Ga and the image plane PF3. At this time, the numerical aperture NAw of the image formation luminous flux LB'(i,j) is larger by an inverse number of the projection magnification (¼, ⅕, etc.) in comparison with the numerical aperture NAr on the reticle side, and is approximately 0.5 to 0.7.

Therefore, the spread area of the image luminous flux LB'(ij) when passing through the astigmatism/coma correction plate G3 and the image plane curvature correction plate G4 becomes much larger than the image distortion correction plate G1 on the reticle side. Accordingly, the overlapping between the image formation light which generates another image point positioned in the neighborhood of the image point ISP2' and the image formation luminous flux LB'(i,j) on the astigmatism/coma correction plate G3 cannot be avoided.

However, the polishing of the surface of the astigmatism/coma correction plate G3 is not required to be taken into account for the entire surface of the astigmatism/coma correction plate G3, in consideration of the fact that also the aberration characteristic in the width direction (scanning direction) within the rectangular projection area EIA is averaged by scan-exposure, and may be performed for a local area in consideration of the averaging at the time of scan-exposure. Therefore, the stitching of a polished surface when polishing the astigmatism/coma correction plate G3 can be relatively performed with ease.

In the meantime, the image plane curvature is determined by measuring the best focus position (Z position) of each image of L&S patterns formed on the test reticle TR, which is projected under a certain illumination condition, with the off-line method by test printing and the image detector KES, and by obtaining an approximate plane (a curved surface) on which the measured best focus position at each point is approximated with a least square, etc.

In this case, the detection of a projected image with the image detector KES is performed by changing the Z position of the table TB while measuring the position of the height position of the surface of the shading plate of the image detector KES with a focus detection system such as an oblique incident light method, etc., and the Z position of the table TB such that also the contrast (the peak value of a differential waveform, a level of a bottom value) of the L&S pattern projection image becomes the highest is measured as the best focus position.

If the flatness of the approximate plane of the projection image plane thus determined is not within an allowable range at least in the rectangular projection area EIA at the time of scan-exposure, the polishing process such that an image plane curvature is modified by taking out the image plane curvature correction plate G4 from the projection optical system PL is performed. In this case, the image plane curvature correction plate G4 is normally manufactured to correct the tendency of the entire image plane curvature within the projection field by entirely polishing its one side with a positive curvature, and the other with almost a same negative curvature. As a result, the projection image plane by a projection optical system can be made entirely and locally even, whereby a good effect of significantly improving a DOF (Depth Of Focus) can be promised.

If there is a portion where the image plane curvature is locally large within the projection field (with the rectangular projection area EIA), it is also possible to correct that portion by locally performing additional polishing. Additionally, it is desirable to measure a profile of an actual resist image printed by test exposure and to consider also the result of that measurement not only depending on a photo-electric measurement result of a projection image by, which is obtained by the image detector KES, also when the above described astigmatism/coma correction plate G3, the image plane curvature correction plate G4 are manufactured.

Next, other illumination condition which must be considered when the above described distortion characteristic, astigmatism/coma aberration, image plane curvature, etc. are measured will be explained. As described earlier, an even illuminance distribution of approximately ±1 percent can be obtained on an irradiated plane of the position of the blind 7L, the position of the pattern plane on the reticle R (test reticle TR), the position of the image plane (wafer plane) of the projection optical system PL, etc. by the operations of the first fly-eye lens 7C and the second fly-eye lens 7G, which are shown in FIG. 1.

However, it is also proved that the irradiation state of an illumination light has not only a problem in the evenness of an illuminance distribution on an irradiated plane, but also a problem in the local degradation of an overall image formation performance including a resolution, a distortion error, respective aberration types, etc. due to the phenomenon that the numerical aperture (NA) of the illumination light partially differs according to the position on the irradiated plane, that is, an occurrence of an NA difference (unevenness within an illumination angle) according to an image height which is the distance from the optical axis AX. This phenomenon is caused not only by a σ value change depending on the image height position of the illumination system, but also by the respective aberration types of the illumination optical system from the second fly-eye lens 7G to the reticle R shown in FIG. 1, an arrangement error when a plurality of optical components configuring the illumination optical system are assembled and manufactured, or an angle characteristic of a thin film for preventing a reflection, which is coated on the respective optical components, etc.

Additionally, such an NA difference of the illumination light according to the image height is a phenomenon which can possibly occur due to an aberration of the projection optical system PL by itself. After all, as exaggeratedly shown in FIG. 4, for example, numerical apertures NAa, NAb, and NAc of image formation luminous flux LBa, LBb, and LBc for forming respective three image points ISPa, ISPb, and ISPc on the projection image plane PF3 differ depending on the image height position ±ΔHx.

Figure 4:
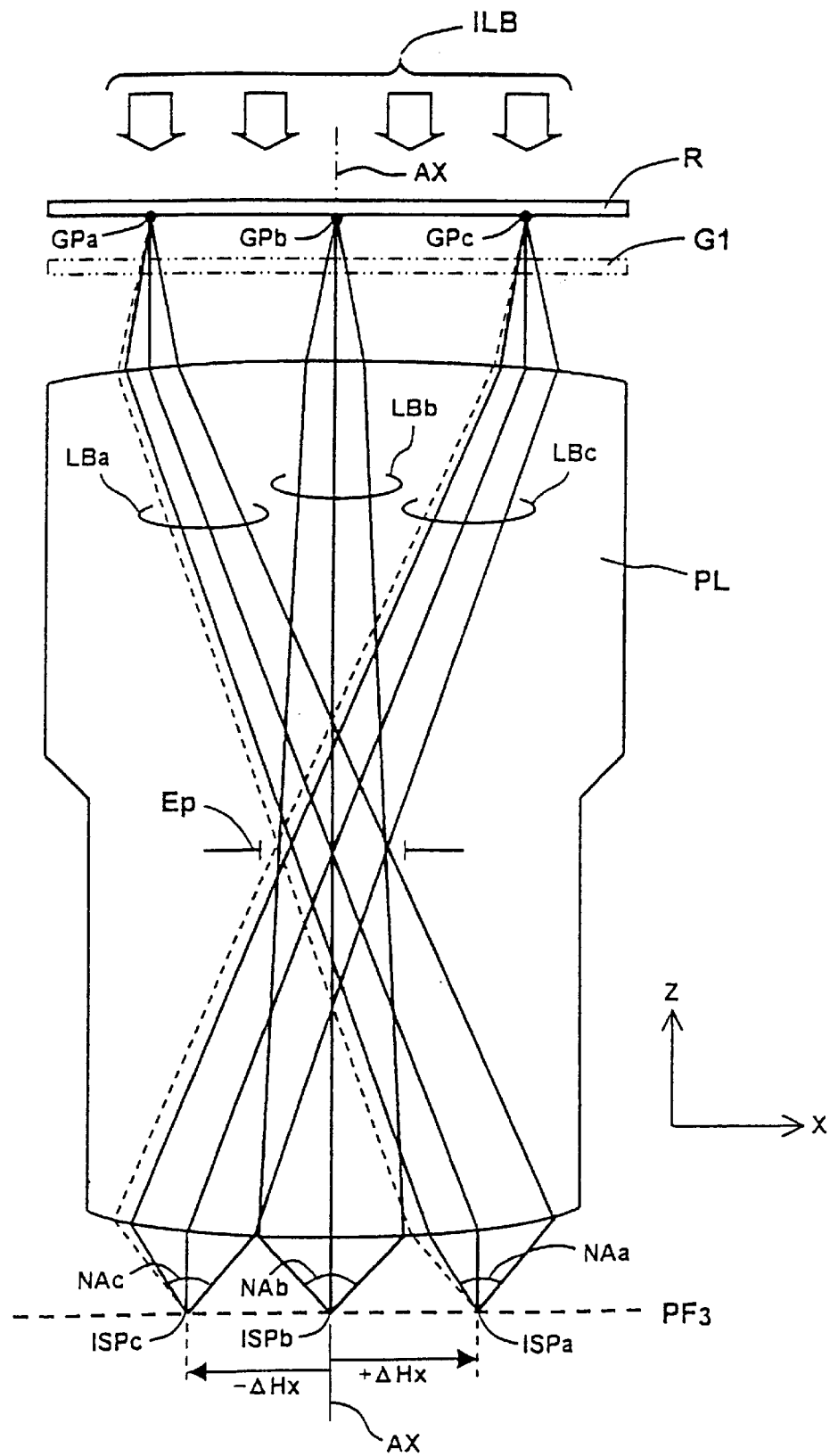
FIG. 4 is a schematic explaining a difference of a numerical aperture according to an image height of image formation luminous flux (or illumination luminous flux) projected onto a projection image plane side through a projection optical system.

FIG. 4 shows the state where an object point (ideal lattice point) GPb at a position on the optical axis AX on the reticle R, an object point GPc apart from the object point GPb by a distance M·ΔHx in a positive direction (axis in a non-scanning direction) along the X axis, and an object point GPa apart from the object point GPb by the distance M·ΔHx in a negative direction of the X axis are respectively imaged and projected as image points ISPa, ISPb, and ISPc through a bilaterally telecentric projection optical system PL at a reduction magnification 1/M (M is on the order of 2 to 10).

At this time, the reticle R is irradiated with an almost even intensity distribution by an illumination light ILB which is adjusted to be a predetermined numerical aperture and a predetermined σ value, and the image formation luminous flux LBa, LBb, and LBc, which proceed to the image plane PF3 side without being shaded by the pupil (diaphragm aperture) Ep of the projection optical system, among the lights entering from the respective object points the projection optical system PL via the image distortion correction plate G1, contribute to the image formation of the respective image points.

Furthermore, in FIG. 4, partial luminous flux indicated by broken lines at the left side of the respective image luminous flux LBa and LBc represent portions which are lost as or attenuated as unevenness within an illumination angle from the original aperture state. If an NA difference according to the image height position as described above, a gravity center line, which is determined by the center of gravity of light quantity on each of the sectional planes of the image formation luminous flux LBa and LBc, becomes the one tilting from the principal ray on the image plane PF3, although each of the principal rays of the image formation luminous flux LBa at the image height+ΔHx, and the image formation luminous flux at the image height−ΔHx passes through the central point (optical axis AX) of the pupil Ep.

Considered will be the case where an L&S pattern almost at a resolution limit, which is positioned, for example, in the center of the illumination area on the reticle R, that is, in the neighborhood of the optical axis AX of the projection optical system PL, and an L&S pattern almost at a resolution limit, which is positioned at the periphery of the illumination area apart from the optical axis AX, are projected and exposed in the state where there is such an NA difference according to the image height of the illumination light.

In this case, even if the intensity distributions of the illumination light irradiating the respective L&S patterns at the two positions are identical, an effective NA of the illumination light for the L&S pattern in the neighborhood of the optical axis AX is larger (smaller depending on a case) than the illumination light for the L&S pattern apart from the optical axis AX. Therefore, a difference exists between the resolutions of the L&S patterns in the neighborhood and the periphery of the optical axis, which are finally transferred onto the wafer W, which poses a problem such that the contrast or the line width of a transferred image may differ depending on the position on the image plane although the L&S patterns have the same line width and pitch.

Additionally, the NA difference of the illumination light causes a problem such that the line widths or duties of the projection images of two L&S patterns may be infinitesimally changed according to a pitch direction, when the two L&S patterns of a same design with different pitch directions are closely arranged on the reticle.

Although there is no effective NA difference between the center of an illumination area and its periphery, there may arise a problem such that the whole of the illumination luminous flux irradiated on the reticle R (or the wafer W) slightly tilts not at an angle symmetrical with respect to the optical axis AX, but in a certain direction. However, its adjustment can be made by infinitesimally moving the positions of the second fly-eye lens 7G and the other optical elements within the illumination optical system in the X, Y, Z, or θ direction in that case.

The above described NA difference according to the image height of an illumination light naturally becomes a problem also when the above described distortion characteristic is measured, when the telecentric error map shown in FIG. 2 is measured, or when the astigmatism/coma aberration and the image plane curvature are measured, and an error is included in measured static image distortion, telecentric error, etc.

Therefore, it is desirable that the NA difference according to the image height of an illumination light irradiated on the reticle R is adjusted when a distortion is measured at the time of manufacturing the image distortion correction plate G1, when a telecentric error is measured, when an astigmatism/coma aberration is measured, or when image plane curvature is measured, to say nothing of when a wafer is exposed on a device manufacturing line. Arranged for such an adjustment is the plate for correcting an illumination NA difference (hereinafter referred to as an illumination NA correction plate) 7F, which is positioned on the incidence plane side of the second fly-eye lens 7G shown in FIG. 1.

In the meantime, the image detector KES explained earlier is intended to detect a quantity of light within a rectangular aperture on a projection image plane, and cannot detect the quantity by making a distinction between the illuminance of an illumination light on a projection image plane and the NA difference according to the image height of the illumination light. Meanwhile, since the resist layer on the wafer W is photosensitized to the NA difference according to the image height of an illumination light and to an illuminance change, a definite distinction emerges in the image formation characteristic (resist profile) of the pattern image projected onto the resist layer.

Figure 5:
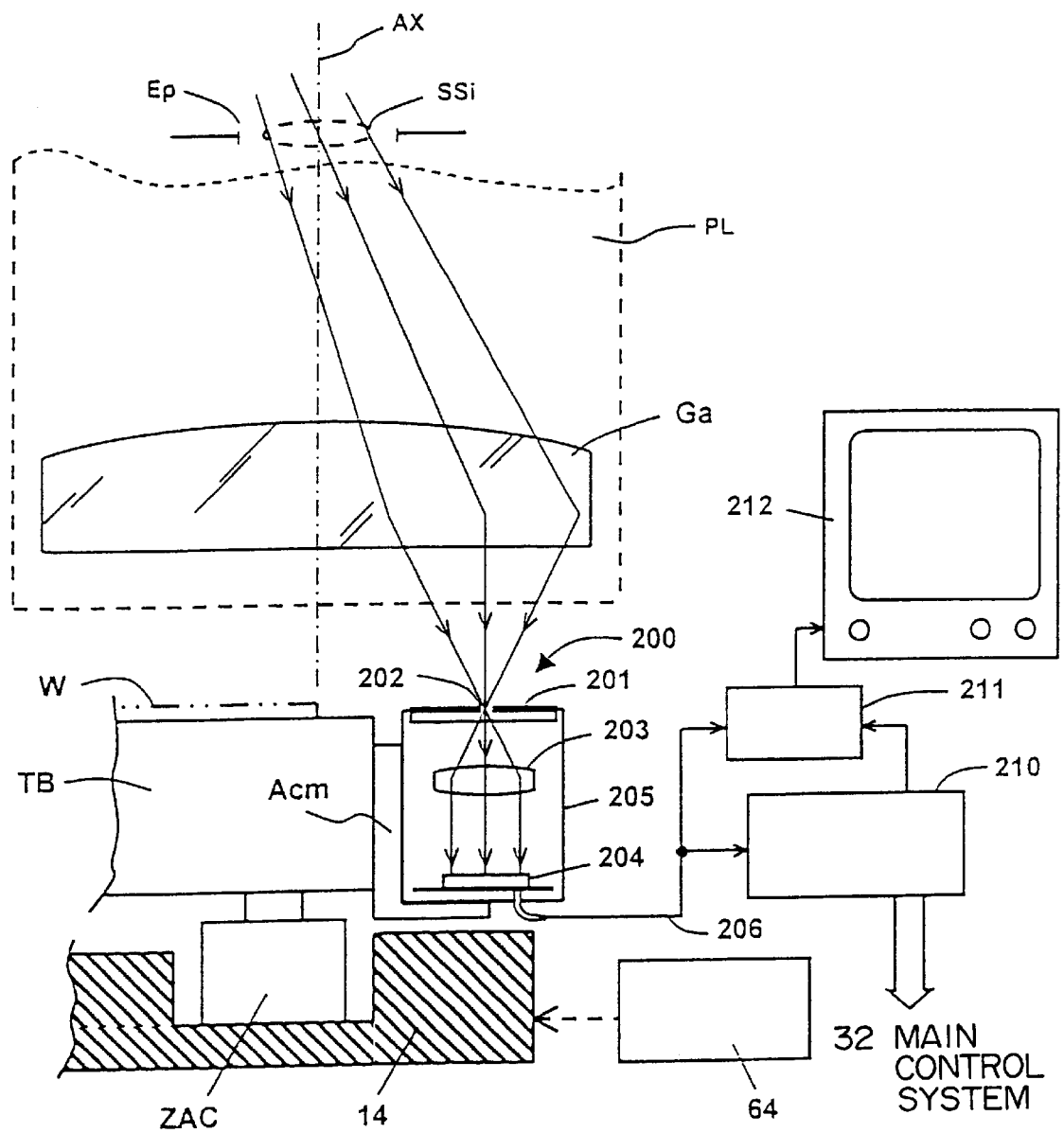
FIG. 5 is a schematic showing the structure of a measurement sensor for measuring an NA difference according to an image height of the illumination luminous flux, and its processing circuit.

Accordingly, in this embodiment, an illumination NA measurement sensor 200, which can automatically measure the NA difference according to the image height of an illumination light at arbitrary timing while the apparatus is running, is arranged, for example, to be attachable/detachable onto/from the wafer table TB in FIG. 1 via a metal fixture Acm as shown in FIG. 5. FIG. 5 is an enlarged view showing the partial structure of the table TB to which the illumination NA measurement sensor 200 is attached, and the bottom of the projection optical system PL. On the top of the sensor 200, a shading plate 201 on which a shading layer of chrome, etc. is formed on the entire surface of a quartz plate is formed is arranged, and a pin hole 202 having a diameter which is determined based on a wavelength λ of an illumination light, the numerical aperture NAw on the image side of the projection optical system PL, etc. is arranged in a portion of the shading layer.

Under the pin hole 202 of the shading plate 201, a lens element 203 for transforming an illumination light passing through the pin hole 202 into parallel luminous flux, that is, a Fourier transform lens is arranged. On the Fourier transform plane implemented by the lens element 203, a CCD 204 as a two-dimensional imaging element is arranged. These shading plate 201, lens element 203, and CCD 204 are collectively included in a case 205 of the sensor 200. The image signal from the CCD 204 is transmitted to a display 212 via a signal cable 206, an image processing circuit 210, and a video signal mixer circuit 211. On the display 212, a light source image SSi which is formed in the pupil Ep is displayed. Note that the image processing circuit 210 comprises the software for detecting the optical intensity distribution of the light source image SSi in correspondence with the arrangement of the lens elements of the second fly-eye lens 7G, and for analyzing a portion which is especially uneven in the intensity distribution, and has a capability for transmitting the result of the analysis to the main control system (minicomputer) 32 in FIG. 1.

In the above described configuration of the sensor 200, the surface of the shading plate 201 of the sensor 200 is located at the Z position matching the projection image plane PF3 of the projection optical system PL, or the Z position accompanying a predetermined offset from the projection image plane PF 3 by the focus detection system and the actuator ZAC in a predetermined leveling state, when the NA difference of an illumination light is measured. Additionally, the XY stage 14 is driven by the driving system 64 so that the pin hole 202 is located at arbitrary X, Y position within the projection field IF or the rectangular projection area EIA of the projection optical system PL.

When a measurement is made, a reticle on which no patter is drawn is mounted on the reticle stage 8, the reticle is evenly illuminated by an illumination light ILB, and the pin hole 202 is located at the image height position to be measured within the projection field If or the rectangular projection area EIA. Because the illumination light ILB is a pulse light at that time, the illumination light which passes through the pin hole 202 is accumulated and photoelectrically detected while the illumination light ILB is irradiated with a predetermined number of pulses if the CCD 204 is arranged as a charge storage type.

Since the imaging plane of the CCD 204 is the Fourier transform plane, the CCD 204 comes to image the intensity distribution of the light source image SSi formed in the pupil Ep of the projection optical system PL. However, the light source image SSi formed in the pupil EP is similar to the shape of the portion which has passed through the aperture of the spatial filter 7H among innumerable luminance point set planes formed on the exit plane side of the second fly-eye lens 7G in FIG. 1.

Since this embodiment assumes the apparatus for performing scan-exposure in a width direction (Y direction) of the rectangular projection area EIA, also an influence by the illumination NA difference of the quality of a pattern image transferred onto the wafer W is an average of the illumination NA difference in the size of the width direction of the projection area EIA. Accordingly, it is desirable to obtain a dynamic illumination NA difference by partitioning the projection area EIA into a plurality of areas at predetermined intervals in the non-scanning direction (X direction), and by averaging the static illumination NA difference in the scanning direction for each of the partitioned areas, in a similar manner as in the case of the distortion measurement.

Figure 6A:
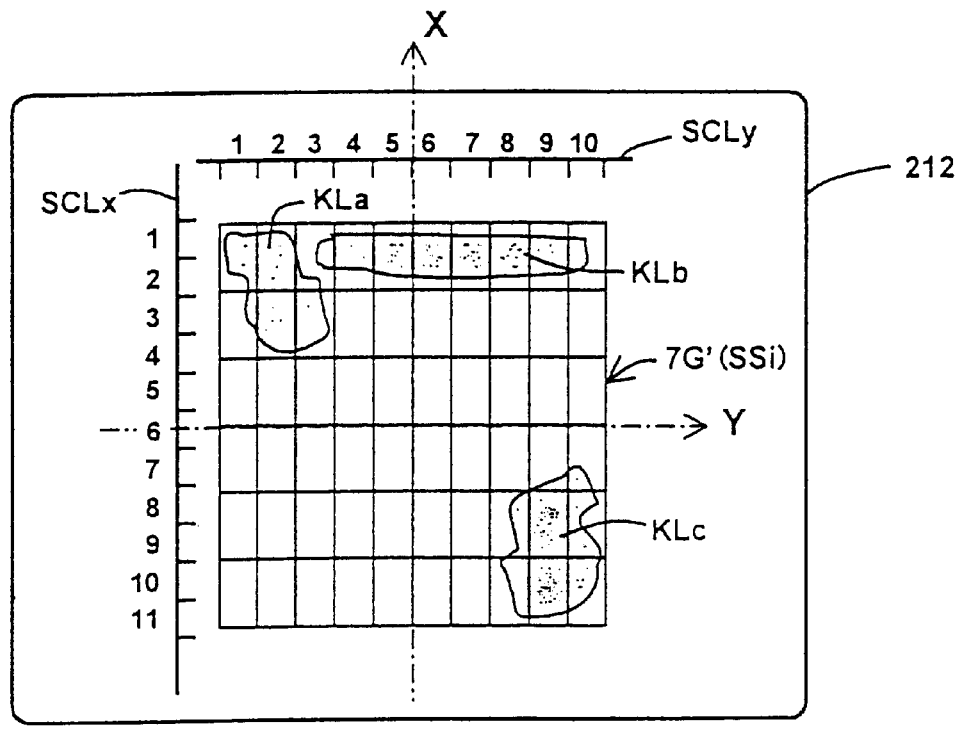
FIG. 6A is a schematic illustratively showing first example of a light source image within an illumination optical system, which is measured by the measurement sensor shown in FIG. 5.
Figure 6B:
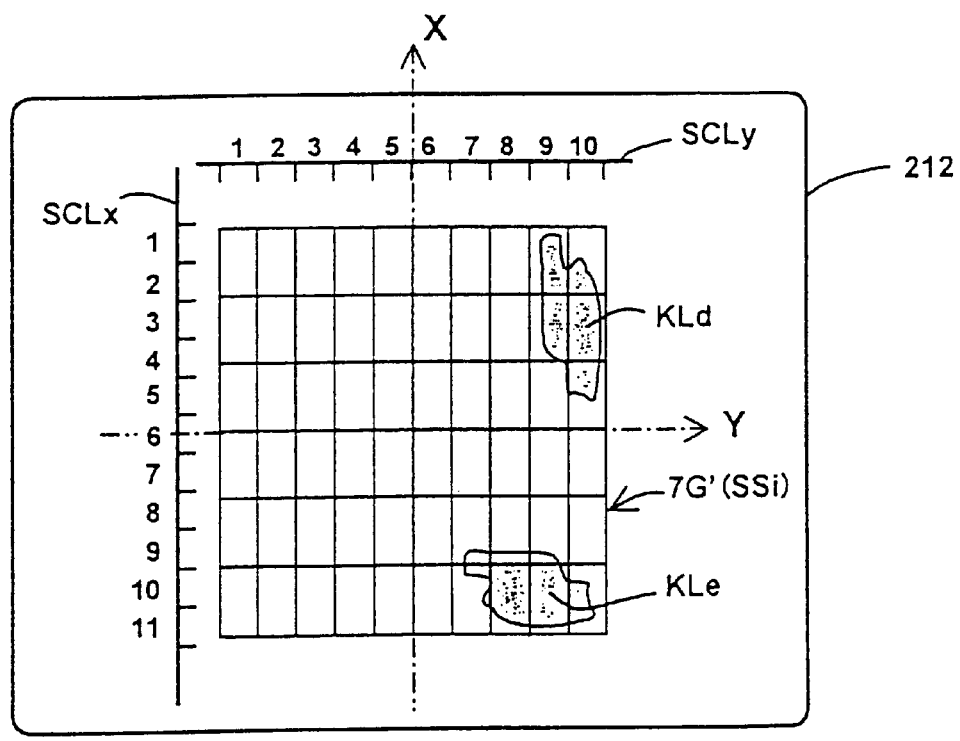
FIG. 6B is a schematic illustratively showing second example of a light source image within an illumination optical system, which is measured by the measurement sensor shown in FIG. 5.

Therefore, the measurement of the static illumination NA difference will be explained by referring to FIGS. 6(A) and 6(B). FIGS. 6(A) and 6(B) illustratively show the examples of the light source image SSi, which are respectively displayed on the display 212 when the pin hole 202 is located at different positions within the projection area EIA. On the screen of the display 212, a cursor line representing an array 7G'(light source image SSi) of the lens element on the exit side of the second fly-eye lens 7G, and scales SCLx and SCLy which represent the positions in the X and the Y directions are displayed at the same time.

In FIGS. 6(A) and 6(B), the array 7G' on the exit plane side of the second fly-eye lens 7G is modified to be almost a square as a whole, and the sectional shape of each lens element is a rectangle which is almost similar to the projection area EIA. That is, since the incidence plane side of each lens element is conjugate to the irradiated plane (blind plane, reticle plane, or projection image plane), the size of the sectional shape in the scanning direction (Y direction) is smaller than that in the non-scanning direction (X direction) in order to efficiently irradiate the projection area EIA on the irradiated plane.

In case of FIG. 6(A), each of the intensities of an area KLa at the upper left corner, an area KLb in the top row, and an area KLc at the lower right corner within the array 7G' is lower than its peripheral intensity and a telerable value. Meanwhile, FIG. 6(B) shows an example where each of the intensities of an area KLd at the upper right corner and an area KLe at the lower right corner within the array 7G' is lower than its peripheral intensity and a telerable value.

As described above, since the intensity distribution of the light source image SSi formed in the pupil Ep of the projection optical system PL varies according to the position within the projection field of the pin hole 202, that is, the image height, the quality of a projected image of the pattern formed on the reticle R (or TR) may be sometimes deteriorated. For example, if the center of gravity of the entire distribution of the light source image SSi (array 7G') is decentered from the coordinate origin (optical axis AX)in a lower left direction as shown in FIG. 6(A), the image formation luminous flux of the pattern projected at the image height position becomes the one deteriorated from the telecentric state. If a comparison is made between FIGS. 6(A) and 6(B), an NA of illumination luminous flux on the projection image plane PF3 is smaller as a whole in FIG. 6(A).

Note that the shape of the light source image SSi when the wafer W is actually scan-exposed is set by the aperture shape of the spatial filter 7H which is arranged on the exit side of the second fly-eye lens 7G. Therefore, the shape of the light source image SSi becomes the aperture shape (circular, annular, 4-aperture, etc.) in the square array 7G' shown in FIG. 6(A) or 6(B), which is restricted by the spatial filter 7H.

To average such an illumination NA difference according to the image height within the projection field, a plurality of measurement points in a matrix state are set within the rectangular projection area EIA, the image signal from the CCD 204 is observed on the display 212 each time the pin hole 202 is located at each of the measurement points, and an uneven area within the intensity distribution of the light source image SSi (array 7G') is analyzed by the image processing circuit 210, and the static illumination NA characteristic (the vector representing the directionality of an NA and its degree) at each of the measurement points is sequentially stored based on the result of the analysis.

Thereafter, a dynamic illumination NA characteristic is calculated by averaging the illumination NA characteristic at several measurement points arranged in the scanning direction among the static illumination NA characteristic at the respective measurement points. This dynamic illumination NA characteristic is obtained at predetermined intervals in the non-scanning direction of the rectangular projection area EIA, and the illumination NA difference according to the image height is obtained particularly in the non-scanning direction by making a comparison between the dynamic illumination NA characteristics.

Then, the illumination NA correction plate 7F which is arranged on the incidence plane side of the second fly-eye lens 7G in FIG. 1 is processed based on the dynamic illumination NA characteristic thus obtained, and a correction is made to reduce the difference between the dynamic illumination NAs in the non-scanning direction almost to "0". Since the rectangular projection area EIA is set along the diameter extending in the non-scanning direction within the circular projection field IF of the projection optical system PL, the dynamic illumination NA is the one according to the image height from the optical axis AX.

Accordingly, to correct the dynamic illumination NA difference in the non-scanning direction, the illumination NA correction plate 7F may be manufactured to endow the illumination σ value at each image height in the non-scanning direction with an offset. As a method for changing the illumination σ value depending on the image height, for example, a beam attenuating part for changing the size or the intensity of the illumination luminous flux entering each lens element or for decentering the intensity distribution for each lens element (rod lens) in the periphery on the incidence plane side of the second fly-eye lens 7G may be locally formed on a transparent (quarts) plate.

Therefore, the state of the illumination light on the irradiated plan will be briefly explained by referring to FIG. 7. FIG. 7 illustratively shows the system from the second fly-eye lens 7G to the irradiated plane PF1, which is shown in FIG. 1. A collective lens system 180 represents a synthetic system of the mirror 7J, the collective lenses 7K and 7M, the mirror 7P, and the condenser lens system 7Q, which are shown in FIG. 1. Accordingly, the irradiated plane PF1 is assumed to be the pattern plane of the reticle R, which is the second irradiated plane, for ease of explanation. However, the illumination NA difference to be actually evaluated is obtained by the projection image plane PF3 on the wafer W (or the shading plate 201 of the measurement sensor 200) side, which is the third irradiated plane including the projection optical system PL.

In FIG. 7, the second fly-eye lens 7G is a bundle of a plurality of square-pillar-shaped rod lenses, and the illumination luminous flux ILB incident on the incidence plane PF0 which is conjugate to the irradiated plane PF1 is split by each of the rod lenses and collected as a plurality of point light source images (collective points) on the exit plane Ep' side. Here, the light source images formed on the exit plane Ep' side of the rod lenses apart from the optical axis AX within the second fly-eye lens 7G are respectively assumed to be QPa and QPb.

However, since the first fly-eye lens 7C is arranged in this embodiment as explained earlier by referring to FIG. 1, the light source image formed on the exit plane Ep' side of one rod lens of the second fly-eye lens is an aggregate of the plurality of point light source images formed on the exit side of the first fly-eye lens 7C. Viewing from the irradiated plane PF1, the exit plane Ep' of the second fly-eye lens 7G is a Fourier transform plane (pupil plane), and the split light which diverges and proceeds from each of the rod lenses of the second fly-eye lens 7G is transformed into almost parallel luminous flux, and integrated on the irradiated plane PF1. In this way, the intensity distribution of the illumination light on the irradiated plane PF1 is made even.

However, observing the state of the illumination luminous flux irradiated at a peripheral irradiated point ISP1 apart from the optical axis AX on the irradiated plane PF1 in the non-scanning direction (X direction), the numerical aperture of the illumination luminous flux converged at the point ISP1 becomes smaller relatively in the X direction due to an intensity-attenuated portion DK1 within the luminous flux, as shown in the perspective view in the lower left of FIG. 7. Notice that ML1 represents a principal ray which passes through the central point of the pupil of the projection optical system PL and reaches the irradiated point ISP1 in this figure.

As described above, the illumination luminous flux including the attenuated (or intensified) portion like the portion DK1 can possibly occur if the intensity of the light source image QPa formed by the rod lens positioned at the left end of the second fly-eye lens 7 is extremely low (or extremely high), or if the intensity of the light source image QPb formed by the rod lens positioned at the right end of the second fly-eye lens 7G is extremely high (or extremely low).

Figure 8A:
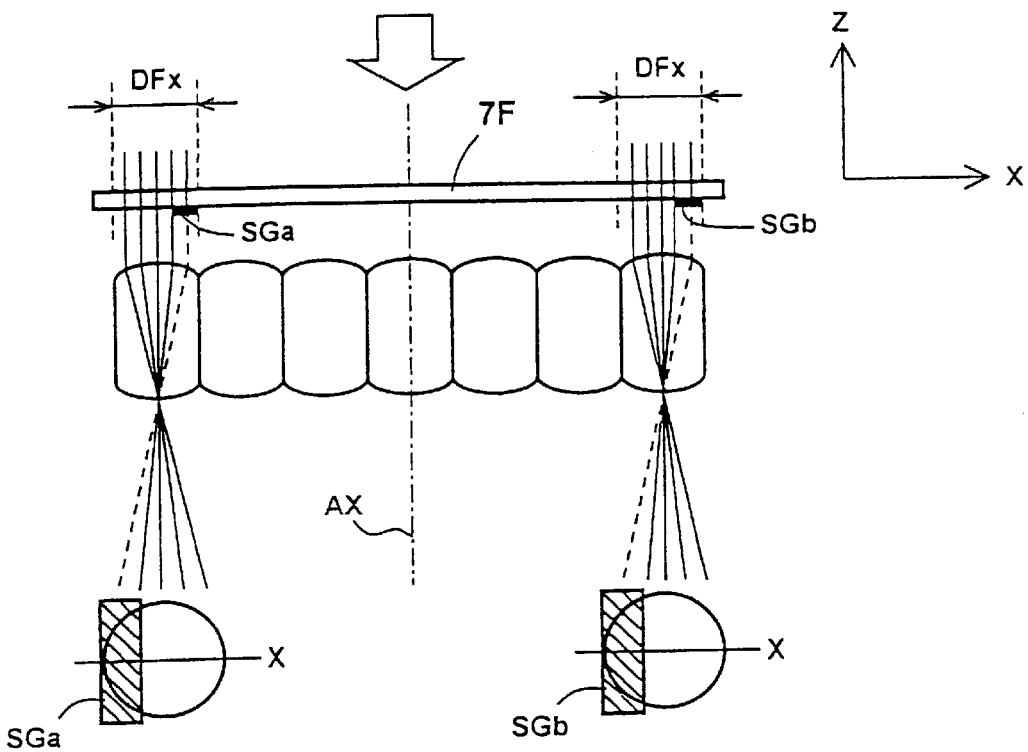
FIG. 8A is a schematic showing the arrangement of an illumination NA correction plate for correcting an NA difference according to an image height of an illumination light.

Accordingly, for example, as shown in FIG. 8(A), a thin film filter unit SGa or SGb through which the illumination luminous flux having a width DFx, which enters the rod lens at the left or right end of the second fly-eye lens 7G, is entirely or partially beam-attenuated is formed on the illumination NA correction plate 7F as a shading unit. FIG. 8(A) is a schematic showing the positional relationship between the second fly-eye lens 7G and the illumination NA correction plate 7F, which is enlarged on the X-Z plane, while FIG. 8(B) is a schematic showing the positional relationship in terms of a plane between filter units SGa and SGb formed on the illumination NA correction plate 7F, and a rod lens (a rectangular section) array of the second fly-eye lens 7G.

Figure 8B:
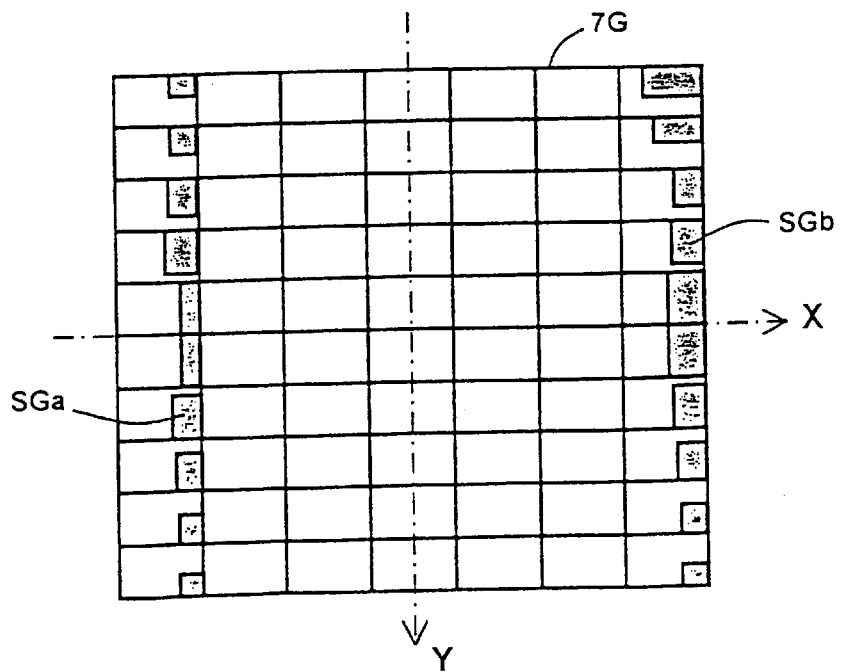
FIG. 8B is a top view showing the structure of the correction plate shown in FIG. 8A.

As shown in FIG. 8(B), the section of each of the rod lenses of the second fly-eye lens 7G is a rectangle extending in the non-scanning direction (X direction), and the filter units SGa and SGb are individually arranged for each of the rod lenses existing in sequence in the Y direction at both ends of each rod lens array in the X direction. Since the dynamic illumination NA difference, especially, in the non-scanning direction is corrected in this embodiment, the filter units SGa and SGb are set by paying close attention to both ends of the sequence of rod lenses arranged mainly in the X direction also for the rod lens arrays of the second fly-eye lens 7G.

Accordingly, only either of the filter units SGa and SGb may be arranged, and the shape of the filter unit SGa or SGb may be made identical for the rod lenses staying in the Y direction. Here, however, the shapes and the locations of the filter units SGa and SGb are set to be different little by little according to the positions of the rod lenses arranged in the Y direction, and the dynamic illumination NA difference becomes small not only in the non-scanning direction but also in the scanning direction (Y direction).

Also when the illumination NA correction plate 7F is made as described above, the dynamic illumination NA characteristic is measured with the measurement sensor 200 of FIG. 5 in a state where a completely transparent plate (quartz) which becomes a preform of the illumination NA correction plate 7F is arranged on the incidence plane side of the second fly-eye lens 7G as shown in FIG. 1, and the reticle R is exchanged for a reticle on which no pattern is drawn, in a similar manner as in the above described manufacturing of the image distortion correction plate G1. Then, the filter units SGa and SGb which become beam-attenuating parts, etc. may be formed on the transparent plate (or its equivalence) which is removed from an exposure apparatus based on the result of the measurement.

As a matter of course, it is desirable to examine whether or not a correction of a dynamic illumination NA difference according to an image height is satisfactorily made by re-measuring the dynamic illumination NA characteristic with the measurement sensor 200 of FIG. 5 after a manufactured illumination NA correction plate 7F is installed in a predetermined position within the illumination optical path.

Additionally, it goes without saying that the above described manufacturing of the illumination NA correction plate 7F and illumination NA correction using this plate must be performed prior to the various measurement operations using the test reticle TR when the image distortion correction plate G3, the astigmatism/coma aberration correction plate G3, and the image plane curvature correction plate G4 are manufactured.

Meanwhile, as shown in FIG. 1, the spatial filter 7H is arranged to be switchable on the exit side of the second fly-eye lens 7G in order to change the shape or the size of the light source image SSi formed in the pupil Ep of the projection optical system PL. Therefore, if the aperture of the spatial filter 7H is switched from a normal circular aperture to an annular aperture, or from the annular aperture to 4-aperture, the optical characteristic of illumination luminous flux which irradiates the reticle R or the test reticle TR may differ, so that also an influence on the projection optical system PL may differ.

Accordingly, it is desirable that each of the above described image distortion correction plate G1, astigmatism/coma aberration correction plate G3, image plane curvature correction plate G4, illumination NA correction plate 7F is configured to be exchangeable for an optimum plate according to the shape of the aperture of the spatial filter 7H in accordance with the switching of the spatial filter 7H.

Figure 9:
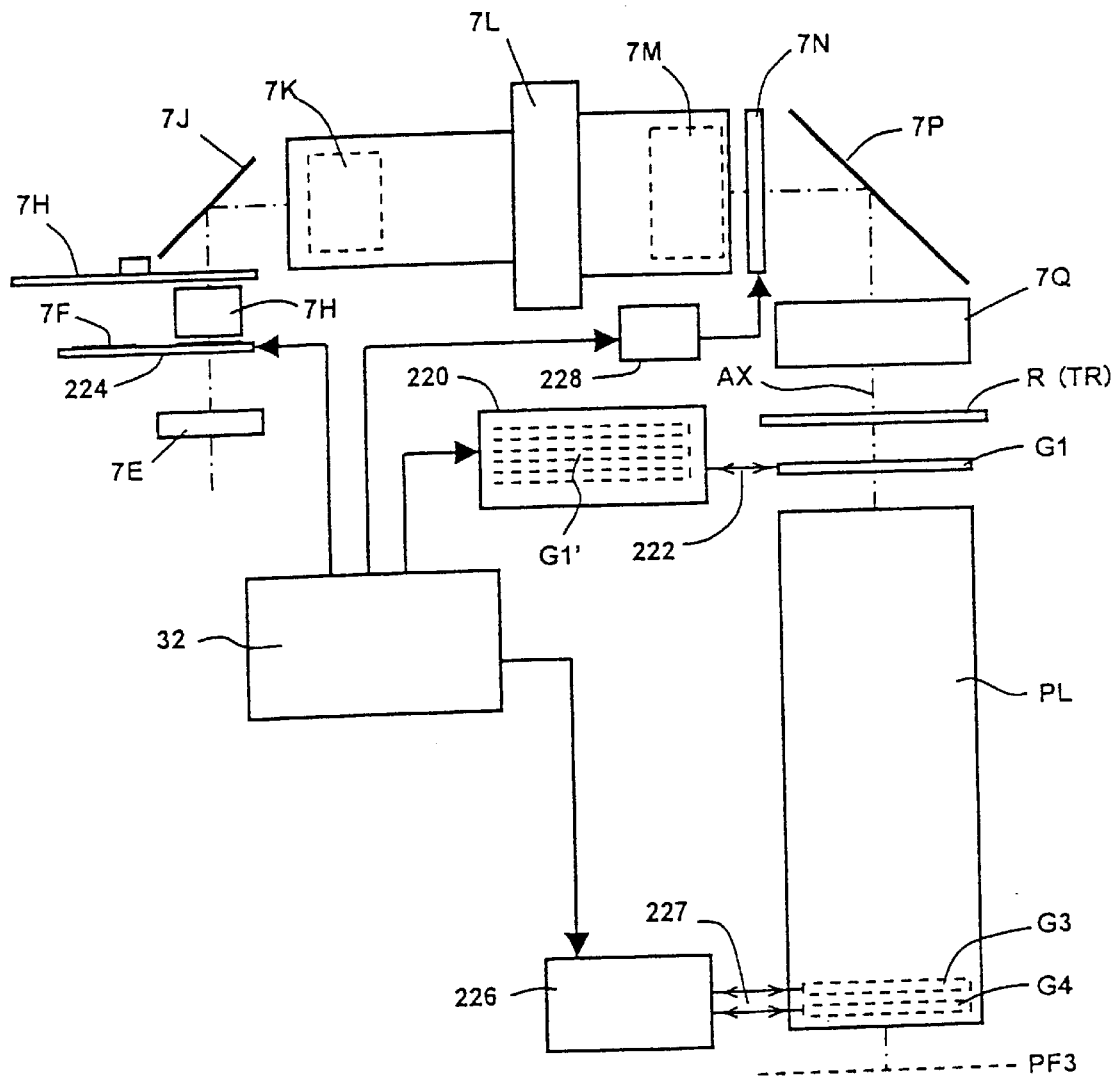
FIG. 9 is a schematic illustratively explaining the exchange and the adjustment mechanisms of aberration correction plates of respective types installed in a projection exposure apparatus.

FIG. 9 shows the outline of the configuration of a projection exposure apparatus where the image distortion correction plate G1, the astigmatism/coma aberration correction plate G3, the image plane curvature correction plate G4, and the illumination NA correction plate 7F are respectively made exchangeable, and the fundamental arrangement of the respective optical components from the collective lens 7E within the illumination optical system to the projection image plane PF3 of the projection optical system PL is the same as that in the configuration of FIG. 1. In FIG. 9, the image distortion correction plate G1 is arranged to be exchangeable for a plurality of image distortion correction plates G1' which are polished beforehand according to the shape or the size of the aperture of the spatial filter 7H and are in stock in a library 220, and its exchange operations are performed by an automatic exchange mechanism 222 which operates in response to the command from the main control system 32.

Additionally, on a switch mechanism 224 such as a turret, a linear slider, etc., a plurality of illumination NA correction plates 7F can be mounted, and each of the correction plates 7F is pre-manufactured so that a dynamic illumination NA difference becomes a minimum according to the shape or the size of the aperture of the spatial filter 7H. Which illumination NA correction plate to select is determined in correspondence with the spatial filter 7H selected in response to the command from the main control system 32.

Also for the astigmatism/coma correction plate G3 and the image plane curvature correction plate G4, a plurality of plates pre-manufactured in correspondence with the switching of the spatial filter 7H are in stock in a library 226, and suitable correction plates G3 and G4 among them are selected by an automatic exchange mechanism 227 in response to the command from the main control system 32, and inserted in the bottom of the projection optical system PL.

Also for the telecentric correction plate 7N, an automatic exchange mechanism 228 for exchanging for a telecentric correction plate which is polished beforehand according to an illumination condition (spatial filter 7H) in response to the command from the main control system 32 is arranged. However, only if an average telecentric error in the whole of illumination luminous flux is equally corrected, the automatic exchange mechanism 228 may be configured merely by an actuator which adjusts a tilt of the telecentric correction plate 7N to be two-dimensional.

With the above described configuration, the respective fluctuations of the optical characteristic of illumination luminous flux and the image formation characteristic of the projection optical system PL, which occur with an illumination condition change, can be optimally corrected in response to the command from the main control system 32, and an image of the pattern formed on the reticle R can be projected and transferred onto the wafer W in a state where few aberrations (such as a distortion error including an isotropic magnification error, an image plane curvature error, an astigmatism/coma error, a telecentric error, etc.) exist in all cases.

The projection optical system PL exemplified in the above described embodiments is assumed to be a reduction projection lens configured only by a dioptric element (lens) which uses quartz or fluorite as an optical glass material. However, the present invention can be applied also to other types of a projection optical system in exactly the same manner. Accordingly the other types of a projection optical system will be briefly explained by referring to FIG. 10.

Figure 10A:
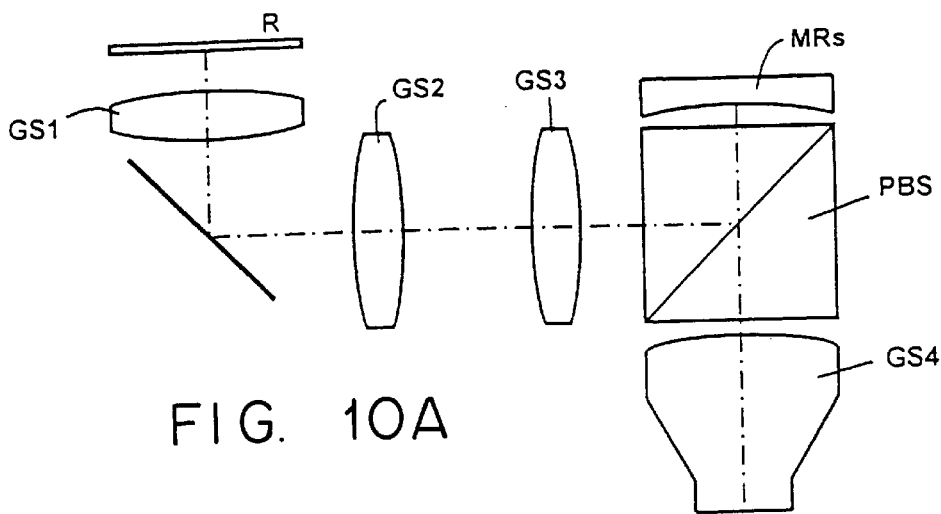
FIG. 10A is a schematic illustratively explaining first type of a projection optical system to which the present invention is applied.

FIG. 10(A) is a reduction projection optical system where dioptric elements (lens systems) GS1 through GS4, a concave mirror MRs, and a beam splitter PBS are combined. The characteristic of this system is a point that the image luminous flux from the reticle R is reflected by the concave mirror MRs via the large beam splitter PBS, and again returned to the beam splitter PBS, and imaged on the projection image plane PF3 (wafer W) with a reduction ratio earned at the dioptric lens system GS4. Its details are disclosed by the Japanese laid-open Publication No. 3-282527 (NC).

Figure 10B:
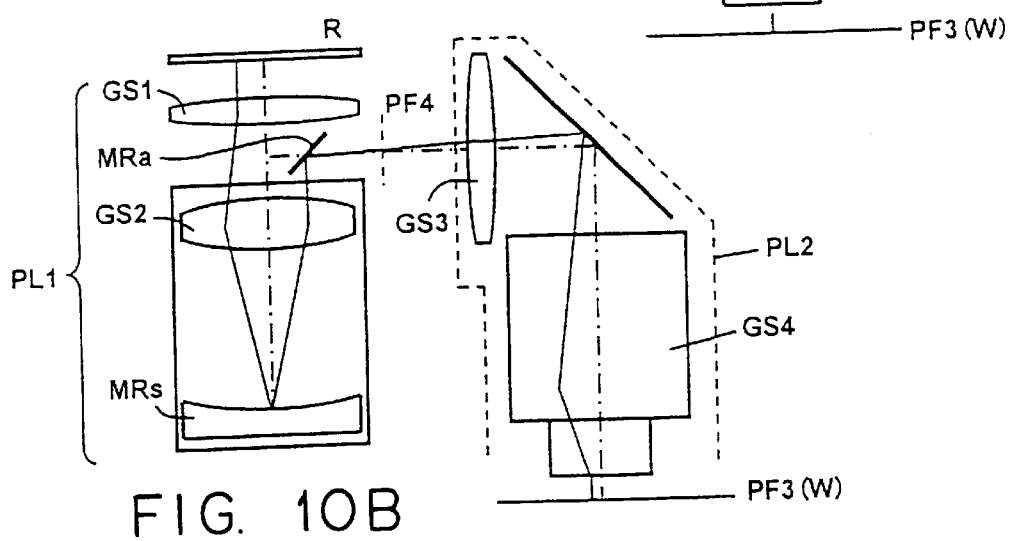
FIG. 10B is a schematic illustratively explaining second type of a projection optical system to which the present invention is applied.

FIG. 10(B) is a reduction projection optical system where dioptric elements (lens systems) GS1 through GS4, a small mirror MRa, and a concave mirror MRs are combined. The characteristic of this system is a point that the image luminous flux from the reticle R is imaged on the projection image plane PF3 (wafer W) through a first image formation system PL1 which is almost an equimultiple and composed of lens systems GS1 and GS2 and a concave mirror MRs, and a second image formation system PL2 which is composed of lens systems GS3 and GS4 and has almost a desired reduction ratio. Its details are disclosed by the Japanese laid-open Publication No. 8-304705 (NC: Takahashi).

Figure 10C:
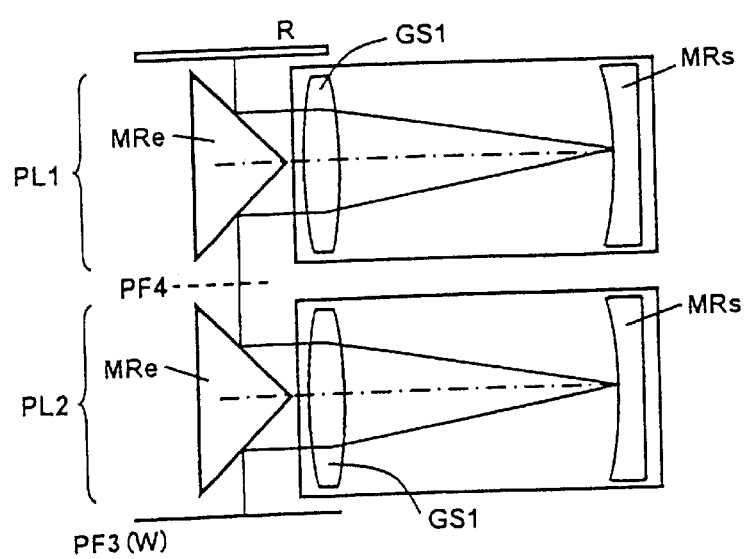
FIG. 10C is a schematic illustratively explaining third type of a projection optical system to which the present invention is applied.

FIG. 10(C) is an equimultiple projection optical system where a dioptric element (lens system) GS1 and a concave mirror MRs are combined. The characteristic of this system is a point that the image luminous flux from the reticle R is imaged on the projection image plane PF3 (wafer W) as an equimultiple orthoscopic image through first and second Dyson image formation systems PL1 and PL2, which are respectively configured by a prism reflection mirror MRe, the lens system GS1, and the concave mirror MRs. Its details are disclosed by the Japanese laid-open Publication No. 7-57986 (NC: Tanaka).

Also to the exposure apparatus comprising each of the projection optical systems shown in FIGS. 10(A), 10(B), and 10(C), the above described image distortion correction plate G1, astigmatism/coma correction plate G3, and image plane curvature correction plate G4 can be attached in a similar manner. Since an intermediate image formation plane PF4 which is almost an equimultiple of a pattern within an illumination area on the reticle R is formed especially in the projection optical system of FIGS. 10(B) and 10(C), at least one of the image distortion correction plate G1, the astigmatism/coma correction plate G3, and the image plane curvature correction plate G4 can be arranged in the neighborhood of the intermediate image formation plane PF4.

Additionally, the projection optical systems shown in FIGS. 10(A), 10(B), and 10(C) are systems which can be sufficiently applied to an ultraviolet light having a central wavelength of 200 nm or less such as an ArF excimer laser beam, etc. by selecting an optical glass material, a surface-coated material, etc. Even when such a projection optical system is used, a significant effect such that a distortion of a pattern image which is finally transferred onto a photo-sensitized substrate, an absolute projection position error, or a local overlapping error can be suppressed to one-tenth (approximately several tens of nms) or less of the minimum line width of the pattern image to be transferred by carrying out the sequence of: (1) the measurement of dynamic optical characteristics (a distortion, an astigmatism/coma aberration, an illumination NA difference, etc.) under a set illumination condition; (2) the process of each correction plate type based on the result of the above described measurement; and (3) the mounting and the adjustment (including re-measurement) of each manufactured correction plate type, can be obtained.

In the meantime, the projection optical systems shown in FIGS. 1 and 10(A) among the above described projection optical systems shown in FIGS. 1 and 10 possess a circular projection field, while the projection optical systems shown in FIGS. 10(B) and 10(C) possess almost a semicircle projection field. An effective projection area EIA which is restricted to a rectangular slit shape within a projection field is assumed to be used for scan-exposure whichever projection optical system is used. However, a slit projection area in an arc shape may be set depending on a case.

In such a case, the shape of the intensity distribution of the illumination light which illuminates the reticle R (TR) may be merely modified to be an arc-shaped slit. However, considering that the illumination light is a pulse light, it is not advantageous to make the width of the scanning direction of the arc-shaped slit as thin as disclosed by pp. 424–433 in Vol. 1088 of the above described SPIE, which is cited earlier in the explanation of the conventional technique, and some width is required.

Assume that a width Dap of an arc-shaped slit in the scanning direction on a wafer is 1 mm, the number Nm (integer) of pulse lights to be emitted while the wafer is moving by that width during the scanning is 20 pulses, and the maximum frequency fp of the pulse oscillation of an illumination. light is 1000 Hz (conforming to the standard of a laser light source). The moving speed Vws of the wafer while one area on the wafer is being scan-exposed becomes 50 mm/sec based on the relationship Vws=Dap/(Nm/fp), which proves that a throughput is improved with the widening of the slit width Dap.

Accordingly, even if an illumination light is set to have an arc-shaped slit, a width of approximately 3 to 8 millimeters, which is wider than a conventional method, must be adopted on a wafer. However, it is desirable not to make the inside arc of the illumination light having the arc-shaped slit and its outside arc concentric, but to form the slit into a crescent shape such that the width of scan-exposure of the arc-shaped slit is the same at any position in the non-scanning direction of the arc-shaped slit.

The way of thinking of the respective optical aberration corrections by the image distortion correction plate G1, the astigmatism/coma correction plate G3, the image plane curvature correction plate G4, the telecentric correction plate 7N, and the illumination NA correction plate 7F, which is explained in the embodiments of the present invention, is applicable also to an X-ray exposure apparatus which comprises a reduction projection system configured only by catoptric elements (a concave mirror, convex mirror, a toroidal reflection mirror, a plane mirror, etc.) in addition to the projection optical system configured by a catadioptric system (a system where a dioptric element and a catoptric element are combined) shown in FIG. 10.

Because there is no optical material having a satisfactory dioptric operation for an ultra-high-frequency illumination light, corrections of the distortion characteristic, the astigmatism/coma aberration characteristic, the telecentric characteristic, etc. can be implemented by locally and infinitesimally transforming the plane shape of the reflection surface of a catoptric element in a dedicated manner. As the method for performing an infinitesimal transformation, for example, the method for polishing a reflection layer, which is piled up relatively thick, on the surface of the material (low-expansion glass, quartz, fine ceramics, etc.), which becomes a preform of a reflection mirror arranged at a position close to the object or the image plane within a projection optical path, the method for intentionally performing an infinitesimal transformation for the shape of a reflection plane in a controllable range by applying a local stress to a preform from the rear or the side of the reflection plane of a reflection mirror, the method for infinitesimally transforming the shape of a reflection plane with thermal expansion by installing a temperature adjuster (Peltier element, heat pipe, etc.) on the rear of a reflection mirror, etc. are considered.

Meanwhile, when the image distortion correction plate G1 is manufactured, when the telecentric correction plate 7N is manufactured, or when the astigmatism/coma aberration correction plate G3 is manufactured, the dynamic distortion characteristic, the dynamic telecentric error characteristic, or the dynamic astigmatism characteristic, etc. in consideration of the averaging at the time of scan-exposure must be obtained by measurements. However, such types of dynamic aberration characteristics can be obtained also from the result of the test printing of a measurement mark pattern on the test reticle TR with a scan-exposure method. Therefore, the measurement method and sequence in that case will be explained below by referring to FIGS. 11 and 12.

As explained earlier, if a particular object point positioned on the object plane of the projection optical system PL is transferred on the wafer W by using the exposure apparatus shown in FIG. 1, the image of the object point projected onto the wafer W is modulated by the static distortion characteristic at each position in the scanning direction within the effective projection area EIA of the projection optical system PLM, and is averaged, so that the projection image formed on the wafer W has already included a dynamic distortion characteristic (dynamic image distortion error).

Accordingly, if a measurement mark on the test reticle TR is scan-exposed onto a test wafer, each L&S pattern projection image formed at the position of an ideal lattice point or its equivalent position becomes an image accompanying a dynamic image distortion vector (distortion error).

Figure 11:
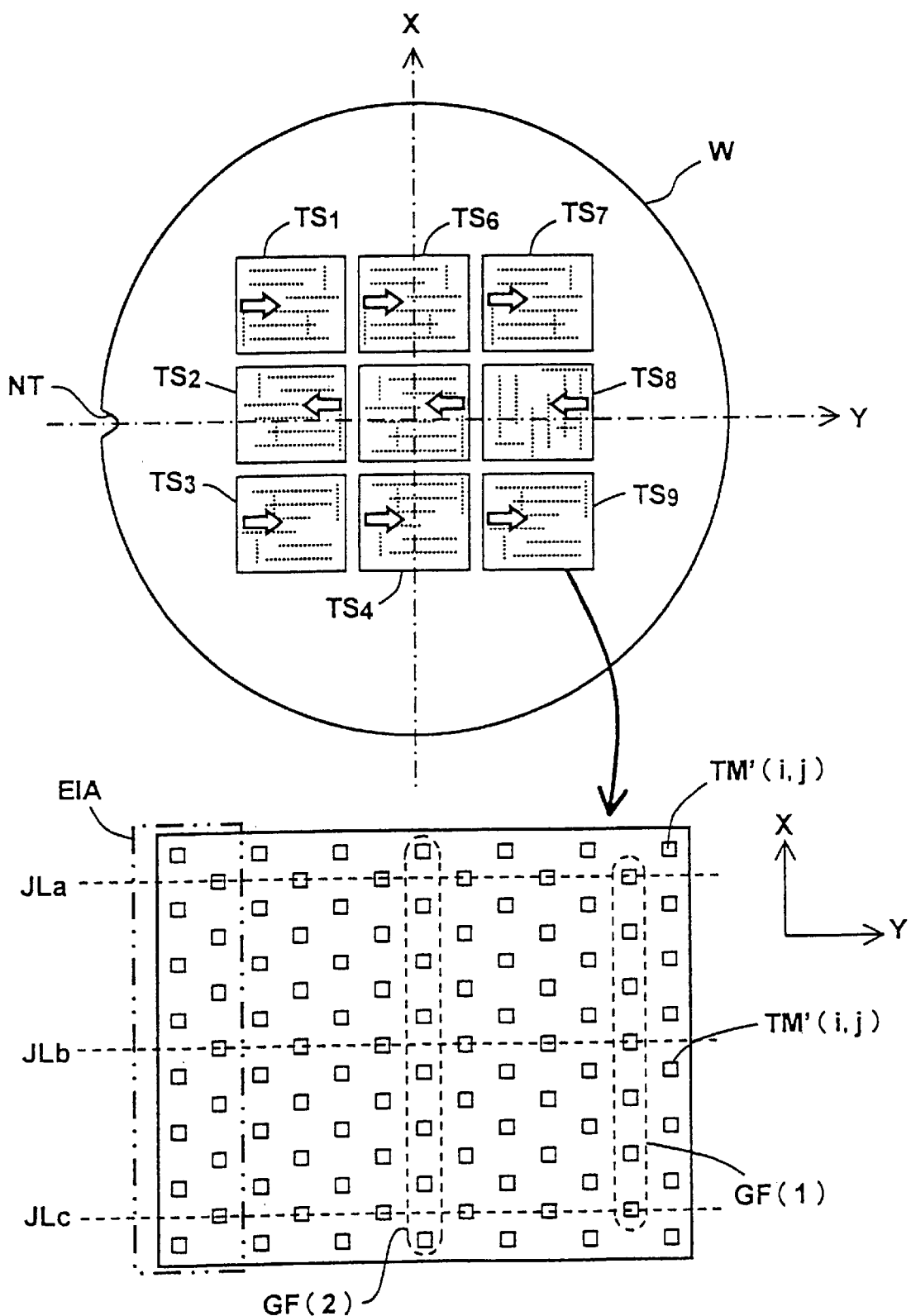
FIG. 11 is a schematic showing the array of shot areas on a wafer onto which a test reticle pattern is scanned and exposed at the time of test printing, and the state of one shot area within the array.

Therefore, as shown in FIG. 11, a resist layer is coated on a superflat wafer W having a notch NT, which is suitable for test printing, and the wafer is mounted on the table TP of the exposure apparatus shown in FIG. 1. Then, pattern areas on the test reticle TR are sequentially transferred, for example, in 3×3 shot areas TS1 through TS9 on the wafer W with a step-and-scan method. At this time, the respective shot areas TS1 through TS9 shown in FIG. 11 are scanned in an order of TS1, TS2, . . . , TS9 alternately in the Y direction as indicated by the arrows in this figure.

As a result, each projection image TM'(i,j) of the test mark TM(i,j) arranged in a matrix state on the test reticle R is transferred in the respective shot areas TS1 to TS9 of the resist layer on the wafer W as a latent image, as expanded and shown in the lower portion of FIG. 11. Then, the wafer W is transmitted to a coater developer, and the resist layer is developed under the condition equal to that at the time of the manufacturing of an actual device.

The developed wafer W is set up within a dedicated examination measurement device, by which a position deviation amount of each projection image TM'(i,j) formed by the concave/convex of the resist layer within the respective shot areas TS1 through TS9 from an ideal lattice point is measured. The projection image TM'(i,j) measured at that time may be any image of an L&S pattern, a cross-shaped LAMPAS mark, a vernier mark, etc., an image suitable for the examination measurement device is used.

For the position deviation measurement of each projection image TM'(i,j) from an ideal lattice point, an alignment detection system included in a projection exposure apparatus may be used. The wafer W after being developed is mounted, for example, within the projection exposure apparatus equipped with an LSA system, an FIA system, or an LIA system, which is disclosed by the Japanese laid-open Publication No. 2-54103, and a pattern and a mark formed on the resist layer can be measured in a similar manner.

The position deviation amount of each projection image TM'(i,j) from an ideal lattice point, which is obtained by the above described measurement operation, becomes an amount that directly represents the dynamic image distortion at each ideal lattice point.

However, respective image distortions of a plurality of projection images TM(i,j), which exist, for example, respectively along lines JLa, JLb, and JLc extending in the scanning direction (X direction), among projection images TM'(i,j) are calculatedly averaged for the respective lines JLa, JLb, and JLc. This is because unevenness occurs due to the move control precision of a reticle stage or a wafer stage at the time of scan-exposure, or a measurement error of a projection image TM'(i,j) if the dynamic image distortion characteristic is determined with only one particular combination.

In this way, the dynamic distortion characteristic at the position in the line JLb within the effective projection area EIA or in its neighborhood can be accurately obtained from the average value of the respective image distortions of the plurality of projection images TM'(i,j) in the line JLb. However, if the respective image distortions of all the projection images TM'(i,j) which exist along the respective lines JLa, JLb, and JLc are averaged within a shot area TSn, also the moving errors (a relative rotation error of a scanning axis, a yawing error, etc.) of the reticle stage 8 and the wafer stage 14 at the time of scan-exposure are averaged in the size of the scanning direction within the shot area TSn.

Figure 12:
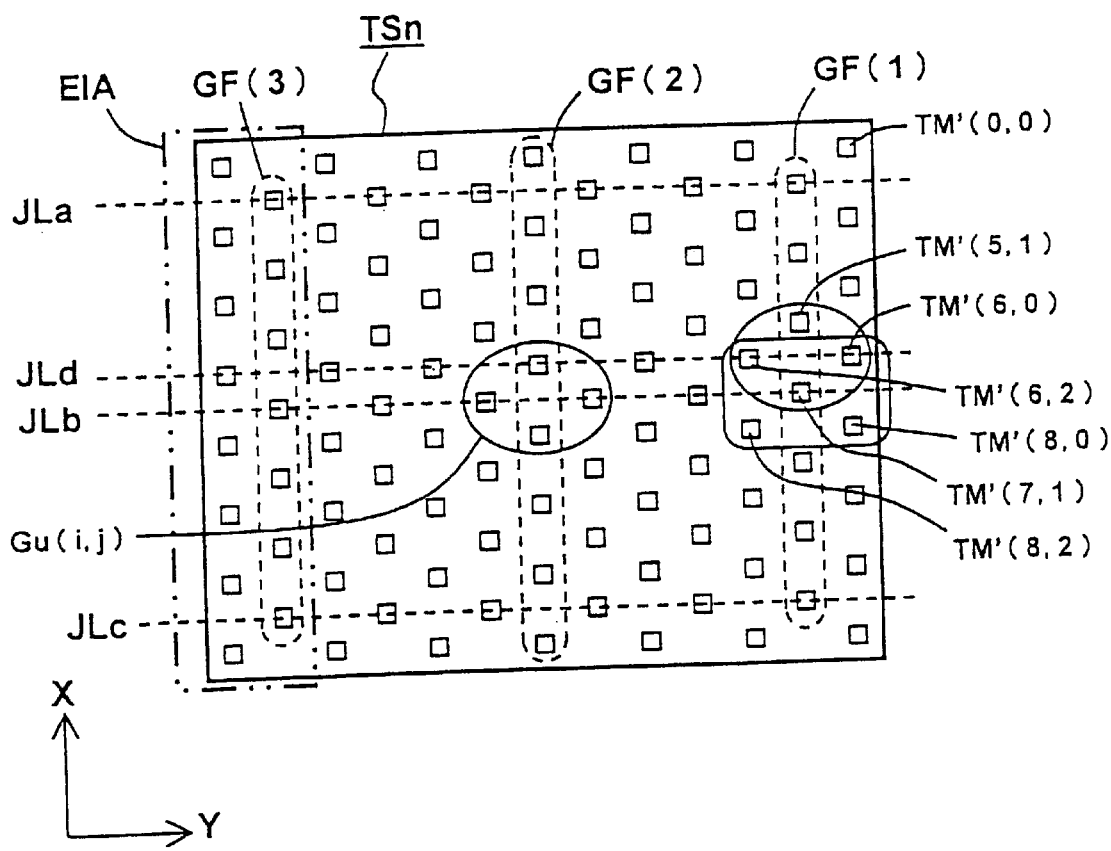
FIG. 12 is a schematic explaining the state where respective projection images of a measurement mark pattern within one shot area, which is test-printed, are grouped and averaged.

Therefore, as shown in FIG. 12, the dynamic image distortion is obtained for each of the rightmost combination GF(1), the middle combination GF(2), and the leftmost combination GF(3) in the scanning direction (Y direction) within the shot area TSn by an actual measurement, and the actually measured image distortion from which the moving errors of the stages 8 and 14 at each scanning position (position in the Y direction within the shot area) are subtracted is defined to be a dynamic distortion characteristic.

Then, the distortion characteristics of the respective combinations GF(1), GF(2), and GF(3) from which the moving errors are subtracted are averaged. Notice that it is easy to calculatedly obtain the moving errors of the stages 8 and 14 afterwards, if the measurement value $(X, Y, \theta)$ by the interferometers 46, 62, etc. at the time of scan-exposure is stored in real time in a neighborhood range of the scanning position of each of the combinations GF(1), GF(2), and GF(3).

Additionally, if the dynamic image distortion at an arbitrary position in the X direction is determined in each of the combinations GF(1), GF(2), and GF(3), averaging may be made by using the result of an actual measurement of the image distortion of a projection image TM'(i,j) positioned in the periphery of that position. For example, as shown in FIG. 12, if the image distortion on the line JLb in the combination GF(1) is determined based on the assumption that the upper right corner of the projection image TM'(i,j) is TM'(0,0), the actual measurement values of the image distortions of the projection image TM'(7,1) at that position and its peripheral projection images TM'(6,0), TM'(6,2), TM'(8,0), and TM'(8,2) are averaged.

Similarly, if the image distortion on the line JLd (the position next to the line JLb) in the combination GF(1) is determined, the actual measurement values of the image distortions of the projection images TM'(5,1), TM'(6,0), TM'(6,2), and TM'(7,1), which are positioned in the periphery of that position, are averaged. If the image distortion on the line JLb in the combination GF(2) is determined, the actual measurement values of the image distortions of 4 projection images TM'(i,j) existing in an ellipse Gu(i,j) with that position as a center are averaged.

Furthermore, in this embodiment, a plurality of shot areas TSn are formed on the wafer W. Therefore, if the image distortion on the particular position in the shot area is determined, there is an advantage that a random measurement error can be reduced by adding and averaging the dynamic image distortion (for which a moving error is corrected) at the same position in the other shot areas.

Figure 13:
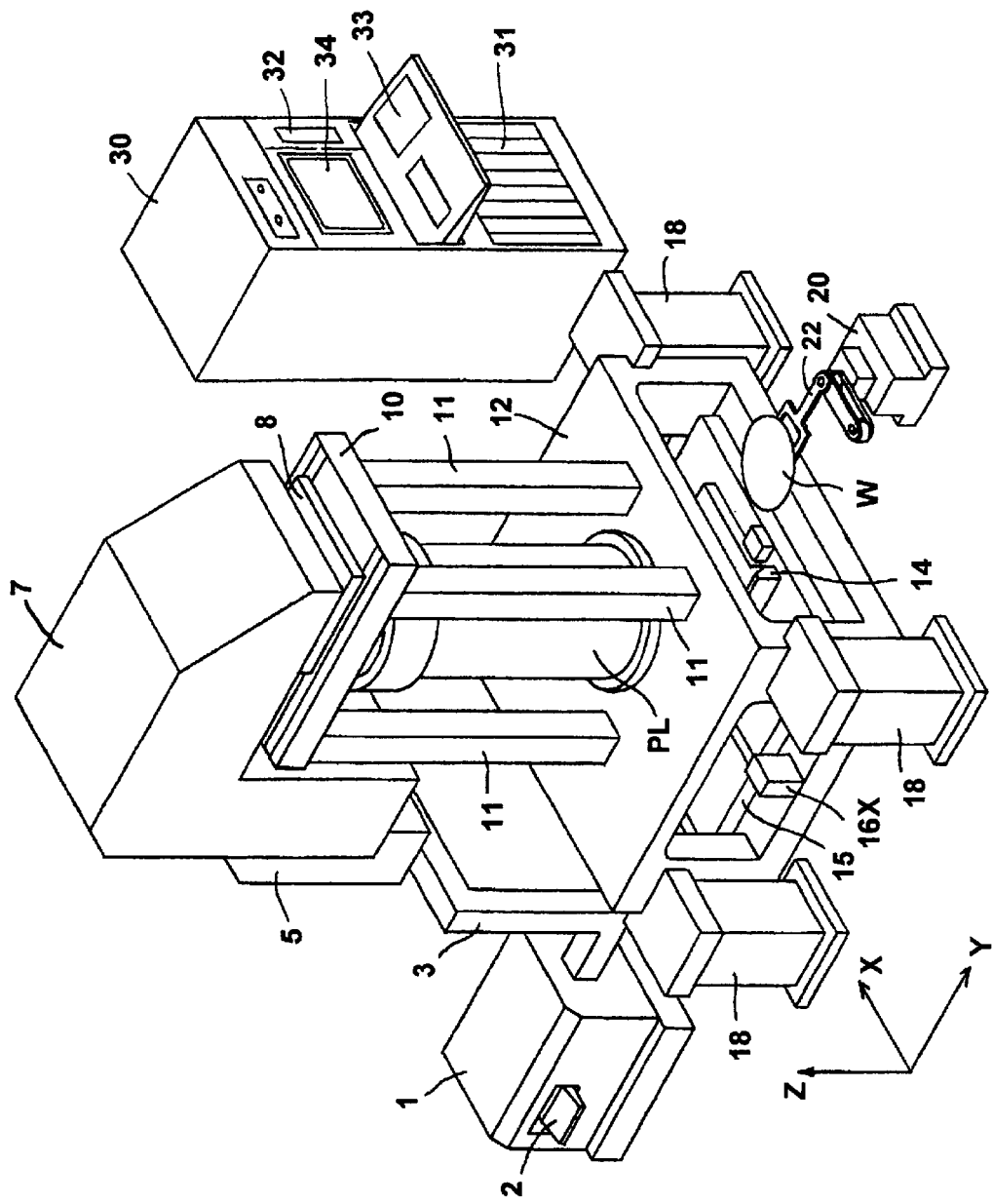
FIG. 13 is a perspective view illustratively showing the entire appearance of a projection exposure apparatus preferable for practicing the present invention.

Here, FIG. 13 illustratively showing the entire appearance of the projection exposure apparatus shown in FIG. 1 is explained. The constituent elements having the same capabilities as those shown in FIG. 1 are denoted with the same reference numerals.

The projection exposure apparatus shown in FIG. 13 uses an ultraviolet pulse laser beam from the excimer laser light source 1 in order to obtain the pattern resolution of the minimum line width of 0.3 to 0.15 $\mu$m or so, which is required to mass-produce a micro circuit device having the integration degree and minuteness equivalent to a semiconductor memory element (D-RAM) of 64M to 1G bits or more.

The wavelength width of the excimer laser beam is narrowed to include within a tolerable range the color aberration caused by various dioptric elements configuring the illumination system or the projection optical system PL of the exposure apparatus. The absolute value of the central wavelength to be narrowed or the value of the width to be narrowed is displayed on an operation panel 2, and can be infinitesimally adjusted from the operation panel 2 depending on need. Additionally, pulsed light emission mode (representatively, three modes such as self-excited oscillation, external trigger oscillation, and maintenance oscillation) can be set from the operation panel 2.

Because the excimer laser light source 1 is normally arranged in a room (service room with a lower cleanness degree), which is isolated from a super-clean room where an exposure apparatus itself is installed, also the operation panel 2 is arranged within that service room. Furthermore, a control computer interfaced with the operation panel 2 is included in the excimer laser light source 1. While normal exposure operations are performed, this computer controls the pulsed light emission of the excimer laser light source 1 in response to the instruction from a minicomputer 32 for controlling the exposure apparatus, which will be described later.

The excimer laser beam from the excimer laser light source 1 is led to a beam reception system 5 of the exposure apparatus via a shading tube 3. Within the beam reception system 5, a plurality of movable reflection mirrors for optimally adjusting the incidence position and angle of the excimer laser beam to the illumination optical system 7 of the exposure apparatus, so that the excimer laser beam always enters into the illumination optical system 7 in a predetermined positional relationship to the optical axis of the illumination optical system 7.

Within the illumination optical system 7, as explained in detail by referring to FIG. 1, a variable beam attenuator for adjusting average energy for each pulse of the excimer laser beam, a fly-eye lens (optical integrator) system for making the excimer laser beam into an illumination light having an even intensity distribution, a reticle blind (illumination field diaphragm) for restricting a reticle illumination light at the time of scan-exposure to a rectangular-slit shape, an image formation system (including condenser lens) for imaging the rectangular-slit-shaped aperture of the blind in a circuit pattern area on a reticle, etc. are arranged.

The rectangular-slit-shaped illumination light irradiated on the reticle is set to extend long and narrow in the X direction (non-scanning direction) in the center of the circular projection field of the projection optical system PL in FIG. 13. The width of the illumination light in the Y direction (scanning direction) is set to be almost constant.

The reticle is absorbed and held on a reticle stage 8, which linearly moves on a reticle base 10 with a large stroke by a linear motor, etc., for being scan-exposed, and is set to be infinitesimally movable by a voice coil motor (VCM), a piezo element, etc. also in the X and the θ directions. The reticle base 10 is securely disposed on the top of four columns 11 standing upward from a main body column base 12 which fixes the flange of the projection optical system PL.

The main body column base 12 is formed in a box shape, the inside of which is made hollow in this embodiment, and a base 15 for supporting a movable stage 14 on which a wafer W is mounted is fixed in its follow. FIG. 13 shows only a laser interferometer 16X for measuring the position of the movable stage 14 in the X direction. Actually, however, a laser interferometer 16Y for measuring the position of the movable stage 14 in the Y direction is arranged in a similar manner. The movable stage 14 in FIG. 13 is assumed to stop at the loading position for receiving the wafer W held by the tip of an arm 22 of a wafer conveying robot 20, or the unloading position for handing the wafer on the holder of the movable stage 14 to the arm 22.

Furthermore, a mounting stand 18 with a shockproof capability, which is intended to support the entire apparatus from floor, is arranged at each of the four corners of the main body column base 12. The mounting stand 18 supports the weight of the whole of the apparatus itself via an air cylinder, and comprises an acutuator and various sensors for actively correcting the tilt of the entire apparatus, the displacement in the Z direction, and the displacements of the entire apparatus in the X and the Y directions by using feedback or feedforward control.

The entire operations of the main body of the exposure apparatus shown in FIG. 13 are managed by a control rack 30 which includes a plurality of unit control boards 31 for individually controlling the constituent elements (excimer laser light source 1, illumination optical system 7, reticle stage 8, wafer movable stage 14, conveying robot 20, etc.) within the main body of the apparatus, the minicomputer 32 for integratedly controlling the control boards 31, an operation panel 33, a display 34, etc. A unit computer such as a microprocessor etc. is arranged within each of the control boards 31. These unit computers cooperate with the minicomputer 32, so that the sequence of an exposure process is performed for a plurality of wafers.

The entire sequence of the exposure process is managed by the process program stored in the minicomputer 32. With the process program, the information about a wafer to be exposed (the number of wafers to be processed, shot size, shot array data, alignment mark arrangement data, alignment condition, etc.), the information about a reticle to be used (the type data of a pattern, the arrangement data of each mark, the size of a circuit pattern area, etc.), and the information about exposure conditions (the amount of exposure, the amount of focus offset, the offset amount of scanning speed, the offset amount of projection magnification, the correction amount of various aberration or image distortion, settings of a $\overset{\circ}{o}$ value or an illumination NA, etc. of an illumination system, settings of the NA value of the projection lens system, etc.) are stored as a parameter group package under the exposure process file name created by an operator.

The minicomputer 32 decodes the process program instructed to be executed, and instructs corresponding unit computers of the operations of the respective constituent elements, which are required for exposing wafers one after another as commands. When each of the unit computers successfully terminates one command, it transmits the status indicating the successful termination to the minicomputer 32. The minicomputer 32 which receives this status issues the next command to a unit computer. When a wafer exchange command is issued from the minicomputer 32 during such a process sequence, the control units of the movable stage 14 and the wafer conveying robot 20 collaborate with each other, so that the movable stage 14 and the arm 22 (wafer W) are set to have the positional relationship shown in FIG. 13.

Furthermore, a plurality of pieces of utility software relating to the practicing of the present invention are installed in the minicomputer 32. Typical of the software are two types: (1) the measurement program for automatically measuring the optical characteristic of a projection optical system or an illumination optical system, and for evaluating the quality (distortion characteristic, astigmatism/coma characteristic, telecentric characteristic, illumination numerical aperture characteristic, etc.) of a projection image; and (2) the correction program for performing respective correction processes according to the evaluated quality of the projection image). These programs are configured to operate in cooperation with the corresponding constituent elements in FIG. 1 which shows the details of the configuration of the apparatus shown in FIG. 13.

Note that the laser interferometer 16X in FIG. 13 corresponds to the laser interferometer 62 in FIG. 1.

Next, the operation, the configuration, and the manufacturing method of the above described image distortion correction plate G1 will be described in detail. The manufacturing method is based on the one recited in the above cited Japanese Unexamined Patent Publication No. 8-203805 (Nikon). However, there is a difference in a point that this manufacturing method is applied to the projection optical system for scan-exposure.

Figure 14:
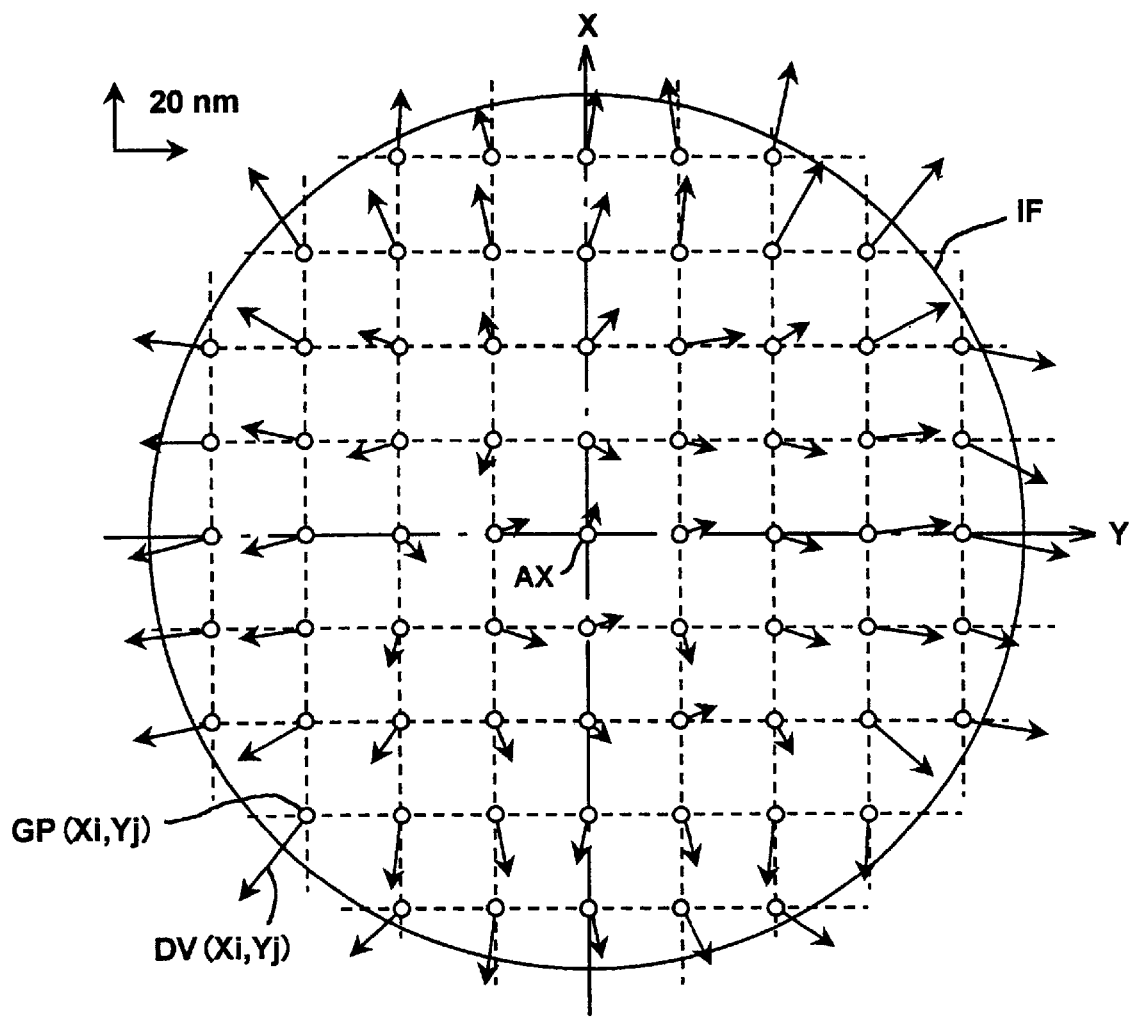
FIG. 14 is a schematic illustratively exemplifying a distortion characteristic which occurs within the projection field of the projection optical system shown in FIGS. 1 and 13.

First of all, the distortion characteristic of the projection optical system having a circular projection field is briefly explained by referring to FIG. 14.

In FIG. 14, a circular projection field IF represents the field of the wafer W side (image plane side), and the origin of a coordinate system X-Y is assumed to agree with the optical axis AX of the projection optical system PL. Additionally, a plurality of points GP(Xi,Yj), which are regularly arranged in the coordinate system X-Y in FIG. 14 represent the ideal lattice points with the optical axis AX as the origin. An arrow at each of the ideal lattice points GP(Xi,Yj) represents the amount of distortion (image distortion vector) DV(Xi,Yj) at its position on the image plane.

As is known from the distortion characteristic shown in FIG. 14, the projection optical system of this type can suppress the image distortion vector to 20 nm or less in the neighborhood of the optical axis AX. However, also the absolute value of the image distortion vector normally increases as it approaches the circumference of the projection field IF. If image distortion vectors DV(Xi,Yj) conform to a simple function according to the image height value (the distance from the optical axis AX) or the X-Y position, it becomes possible to reduce all of the image distortion vectors DV(Xi,Yj) within the projection field IF by using the movable lens element G2 or the lens control system 44 to which the correction according to the function can be made.

However, as is understood from the distortion characteristic shown in FIG. 14, the respective image distortion vectors DV(Xi,Yj) includes mutually random components. Even if a correction according to a particular function is made, the random components still remain. Such remaining random error components included in the image distortion vectors DV(Xi,Yj) emerge as random distortion errors unchanged at respective points in a projected circuit pattern image, when being statically exposed.

In the meantime, when being scan-exposed, the image distortion vector which statically occurs at each of a plurality of image points existing in the move direction of the wafer W emerges as a dynamic image distortion vector averaged or accumulated within an effective exposure field (the width of an exposure slit). In this case, even if the static distortion characteristic conforming to a particular function is corrected, the random image distortion vector consequently remains due to the random distortion error component remaining at each point on an image plane.

Arranged to reduce such a random image distortion vector and to obtain the best distortion characteristic at the time of scan-exposure is the image distortion correction plate G1 shown in FIG. 1. The correction plate G1 in this embodiment is configured in such a way that part of the surface of a quartz or fluorite parallel plate is polished with an accuracy of a wavelength order, and a predetermined infinitesimal slope is formed in part of the surface. By deflecting the principal ray of local image luminous flux, which passes through the infinitesimal slope, by an extremely slight amount, the static image distortion vector on the image plane is changed.

Figure 15:
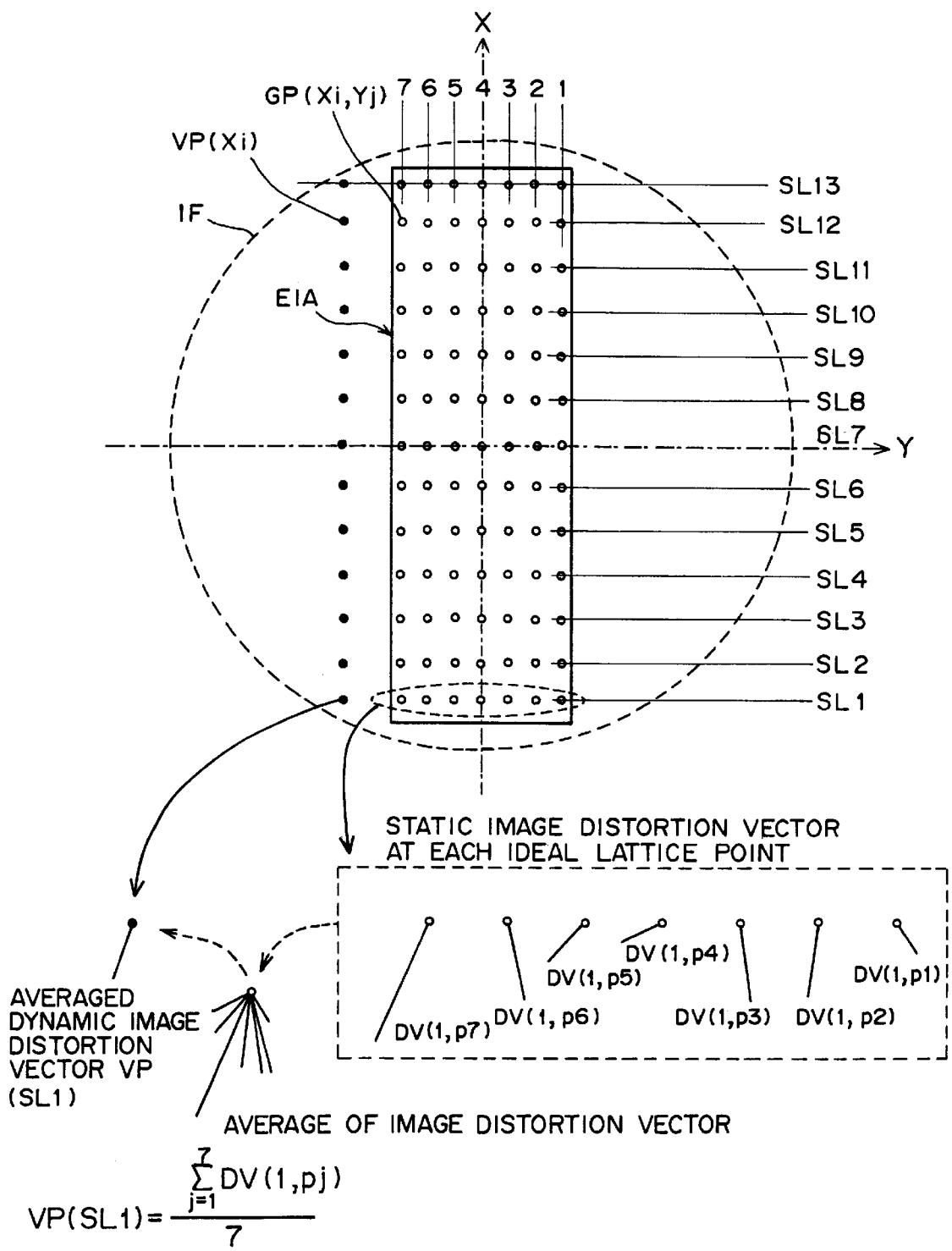
FIG. 15 is a schematic explaining the averaging of the distortion characteristic (image distortion vector) by using a scan-exposure system.

Here, the relationship between the static distortion characteristic occurring within the projection filed IF and the dynamic distortion characteristic occurring at the time of scan-exposure is explained by referring to FIG. 15. FIG. 15 assumes that the circular field IF represents the field on the image plane side of the projection optical system PL, and the origin of the coordinate system X-Y exists in its center (the position of the optical axis AX).

Since the reticle R and the wafer W are scanned relatively in the Y direction in the apparatuses shown in FIGS. 1 and 13, the effective projection area EIA has an even width which is symmetrical with respect to the X axis in the Y direction, and is set to be a long and thin rectangle or slit shape. The area EIA is actually determined according to the distribution of the illumination light to the reticle R, which is stipulated by the aperture of the blind 7L shown in FIG. 1. However, this area may be similarly stipulated by arranging a field diaphragm with a rectangular aperture on the intermediate image formation plane in the projection optical system PL, depending on the configuration of the projection optical system PL.

In FIG. 15, ideal lattice points GP(Xi,Yj), which are arranged as 13 lines (SL1 to SL13) in the X direction and as 7 lines (1 to 7) in the Y direction are set within the area EIA. The subscript "i" of the ideal lattice point GP(Xi,Yj) indicates any of integers 1 through 13, while the subscript "j" indicates any of integers 1 through 7. The lattice point GP(X7,Y4) of i=7 and j=4 is positioned in the center of the circular field IF.

The image distortion vector occurring at each of the ideal lattice points GP(Xi,Yj) is a static distortion characteristic. Here, static image distortion vectors DV(1,p1) to DV(1,p7) at seven lattice points GP(X1,Y1) to GP(X1,Y7) in the line SL1, which exist in sequence in the Y direction being the scan-exposure direction, are shown as an example. The image distortion vectors DV(1,p1) to DV(1,p7) are represented as the segments extending from the white circles which represent the positions of the ideal lattice points in the line SL1.

In the static exposure, the pattern at one point on the reticle R is projected only with the image distortion vector at that point. In the meantime, in the scan-exposure, the image of the pattern at one point on the reticle R is projected while moving the pattern, for example, along the line SL1 in the Y direction within the projection area EIA at an equal speed. Therefore, the pattern image at that point is affected by all of the static image distortion vectors DV(1,p1) to DV(1,p7) shown in FIG. 15, and formed on the wafer W.

When the projection image of the pattern at the one point on the reticle R is moved linearly within the projection area EIA in the Y direction, the position of the reticle R is controlled in the X, Y, and e directions by the laser interferometer 46 with an overall accuracy of ±15 nm or less, as shown in FIG. 1. Accordingly, the linearity of the movement of the projection image is reduced by the amount equivalent to the projection magnification, and can be sufficiently made smaller than the image distortion vectors DV(1,p1) to DV(1, p7). Therefore, the projection image of the pattern at one point on the reticle R, which is formed on the wafer W by scan-exposure, becomes the one accompanying the dynamic image distortion vector VP(SL1) obtained by averaging the image distortion vectors DV(1,p1) to DV(1,p7) that the projection optical system PL possess, in almost any case.

Accordingly, the dynamic image distortion vector VP(SL1) obtained in the line SL1 in the scanning direction within the projection area EIA is acquired by calculating the average value of the X direction components of the static image distortion vectors DV(1,p1) to DV(1,p7) and the average value of their Y direction components. Such a dynamic image distortion vector VP(Xi) is obtained for each of the lines SL1 to SL13 in the X direction, so that the distortion characteristic of the pattern image (or the ideal lattice point image) to be transferred onto the wafer W as a result of the scan-exposure through the projection area EIA can be determined.

In the scan-exposure system, if the scan-moving for the reticle R and the wafer W is precisely performed, the distortion characteristic occurring in the whole of one shot area on the wafer W conforms to the dynamic image distortion vector VP(Xi) at any point within that shot. Therefore, the distortion characteristic caused by the scan-exposure is identified as the dynamic image distortion vector VP(Xi) occurring at each of the ideal lattice points which are arranged in sequence in the X direction, for example, as shown in FIGS. 16A to 16D.

Figure 16A:
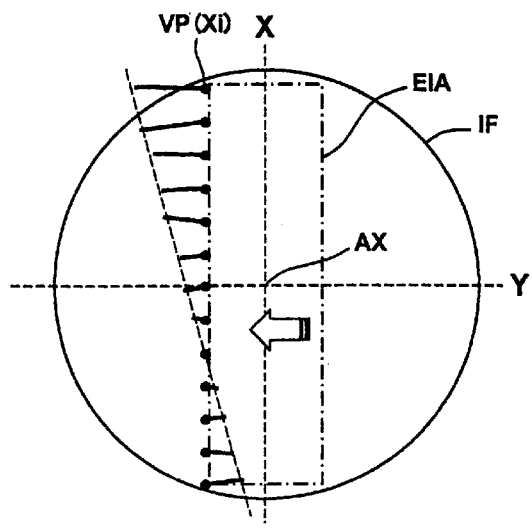
FIG. 16A is a schematic explaining first typical example of an averaged dynamic distortion characteristic.

FIGS. 16A to 16D exemplify the dynamic image distortion vector VP(Xi) (i=1 to 13) which has a tendency varying according to the static distortion characteristic in the projection area EIA within the circular field IF. FIG. 16A exemplifies the distortion characteristic which has a tendency such that each dynamic image distortion vector VP(Xi) becomes almost parallel to the scanning (Y) direction, and its absolute value is approximate to a linear function which varies almost at a constant ratio according to the position in the X direction.

Figure 16B:
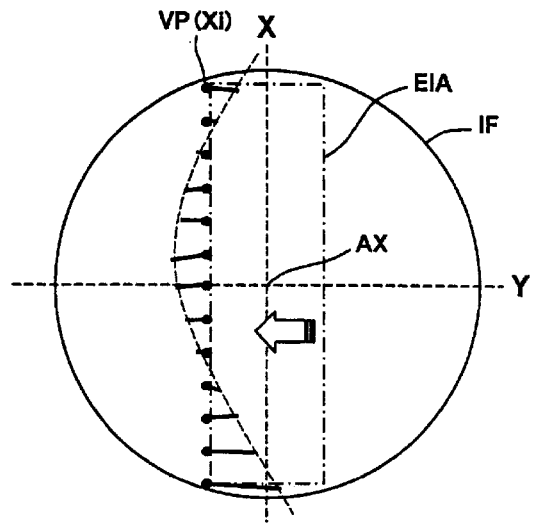
FIG. 16B is a schematic explaining second typical example of an averaged dynamic distortion characteristic.
Figure 16C:
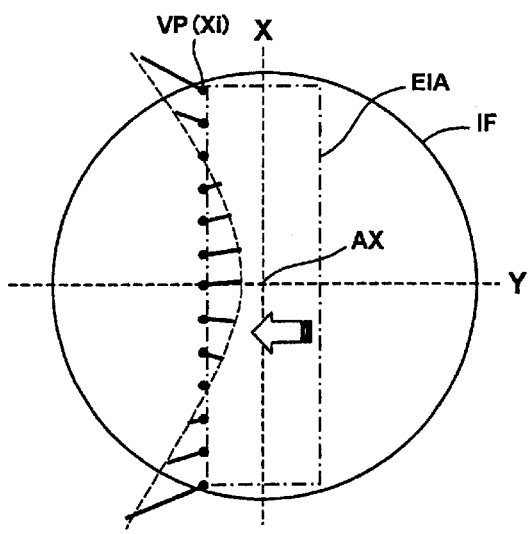
FIG. 16C is a schematic explaining third typical example of an averaged dynamic distortion characteristic.
Figure 16D:
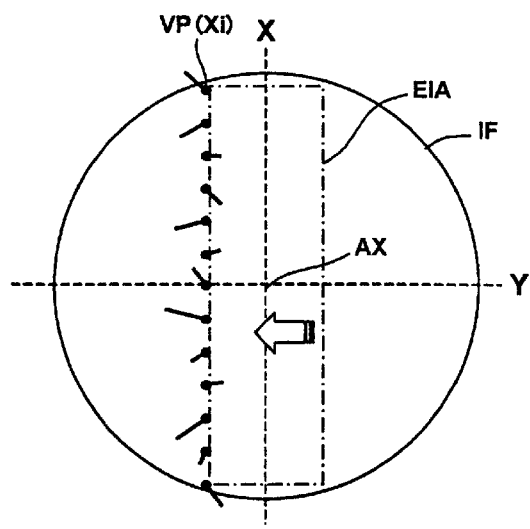
FIG. 16D is a schematic explaining fourth typical example of an averaged dynamic distortion characteristic.

FIG. 16B exemplifies the distortion characteristic which has a tendency such that each dynamic image distortion vector VP(Xi) becomes almost parallel to the scanning (Y) direction, and its absolute value is almost approximate to a quadratic function according to the position in the X direction. FIG. 16C exemplifies the distortion characteristic which has a tendency such that the tendency of the distortion characteristic shown in FIG. 16B is superposed with the magnification error in the non-scanning direction. FIG. 16D exemplifies the distortion characteristic which has a tendency such that each dynamic image distortion vector P(Xi) varies due to random directionality and magnitude.

Assume that the image distortion vectors VP(Xi) are measured for each of combinations GF(1) and GF(2) of the projection image TM'(i,j) existing in sequence in the non-scanning (X) direction in one shot area TS9 in FIG. 11. The image distortion vectors in each of the combinations GF(1) and GF(2) directly represent, for example, the distortion characteristics shown in FIG. 16D.

The dynamic distortion characteristic shown in FIG. 16A is, what is called, a skew. Except for correcting the characteristic of the projection optical system PL itself with the surface configuration of the correction plate G1, the above described distortion characteristic can be corrected by performing scanning exposure in the state where the reticle R and the wafer W are infinitesimally rotated relatively from the initial state. Additionally, for the dynamic distortion characteristic shown in FIG. 16B, a correction can be also made by infinitesimally tilting the lens system G2, the astigmatism/coma correction plate G3, the image distortion correction plate G1, the reticle R, or the wafer W relatively to the plane vertical to the optical axis AX of the projection lens system PL, except for correcting the characteristic of the projection optical system PL itself with the surface configuration of the correction plate G1.

Furthermore, for the dynamic distortion characteristic shown in FIG. 16C, a correction can be made both by infinitesimally tilting the lens system G2, the astigmatism/coma correction plate G3, the image distortion correction plate G1, the reticle R, or the wafer W similar to FIG. 16B, and by adjusting the magnification with the infinitesimal parallel translation toward the direction of the optical axis AX of the lens system G or with the pressure control of the air chamber within the projection optical system PL, except for correcting the characteristic of the projection optical system PL itself with the plane shape of the correction plate G1.

Still further, if each dynamic image distortion vector VP(Xi) tends to be random as shown in FIG. 16D, a means is taken to correct the characteristic of the projection optical system PL itself with the surface configuration of the correction plate G1. The random distortion characteristics shown in FIG. 16D are also superposed on and emerge as the distortion characteristics which can be function-approximated as shown in FIGS. 16A through 16C. Therefore, even if the distortion components which can be function-approximated are corrected, the random distortion components still remain. Accordingly, it is desirable that the distortion correction with the surface configuration process of the correction plate G1 is made mainly for the random component of the dynamic distortion characteristic.

Figure 17A:
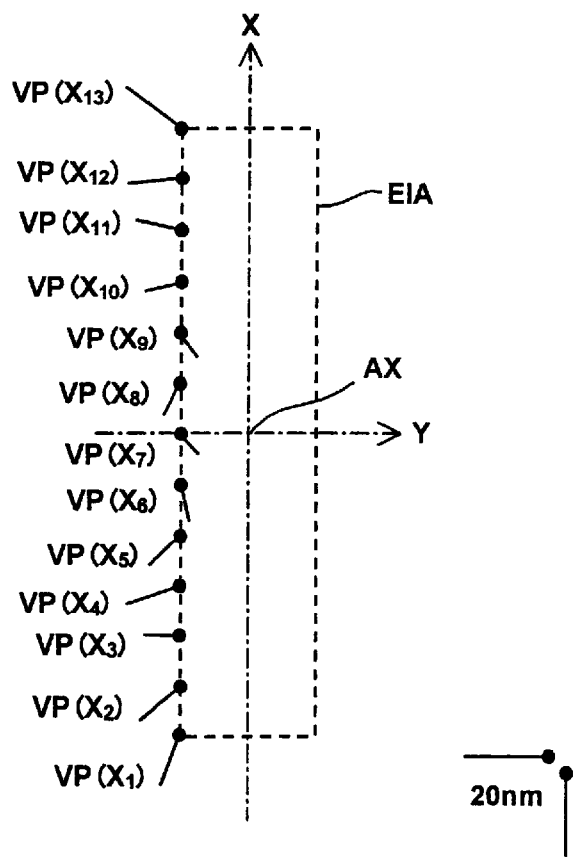
FIG. 17A is a schematic explaining the case where a dynamic image distortion vector which occurs at random is corrected to be approximated to a predetermined function (before correction)
Figure 17B:
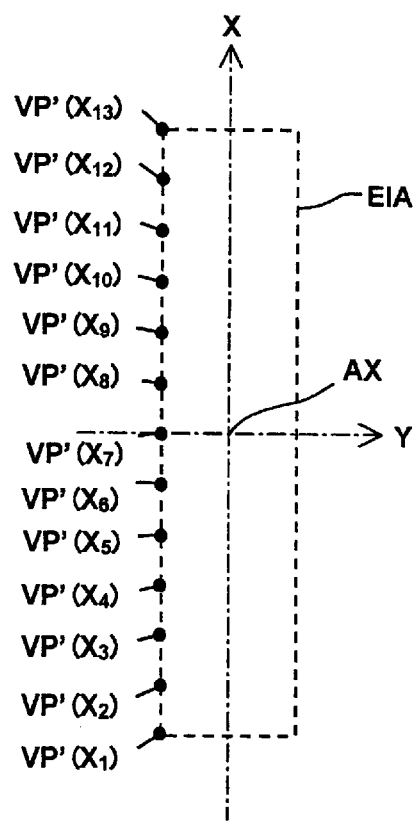
FIG. 17B is a schematic explaining the case where a dynamic image distortion vector which occurs at random is corrected to be approximated to a predetermined function (after correction)

Hence, the method for manufacturing the image distortion correction plate G1 preferable for correcting the dynamic random distortion characteristics shown in FIG. 16D is explained by referring to FIGS. 17A, 17B, 18 and 19. FIG. 17A exemplifies the random distortion characteristics VP(X1) to VP(X13) measured in the state where an image distortion correction plate G1 yet to be processed is arranged in a predetermined position in the image formation optical path by the projection optical system PL. FIG. 17B exemplifies the dynamic distortion characteristics VP'(X1) to VP'(X13) after the characteristics shown in FIG. 17A are corrected with the image distortion correction plate G1.

As the correction for random distortion characteristics, there are two ways of thinking: the method (zero correction) for reducing to "0" as close as possible each of the dynamic image distortion vectors VP(X1) to VP(X13) at the respective accumulation image points existing in sequence in the non-scanning (X) direction as shown in FIG. 17A; and the method (function correction) for approximating each of the image distortion vectors VP(X1) and VP(X13) to a certain tendency of a linear, a quadratic function, etc.

Here, the function correction method shown in FIG. 17B is assumed to be adopted to obtain the advantage that the polishing process of the image distortion correction plate G1 is relatively facilitated. However, if the image distortion vectors VP(X1) to VP(X13) are not so large, the zero correction may be applied to reduce the random dynamic distortion characteristics to "0". Whichever method is adopted, the posture (especially, the tilt) of a processed image distortion correction plate G1 must be adjusted by an infinitesimal amount when being re-inserted in the projection optical path.

The distortion characteristics VP'(X1) to VP'(X13) shown in FIG. 17B are, here, corrected to have a predetermined offset amount in the scanning (Y) direction, and to have a constant magnification error in the non-scanning (X) direction at the same time. Both of the offset amount and the magnification error can be approximate to a linear function, and can be sufficiently corrected with another correction mechanism such as the image shift adjustment by an infinitesimal tilt around the X axis of the image distortion correction plate G1, the magnification adjustment by the lens element G2 within the projection optical system PL, etc.

To process the image distortion correction plate G1, the image distortion vectors VP(X1) to VP(X13) causing the dynamic distortion characteristics shown in FIG. 17A must be first measured. There are two types of the measurement method: the offline measurement by test printing (test exposure); and the onbody measurement with the image detector KES securely disposed on the wafer table TB of the projection exposure apparatus shown in FIG. 1.

With the test exposure method, the test marks formed at an ideal lattice point on a test reticle are statically transferred onto the wafer W the flatness of which is strictly managed, the exposed wafer W is conveyed to a measurement device different from the projection exposure apparatus after being developed, and the coordinate positions and the positions deviation amount of the transferred test marks are measured, so that the static image distortion vectors at respective points within the circular field IF or the effective projection area EIA of the projection optical system PL are obtained.

In the meantime, with the method using the space image detector KES, the wafer stage 14 is moved in the X and the Y directions to scan the image of test marks formed at each ideal lattice point on a test reticle with the knife-edge of the image detector KES while projecting the images with an illumination light for exposure, and the waveform of the photoelectric signal output from the image detector KES at that time is analyzed, so that static image distortion vectors are obtained.

As described above, with the onbody measurement method using the image detector KES, the data of the static image distortion vector at each ideal lattice point within the circular field IF or the effective projection area EIA are sequentially stored in the storage medium of the main control system 32 shown in FIG. 1. Therefore, this method is convenient to the case where the process of the image distortion correction plate G1 is simulated on software by using the stored data or to the case where the image distortion correction plate G1 is actually polished by a processor. Note that the details of the test exposure or the distortion characteristic measurement with the image detector KES will be described later.

When static image distortion vectors are obtained, the dynamic distortion characteristics shown in FIG. 17A are obtained by averaging the image distortion vectors in the Y direction within the rectangular effective projection area EIA by a computer, a workstation, etc. Then, a modification vector (direction and magnitude) $\Delta VP(Xn)$ for each of the image distortion vectors VP(X1) to VP(X13) shown in FIG. 17A is determined, for example, to obtain the dynamic distortion characteristics shown in FIG. 17B. That is, VP'(Xn)=VP(Xn)−$\Delta VP(Xn)$ ("n" is any of integers 1 to 13) determines the modification vector $\Delta VP(Xn)$.

Next, how to correct the static image distortion vector DV(i,pj) is determined for each point in the non-scanning (X) direction based on the modification vector $\Delta VP(Xn)$. Various methods may be considered for this determination. Here, a correction is first made to the largest of the static image distortion vectors DV(i,p1) to DV(i,7) at seven points, which are shown in FIG. 15 and averaged in the Y direction, and the correction is made also to the image distortion vectors DV(i,pj) at the other points if the correction amount at the one point exceeds a predetermined tolerable value.

Figure 18:
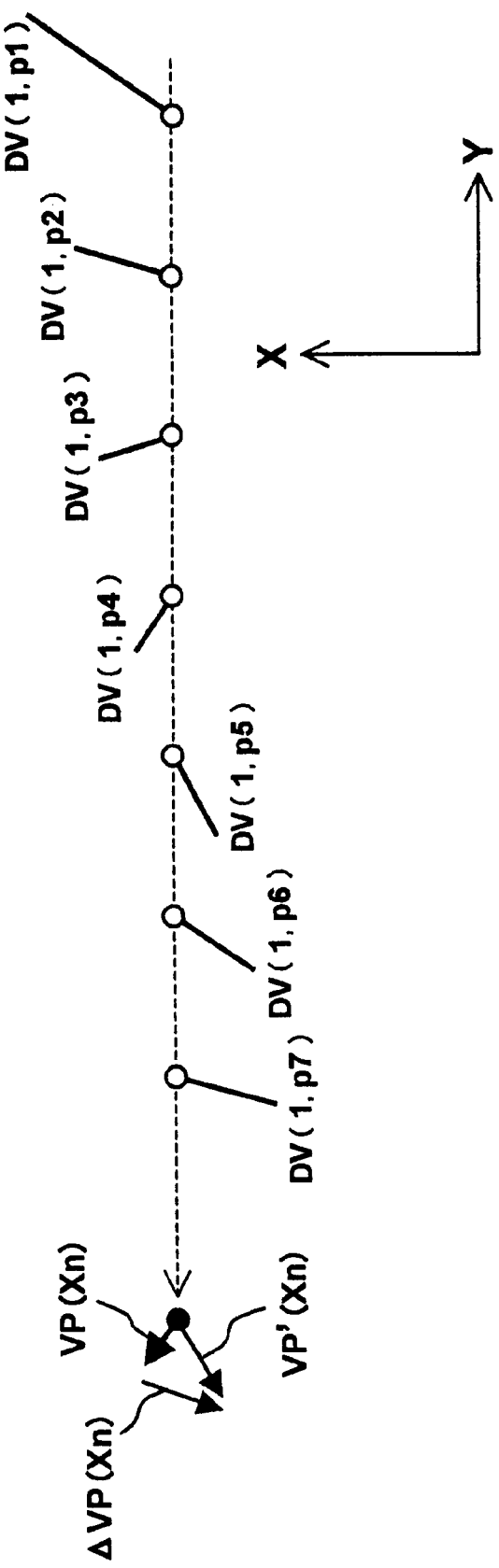
FIG. 18 is a schematic explaining how to obtain a correction vector for correcting a dynamic image distortion vector.

FIG. 18 exemplifies the image distortion vectors DV(i,p1) to DV(i,p7) at the seven points, which exist in sequence in the Y (scanning) direction within the rectangular effective projection area EIA, and the dynamic image distortion vector VP(Xn) obtained by averaging these vectors, wherein "n" and "i" are integer 1. In this figure, the target image distortion vector is VP'(Xn), while the modification vector is $\Delta VP(Xn)$. For the distortion characteristics shown in FIG. 18, the correction based on the modification vector $\Delta VP(Xn)$ is made mainly to the static image distortion vector DV(i,p1) at the point (i,p1). However, the correction is made also to the static image distortion vector DV(i,p2) at the point (i,p2) as the case may be.

Specifically, the correction is made so that the absolute value of the image distortion vector DV(i,p7) or DV(i,p6) is reduced, and at the same time, its directionality is infinitesimally changed. To implement this, the condition of the surface of the image distortion correction plate G1 which infinitesimally deflects the principal ray passing through the measurement point (ideal lattice point) within the projection field, at which the image distortion vector DV(i,p1) or DV(i,p2) is observed, may be determined. This determining way is briefly explained by referring to FIGS. 19 and 20.

Figure 19:
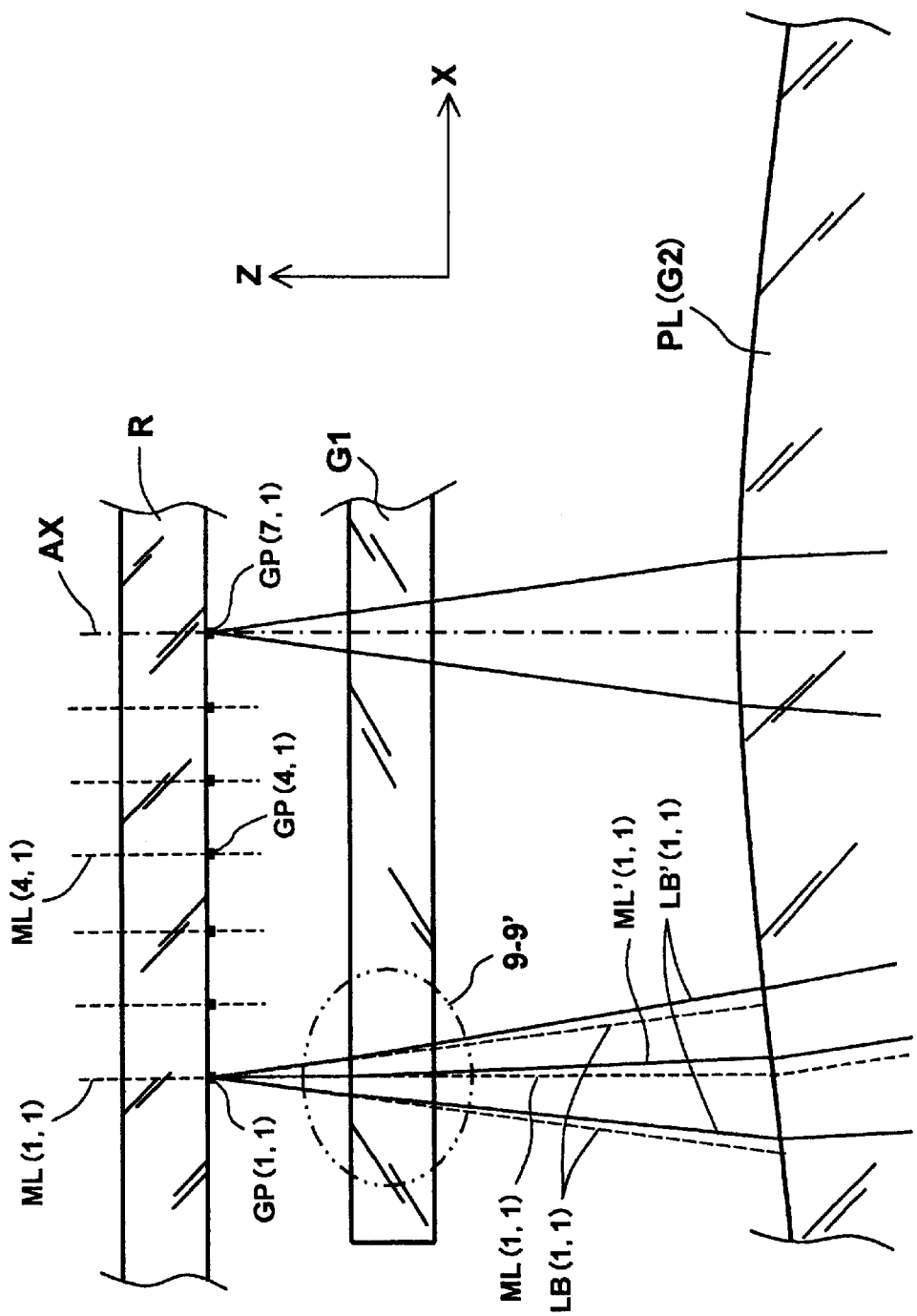
FIG. 19 is a partially enlarged view explaining the correction of image formation luminous flux by an image distortion correction plate.

FIG. 19 is an enlarged view partially showing the positional relationship between the reticle R, the image distortion correction plate G1, and the projection optical system PL (movable lens element G2). Here, the first line in the Y direction among the plurality of lattice points GP(Xi,Yj) arranged in the rectangular projection area EIA in FIG. 15 is cross-sectioned in the X direction. Accordingly, the direction of scan-exposure in FIG. 19 is the direction vertical to the sheet of this figure.

In FIG. 19, a test mark (vernier pattern for measurement, etc.) is formed at each position of an ideal lattice point on the pattern surface of the reticle R. Here, assume that a correction is made by locally polishing a corresponding surface portion 9–9' of the image distortion correction plate G1 for the image luminous flux LB(1,1) which originates from the test mark at the lattice point GP(1,1) in the line SL1, where the image distortion vector DV(i,p1) shown in FIG. 18 occurs, and enters the projection optical system PL, and for its principal ray ML(1,1).

To be more specific, the principal ray ML(1,1) is converted into a principal ray ML'(1,1) which is tilted by an infinitesimal amount in a predetermined direction by the local slope of the surface portion 9–9' in order to reduce the image distortion vector DV(i,p1) in FIG. 18. At this time, also the image luminous flux LB(1,1) from the lattice point GP(1,1) is converted into image luminous flux LB'(1,1) which is tilted by the infinitesimal amount by the local slope of the wavelength order of the surface portion 9–9'. Also the principal rays passing through the lattice points GP(2,1) to G(7,1) among the other ideal lattice points GP(2,1) to GP(13,1) on the reticle R are indicated by broken lines. However, the correction is not made to these principal rays and image luminous flux here.

Figure 20:
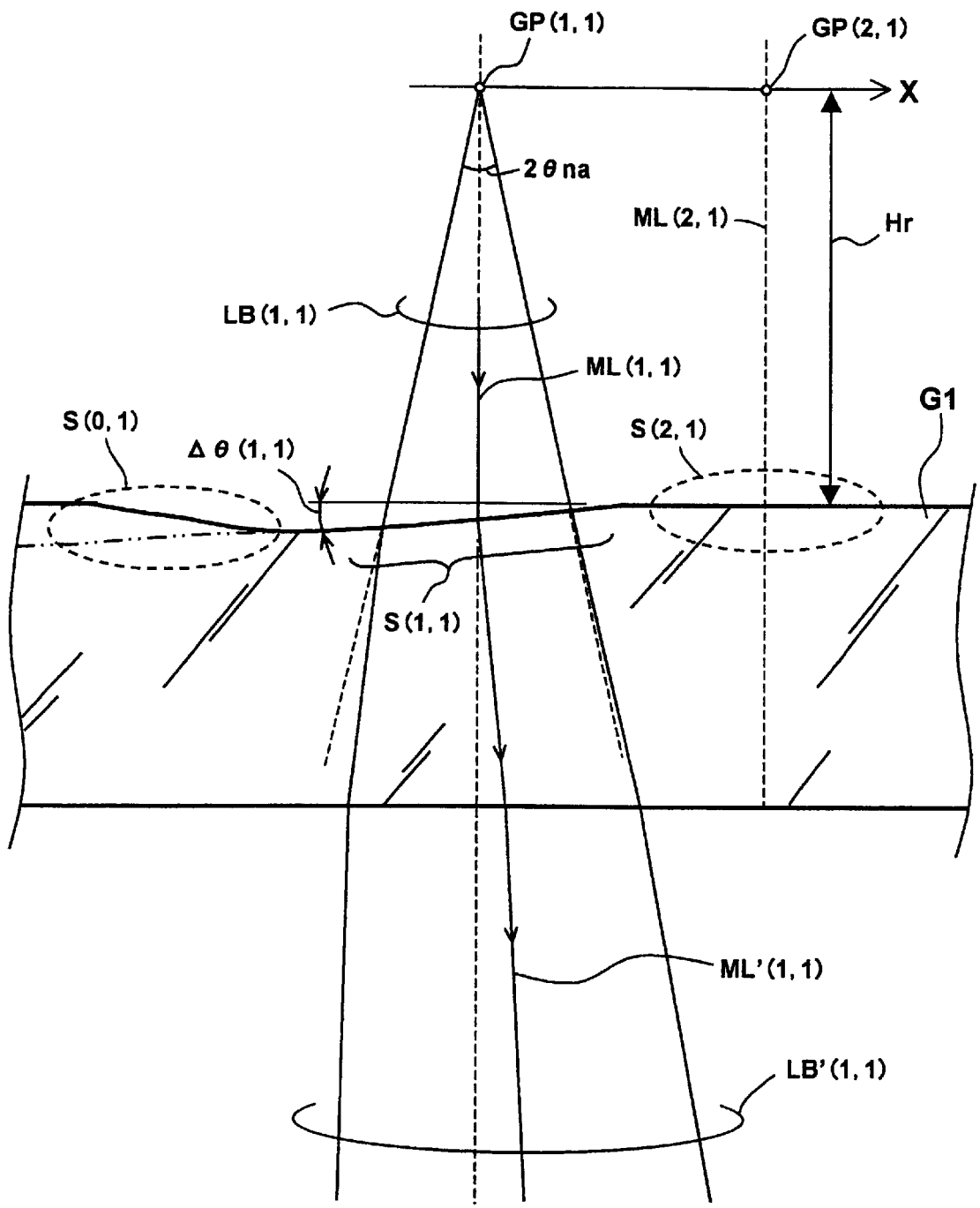
FIG. 20 is an enlarged partially sectional view which exaggeratingly shows the state where the surface of the image distortion correction plate shown in FIG. 19 is locally polished.

FIG. 20 is an enlarged view of the local surface portion 9–9' of the image distortion correction plate G1 shown in FIG. 19, and exaggeratingly illustrates the tilt amount of the local slope formed in the surface portion 9–9' for ease of explanation. As explained in FIG. 19, on the image distortion correction plate G1, the taper is formed in the portion S(1,1), through which the principal ray ML(1,1) and the image luminous flux LB(1,1) from the ideal lattice point GP(1,1) on the reticle R pass, by the tilt amount Δθ(1,1) according to the tilts of the principal ray ML'(1,1) and the image luminous flux LB'(1,1) to be corrected.

As explained earlier by referring to FIG. 18, the static image distortion vector DV(1,p1) occurring at the lattice point GP(1,1) must be corrected to be reduced in a negative direction in each of the X and the Y directions. Actually, therefore, also the surface of the portion S(1,1) shown in FIG. 20 is infinitesimally tilted both in the X and the Y directions. Additionally, the square of the polishing portion S(1,1) or its size in the X and the Y directions on the image distortion correction plate G1 is determined, ideally, in consideration of a spread angle 2θna of the image luminous flux LB(1,1), which contributes to the projection exposure, so that the image luminous flux LB(1,1) is almost entirely covered.

In an actual projection optical system PL, the numerical aperture (NAw) on the wafer W side is expected to be 0.6 to 0.8 or so. If the projection magnification is reduced to one-fourth, the numerical aperture NAr on the reticle R side decreases to 0.15 to 0.2 or so. Since the numerical aperture NAr on the reticle side and the spread angle 2θna in FIG. 20 have a relationship of NAr=sin(θna), the square of the portion S(1,1) to be polished or the size in the X and the Y directions is nonambiguously obtained from the relationship between an interval Hr between the pattern plane (back plane) of the reticle R and the surface plane of the image distortion correction plate G1, and the numerical aperture Nar.

Here, it is assumed that the correction is not made to the image distortion vector DV(1,p6) due to the image luminous flux including the principal ray ML(2,1) from the lattice point GP(2,1) positioned next to the ideal lattice point GP(1,1) in the X direction. Therefore, the portion S(2,1) corresponding to the image luminous flux from the lattice point GP(2,1) on the image distortion correction plate G1 is polished to remain parallel, as a matter of course.

Additionally, the portion S(0,1) at the left of the polished portion S(1,1) is polished to be a slope which rises to the left to revert to the original parallel plane. However, this portion may be loosely joined with the surface of the portion S(1,1) in some cases depending on whether or not the image luminous flux passing through the portion S(0,1) exists or whether or not the principal ray is corrected, as represented by an imaginary line. Furthermore, the parallel plane, which is the surface of the non-polished portion, of the image distortion correction plate G1 is arranged vertically to the optical axis AX of the projection optical system PL in FIGS. 19 and 20. However, if the entire image distortion correction plate G1 itself is infinitesimally inclined by the adjustment mechanism, the distortion characteristic (static image distortion vector) emerging on the projection image plane side can be infinitesimally shifted in the X or the Y direction.

With the above described methods shown in FIGS. 19 and 20, the surface of the image distortion correction plate G1 is polished to be locally tilted along each of the 13 lines SL1 to SL13 existing in sequence in the non-scanning direction so that the random distortion characteristic shown in FIG. 17A changes to the regular distortion characteristic shown in FIG. 17B.

Figure 21:
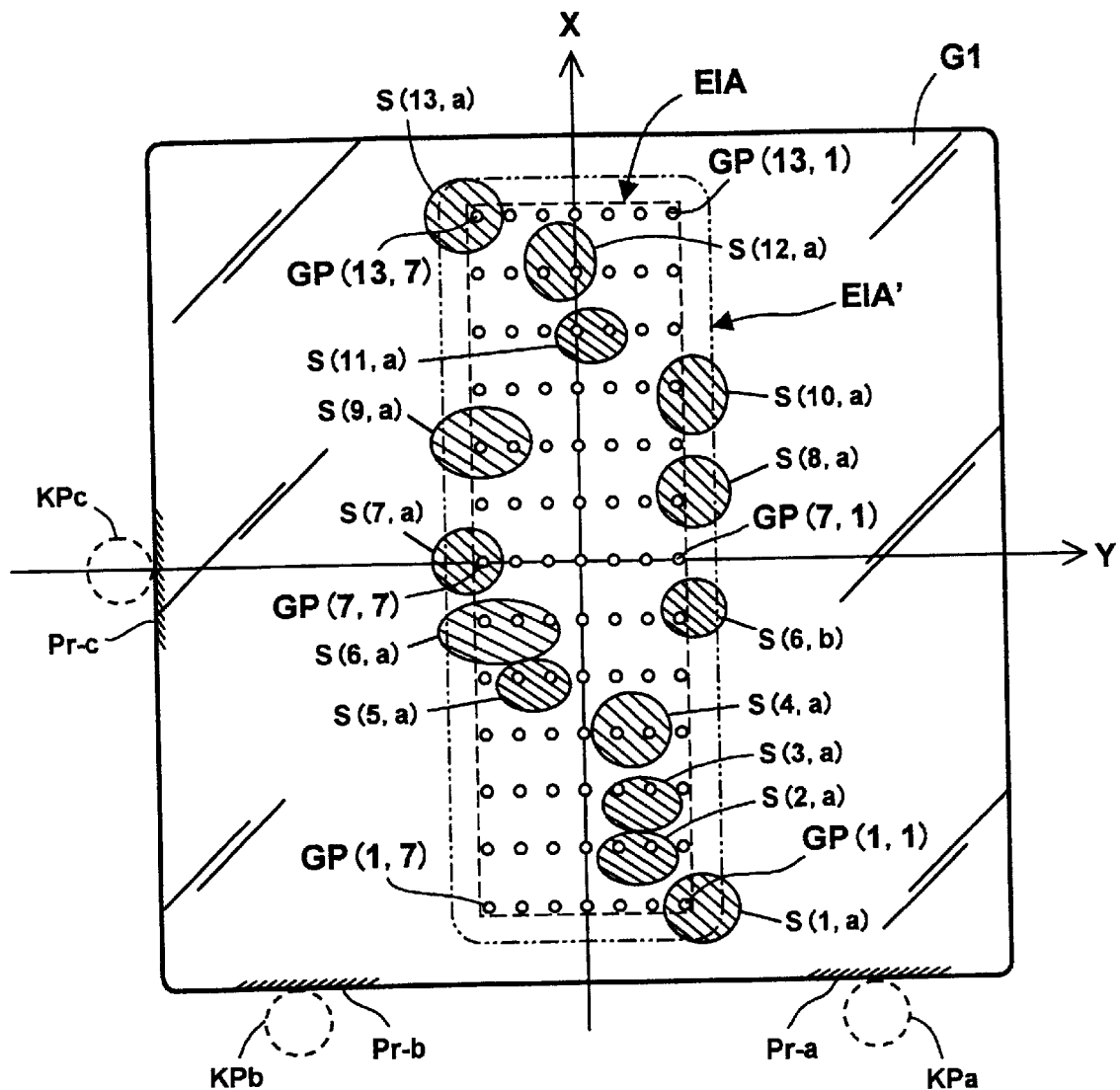
FIG. 21 is a plan view illustratively exemplifying the distribution state of locally polished areas on the image distortion correction plate which is finally polished.

FIG. 21 is a plan view of the image distortion correction plate G1 manufactured by performing such a polishing process. In this embodiment, the entire shape of the image distortion correction plate G1 is set to be a square similar to the reticle R. This is because the blanks (preform) of the reticle R, which is manufactured by strictly managing the precision, the flatness degree, etc., can be used unchanged for the image distortion correction plate G1. Needless to say, dedicated blanks both sides of which are particularly polished may be used.

In FIG. 21, the rectangular effective projection area EIA and its internal 13×7 points are the same as those shown in FIG. 15. This figure assumes that the ideal lattice points positioned at the four corners among the 13×7 points are GP(1,1), (1,7), (13,1), and (13,7), and the ideal lattice points positioned at both ends of the Y axis are GP(7,1) and (7,7). The area EIA' spreading almost with a constant width outside the effective projection area EIA represents the spread portion of the image luminous flux reaching the image distortion correction plate G1, which accompanies the numerical aperture NAr from the point positioned at the circumference of the projection area EIA on the reticle R.

In FIG. 21, each of shaded areas which are represented by circles or ellipses for the sake of convenience S(1,a), S(2,a), S(3,a), S(4,a), S(5,a), S(6,a), S(7,a), S(8,a), S(9,a), S(10,a), S(11,a), S(12,a), and S(13,a) is a portion where a static image distortion vector is corrected by the polishing process shown in FIG. 20. The area S(1,a) among the areas S(i,a) and S(i,b) is equivalent to the above described polishing area S(1,1) shown in FIG. 20.

As shown in FIG. 21, the polishing process for correcting the static image distortion vector VD(i,j) is basically performed for any one point on the segments (scanning lines SL1 to S13 shown in FIG. 15) which link the seven lattice points existing in sequence in the scanning (Y) direction. However, a polishing area (taper portion) may be set in a plurality of portions in one scanning line like the areas S(6,a) and S(6,b) in FIG. 21, if the correction amount (the tilt amount by polishing) at one point becomes too large, or depending on the directionality of the image distortion vector to be modified.

Additionally, the square of each of the polishing areas S(i,a) and S(i,b) or the taper amount and its tilt direction are determined with the method explained in FIGS. 19 and 20. The plane which joins adjacent polishing ares is polished to be smooth between the polishing areas. Furthermore, in FIG. 21, the polishing areas S(i,a) and S(i,b) are comparatively set apart. Such an apart setting is advantageous to the polishing process.

The reason is as follows: assuming that the tilt directions of the polishing areas S(2,a) and (S3,a) which are adjacent each other in FIG. 21 are calculated to be almost the same, a relatively acute reverse taper occurs at the boundary between the two polishing areas S(2,a) and S(3,a). Such a reverse taper gives the correction component the direction of which is reverse to the originally intended image distortion vector correction, which also leads to the deterioration of the image quality of a projected reticle pattern.

Accordingly, if polishing areas which are adjacent in the Y direction on the image distortion correction plate G1 have the same tilt direction on the image distortion correction plate G1, it is good to again review the static image distortion vector DV(i,j) selected to put the above described dynamic distortion characteristic shown in FIG. 17A into the desired state shown in FIG. 17B, and to shift both of the polishing areas in the X direction.

As described above, unlike the distortion characteristic correction assuming static exposure, the static distortion characteristic correction assuming scan-exposure allows the polishing areas S(i,a) and S(i,b) on the image distortion correction plate G1 to scatter, which leads to the advantage that the precision of the polishing process (especially, plane joining) can be relatively made moderate. This inversely means that the plane shapes of the specified polishing areas S(i,a) and S(i,b) can be precisely processed regardless of the plane shapes of the peripheral polishing areas.

In the meantime, the blanks for the image distortion correction plate G1 shown in FIG. 21 is set on the X-Y stage of a dedicated polishing processor, precisely moved in the X and the Y directions relatively to a rotary polishing head, and polished by pressing the rotary polishing head into a desired polishing area at a calculated tilt angle with a predetermined force. In this case, the image distortion correction plate G1 after being processed must be accurately aligned with the positions of the respective ideal lattice points within the projection field. Therefore, reference edges Pr-a, Pr-b, and Pr-c respectively contacting reference pins (rollers) KPa, KPb, and KPc arranged on the X-Y stage of the polishing processor or the support frame of the correction plate G1 within the projection exposure apparatus, on one side of the circumference of the image distortion correction plate G1, which is parallel to the Y axis, and on one side parallel to the X axis.

Figure 22:
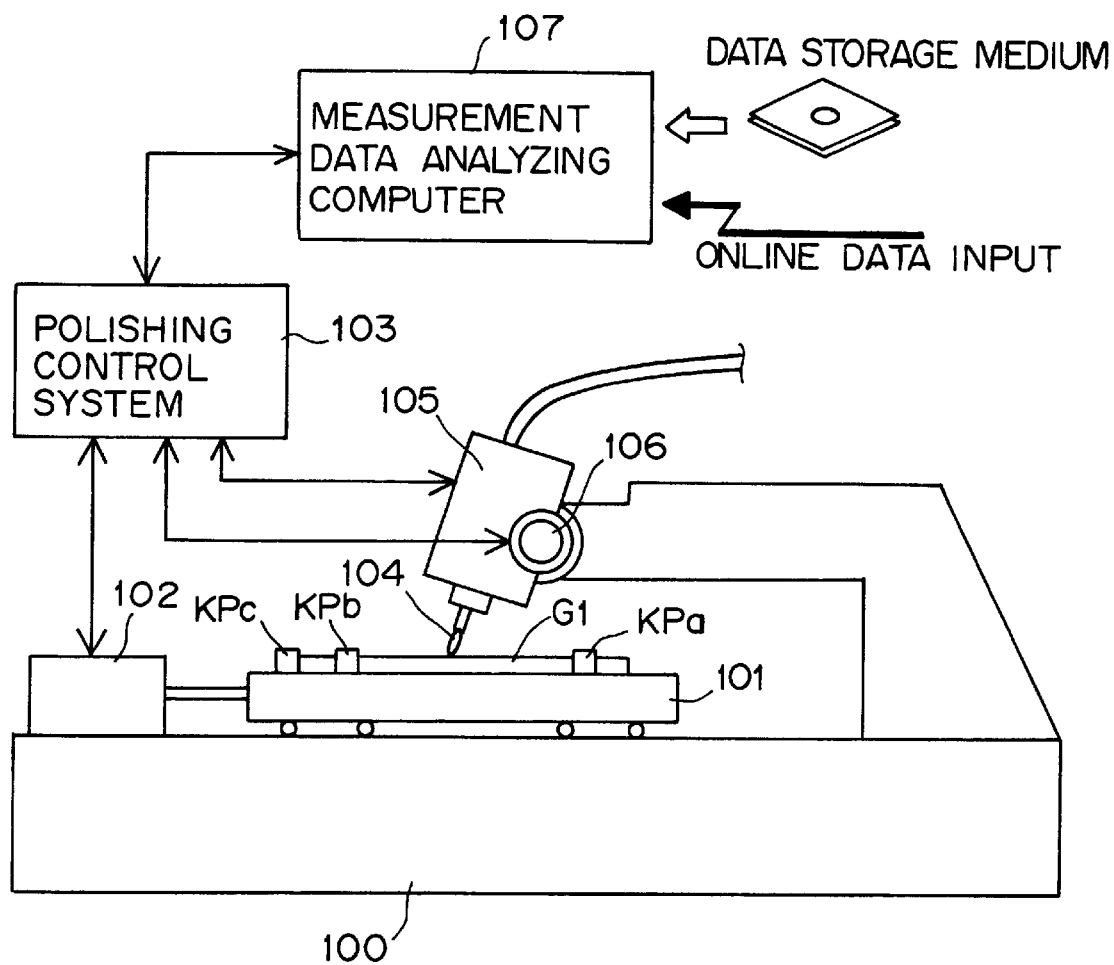
FIG. 22 is a schematic showing the simplified configuration of a polishing processor preferable for polishing the image distortion correction plate shown in FIG. 21.

Here, one specific example of the polishing processor is explained by referring to FIG. 22, although this is also disclosed by the Japanese Unexamined Patent Publication No. 8-203805. In FIG. 22, the blanks of the image distortion correction plate G1 is mounted on a X-Y stage 101 which can move on the main body of the polishing processor in the X and the Y directions and is aligned by the reference pins KPa, KPb, and KPc. The X-Y stage 101 is moved by a driving mechanism 102, which is driven by the instruction from a polishing control system 103.

The polishing control system 103 also controls the rotation of the rotary polishing head 104 attached to the tip of a polishing unit 105, and an angle adjusting unit 106 which adjusts the angle at which the tip of the head 104 and the blanks (G1) contact. The polishing control system 103 receives respective items of information such as the move position of the X-Y stage 101 and its moving speed during polishing, and the rotation speed and the pressing force of the rotary polishing head 104, the contact angle of the head 104, etc., which are analyzed by an analyzing computer 107 based on the distortion characteristic measurement data from a data storage medium (disk, tape, card, etc.) or an online communication.

The above described polishing processor is arranged in the site where a projection exposure apparatus is assembled and manufactured, and is used at the step where the final image formation performance of the apparatus is examined and adjusted. As a matter of course, the polishing processor shown in FIG. 22 may be used on the assembly and manufacturing line of the projection optical system PL. In such a case, the image formation characteristic of the projection optical system PL which is simplex before being installed within the main body of the exposure apparatus can be corrected with the correction plate G1. However, the image formation characteristic in the simplex state of the projection optical system PL may be slightly different from that in the state where the projection optical system PL is installed within the main body of the apparatus. Accordingly, it is desirable to process the image distortion correction plate G1 with the polishing processor shown in FIG. 22 based on the result (distortion characteristic) of examining the image formation characteristic by using the illumination system of the exposure apparatus itself after the projection optical system PL is installed within the exposure apparatus.

Notice that the polishing processor shown in FIG. 22 may be used for performing an aspheric process intended to correct the above described telecentric error for a particular lens element included in the condenser lens systems 7K and 7Q shown in FIG. 1.

Meanwhile, the analyzing computer 107 of the polishing processor makes, for example, the determination of the respective polishing areas on the blanks of the image distortion correction plate G1 shown in FIG. 21, the determination of the surface configuration (mainly, the angle and the direction of the inclination) in the respective polishing areas, etc. based on measured static or dynamic distortion characteristics.

At that time, the program which simulates the final state of the polishing process based on the various measured distortion characteristic data and which is stored in the storing unit of the analyzing computer 107 is performed, and the result of the simulation is made visible on a display for an operator. In this way, the operator can verify the simulated state and condition of the polishing process on the display, and he or she can set an optimum process state by precisely changing and editing various parameters.

Figure 23:
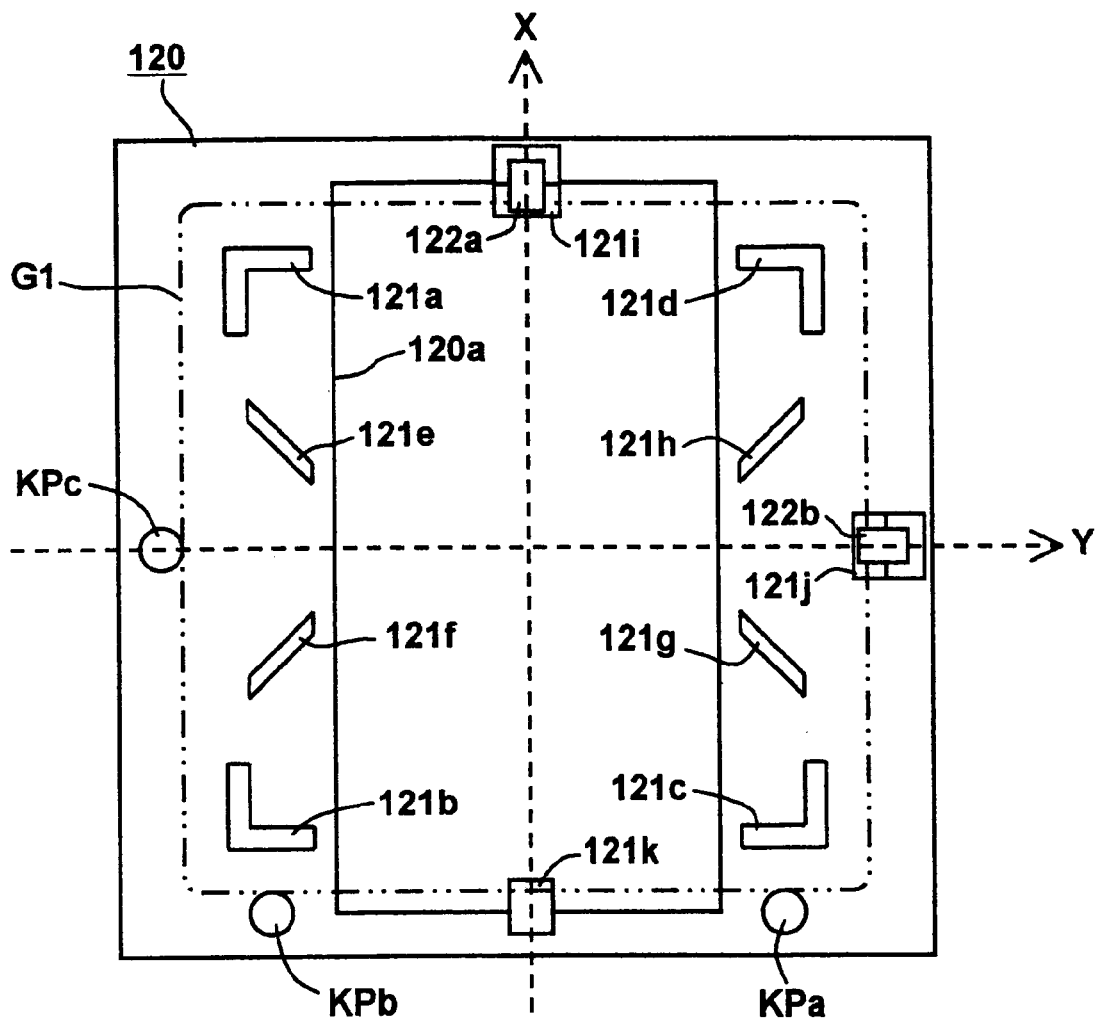
FIG. 23 is a plan view showing the configuration of a support plate on which the image distortion correction plate shown in FIG. 21 is mounted.

Thus manufactured image distortion correction plate G1 is securely disposed on a support frame 120 shown in FIG. 23. On the support frame 120, a rectangular aperture 120a which does not shade the image formation luminous flux passing through the effective projection area EIA is formed, and a plurality of convex units 121a to 121k that support the bottom of the image distortion correction plate G1 are formed in the periphery of the aperture 120a.

The convex units 121a to 121d support almost four corners of the image distortion correction plate G1. The convex units 121e to 121h support the correction plate G1 in the neighborhood of the center of the aperture 120a. The convex units 121i and 121j respectively support the centers of the right edge and the top edge of the correction plate G1. The convex unit 121k supports the center of the bottom edge of the correction plate G1. With these convex units 121a to 121k, the image distortion correction plate G1 is mounted on the support frame 120 so that its flexure is minimized.

Additionally, on the support frame 120, two reference rollers KPa and KPb contacting the reference side at the bottom of the image distortion correction plate G1, and one reference roller KPc contacting the reference side of the left of the image distortion correction plate G1 are arranged to be rotatable. The image distortion correction plate G1 is pressed toward the directions of the reference rollers KPa, KPb, and KPc by pressing elements 122a and 122b that are arranged to be slidable respectively in the X and the Y directions on the top of the convex units 121i and 121j on the support frame 120. Note that an elastic member (leaf-spring, spring, etc.) for pressing the image distortion correction plate with a predetermined force against each of the convex units on the support frame 120 is arranged in the upper space in the periphery of the image distortion correction plate G, although this is not shown in this figure.

Figure 24:
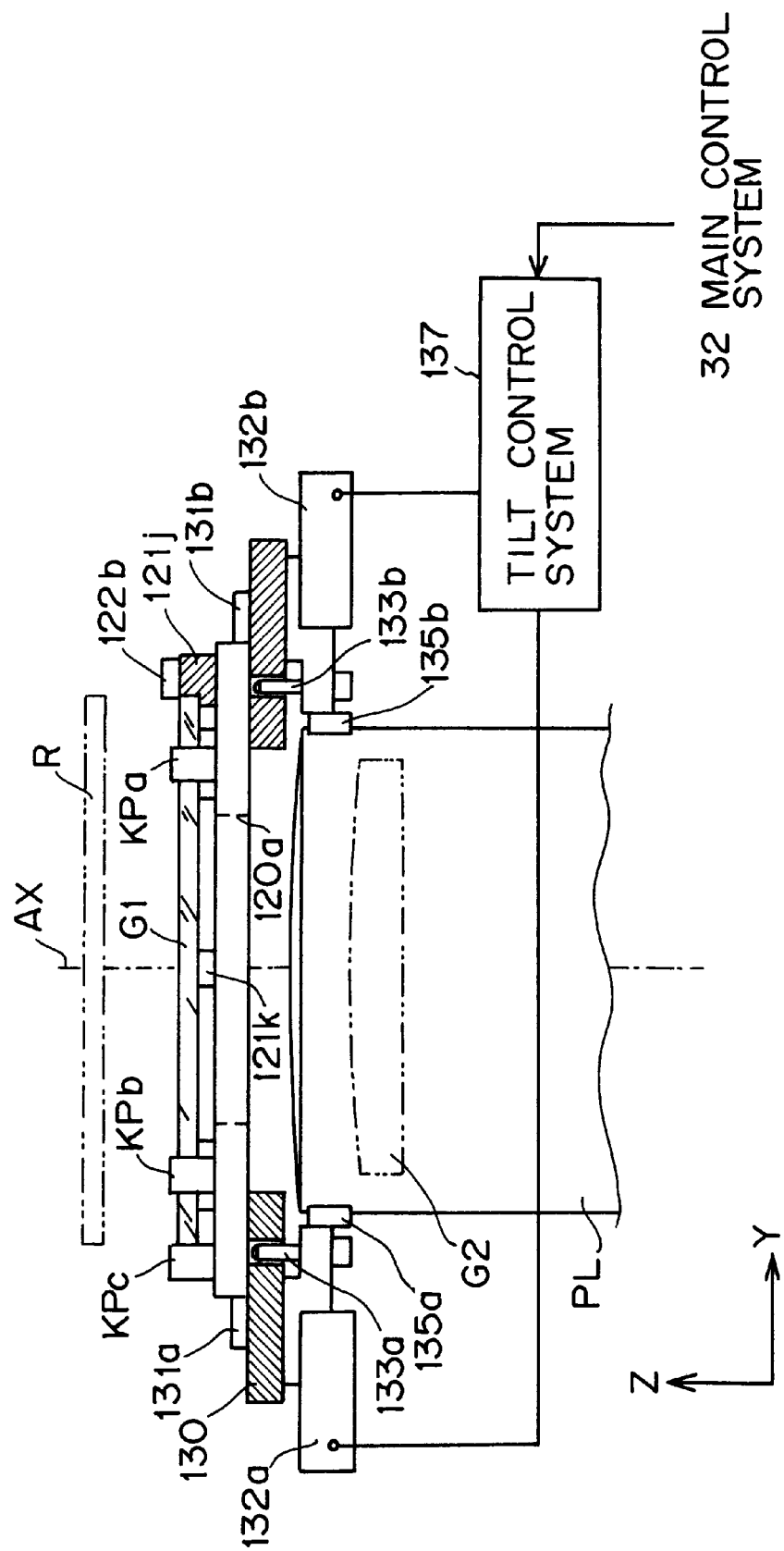
FIG. 24 is a partially sectional view showing the state of the image distortion correction plate inserted in the optical path of the projection optical system of the projection exposure apparatus along with the support plate shown in FIG. 23, and its holding structure.

The support frame 120 shown in FIG. 23 is mounted on a support frame holding member 130 shown in FIG. 24. FIG. 24 is a partial sectional view showing the structure of the upper portion of the projection optical system PL. The holding member 130 is fixed via a plurality of spacers 135a and 135b not to move in the upward/downward direction (Z direction) and the X and the Y directions from the top of the lens barrel of the projection optical system PL.

Furthermore, on the holding member 130, an aperture which does not shade the field of the projection optical system PL is formed, and a plurality of reference members 131a and 131b which align the support frame 120 in the X, Y, and e directions are arranged on its upper surface. Still further, upward/downward driving elements 133a, 133b, and 133c (133c is not shown in the figure), which are implemented by a direct-acting piston or piezo element, etc. and are intended for infinitesimally tilting the support frame 120 against the X-Y plane, and driving units 132a, 132b, and 132c (132c is not shown in the figure) which drive the respective driving elements 133a, 133b (and 133c) are arranged in three locations under the holding member 130.

Each of the driving units 132a, 132b (and 132c) moves each of the driving elements 133a, 133b (and 133C) upward and downward by an optimum amount in response to the control instruction from a tilt control system 137, and tilts the support frame 120, that is, the image distortion correction plate G1 by a predetermined amount in a predetermined direction. The tilt direction and amount are determined by the main control system 32 based on preset information prestored in the main control system 32 shown in FIG. 1, or the result of the re-measurement of the distortion characteristic after the image distortion correction plate G1 is installed. Additionally, the driving elements 133a and 133b (133c) in the three locations are arranged on the circumference having a predetermined radius with the optical axis of the projection optical system P1 as its center at an angle of approximately 120°, viewing on the X-Y plane. By simultaneously moving the driving elements 133a, 133b (and 133c) upward and downward, also the interval ("Hr" shown in FIG. 20) between the image distortion correction plate G1 and the reticle R can be adjusted.

The lens element G2 within the projection optical system PL, which is shown in FIG. 24, is arranged to be movable upward and downward along the optical axis AX of the projection optical system PL or to be tiltable also as shown in FIG. 1, and can correct the magnification error of an image projected onto the wafer W and a symmetrical distortion aberration (a spool-shaped, a barrel-shaped, a trapezoid-shaped distortion, etc.), which occurs within the entire effective projection area EIA.

When thus polished image distortion correction plate G1 is put back in the initial position in the projection optical path, that is, the arrangement position where the distortion characteristics before the polishing process are measured, the distortion characteristics are re-measured using the test reticle and it is examined whether or not the dynamic distortion characteristics become those shown in FIG. 17B.

Note that, however, the distortion components which can be function-approximated are superposed in the above example of FIG. 17B as stated above. Therefore, the distortion components which can be function-approximated must be finally reduced almost to "0" with the infinitesimal adjustment of the magnification by the tilt of the image distortion correction plate G1, by the upward/downward movement or the infinitesimal tilt of the lens element G2, or by the pressure control. Then, how much the dynamic distortion characteristic that is re-measured after being reduced to "0" includes a random component is examined. If the random component is within the standard range, the sequence of the manufacturing process of the image distortion correction plate G1 is completed.

In the meantime, the random component included in the dynamic distortion characteristic is not within the standard value, simulation is again performed by using the computer 107 shown in FIG. 22 based on the data of the re-measured distortion error, and the image distortion correction plate G1 is again polished depending on need.

As described above, in this embodiment, attention is paid not to the static distortion characteristic (distortion aberration characteristic) within the effective projection area EIA at the time of scan-exposure, but to the dynamic distortion characteristic caused by the accumulation (averaging) over the width of the scanning direction of the projection area EIA, and the image distortion correction plate G1 is polished to correct mainly the random component included in the dynamic distortion characteristic. Therefore, compared with the case where the image distortion correction plate G1 is polished to minimize the image distortion vector, for example, at all of the 13×7 ideal lattice points within the effective projection area EIA, the polishing process significantly becomes easier, which leads to an advantage that also the surface joint of the polished areas can be performed with high precision.

Furthermore, in this embodiment, it becomes possible to set the polishing areas on the image distortion plane G1, which are required to implement the state where the dynamic distortion characteristic is reduced to "0" or is approximated to a predetermined function, apart so that unnaturally joined surface portions are reduced in adjacent polishing areas, which leads to the minimization of the deterioration of the local image quality of an image projected by the projection optical system PL.

Notice that, the surface joint means the operations for smoothly joining all the surfaces of a plurality of polished adjacent areas, which are obtained by polishing the respective surfaces under a condition that is slightly modified from a primarily condition determined in a calculation, so that the image distortion vector, which occurs due to the simultaneous passage of the image formation luminous flux from an object point on the reticle R through a plurality of adjacent polished areas, is not unnaturally corrected depending on the position of the object point in the X-Y direction on the reticle R.

The above described embodiment is dedicated to the explanation about the manufacturing and adjustment methods of the image distortion correction plate G1. However, when the image distortion correction plate G1 is manufactured, static distortion errors must be precisely measured at a plurality of ideal lattice points by using a test reticle as described above. The measurement of such distortion characteristics may be made with the method using the image detector KES shown in FIG. 1, other than the method using test printing.

Figure 25:
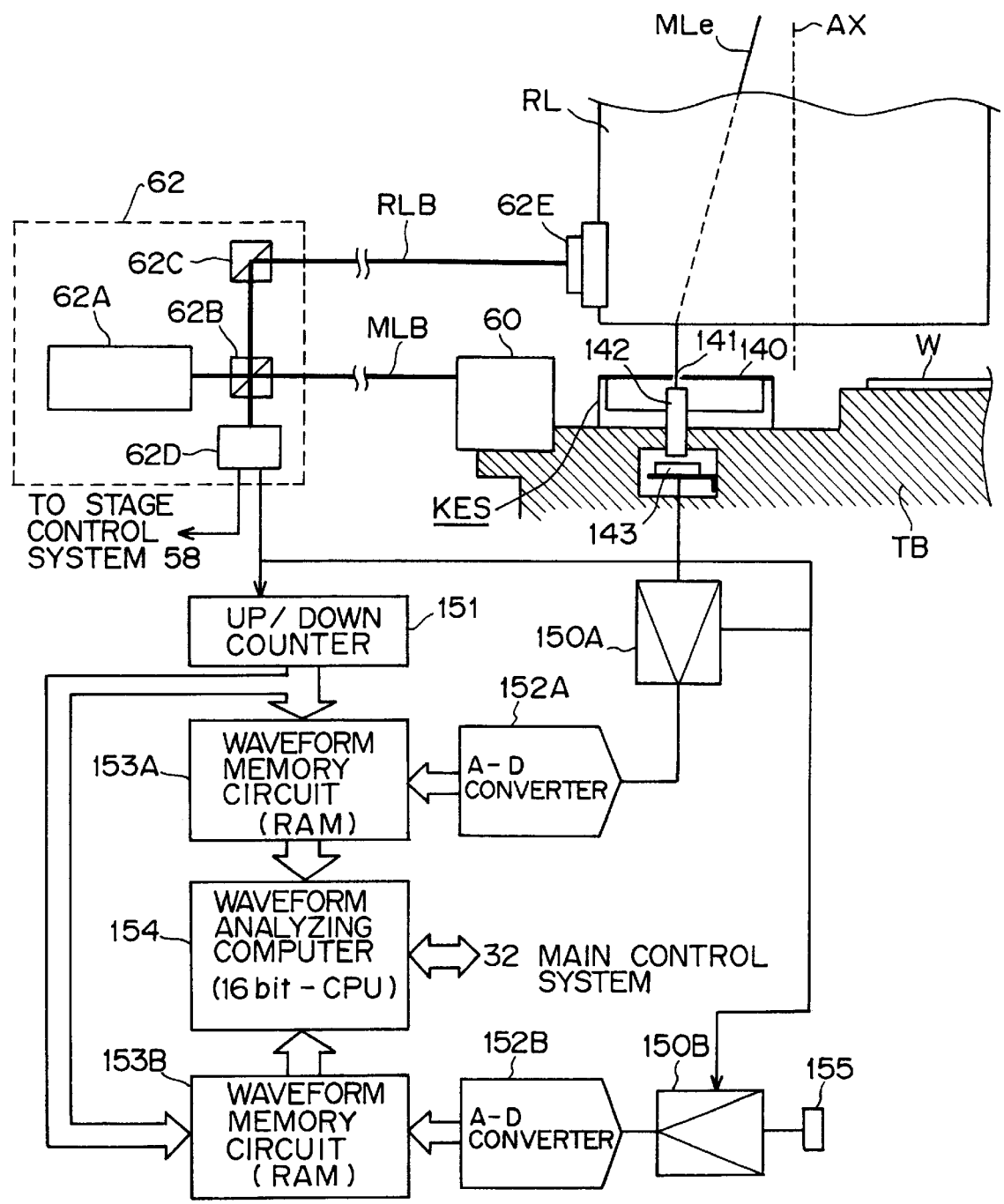
FIG. 25 is a schematic showing the structure of an image detector mounted on the wafer stage of the projection exposure apparatus, and the configuration of its processing circuitry.

Therefore, the distortion measurement using the image detector KES is briefly explained by referring to FIG. 25. FIG. 25 shows the configuration of the image detector KES mounted on the wafer table TB of the exposure apparatus, and the configuration of the signal processing system relating thereto. In this embodiment, the coordinate position of the test pattern image projected from the projection optical system PL is obtained by using the knife-edge measurement method.

In FIG. 25, the image detector KES comprises: a shading plate 140 which is arranged to be almost as tall as (for example, in a range of ±1 mm or so) the surface of the wafer W on the table TB; a rectangular aperture (knife-edge aperture) of approximately several tens to several hundreds of μm, which is formed in a predetermined position on the shading plate 140; a quartz optical pipe 142 into which the image formation luminous flux from the projection optical system PL, which passes through the aperture 141, enters with a large NA (numerical aperture); and a semiconductor reception element (silicon photodiode, PIN photodiode, etc.) 143 which photoelectrically detects the light quantity of the image formation luminous flux transmitted by the optical pipe 142 with almost no loss.

The surface of the image detector KES is set to almost agree with the image formation plane of the projection optical system PL, when the table TB is set in the center of the entire moving stroke (for example, 1 mm) in the Z direction.

In the above described configuration of the image detector KES, the shading plate 140 is configured by coating a chromium layer onto the surface of a quartz or fluorite plate having a high transparency ratio for the light in an ultraviolet range and by forming the aperture 141 in a portion of the chromium layer, while the optical pipe 142 is configured by gathering many quartz optical fibers as a bundle having an entire thickness of approximately several millimeters, or by cutting quartz into a long and thin square pillar the section of which is a square and making its inside into an entire reflection plane.

If the shading plate 10 and the reception element 143 are spatially arranged apart with such an optical pipe 142, the influence on the reception element 143 with the temperature rising of the shading plate 140, which is caused by the irradiation of the image formation luminous flux on the shading plate 140 for a long time, can be reduced. As a result, it becomes possible to keep the temperature of the reception element 143 almost constant, and at the same time, it becomes possible to allow the image formation luminous flux passing through the aperture 141 to be received without any loss.

In the meantime, for the projection image detection using the image detector KES, the laser interferometer 62 shown in FIG. 1 is used. The laser interferometer 62 is configured by a laser beam source 62A the frequency of which is stabilized, beam splitters 62B and 62C which split the laser beam toward a movable mirror 60 fixed on the table TB and a reference mirror 62E fixed to the lower portion of the lens barrel of the projection optical system PL, and a receiver 62D for receiving the beams which are respectively reflected by the movable mirror 60 and the reference mirror 62E and interfere with each other at the beam splitter 62B, etc. as shown in FIG. 25.

The receiver 62D comprises a high-speed digital counter which incrementally counts the move amount of the table TB based on the photoelectric signal according to the change of the fringe of an interfering beam by the resolution of 10 nm, and transmits the digital value counted by the counter to the wafer stage control system 58 shown in FIG. 1 as the coordinate position of the table TB (wafer W) in the X (or Y) direction.

If the illumination light for exposure is obtained from the excimer laser light source 1 as shown in FIGS. 1 and 13, the photoelectric signal from the reception element 143 of the image detector KES becomes a pulsed waveform in response to the pulsed light emission of the excimer laser light source 1. That is, assuming that the image optical path from a certain object point on the test reticle arranged on the object plane of the projection optical system PL is MLe as shown in FIG. 25, the excimer laser light source 1 shown in FIG.1 is made to pulsed-light-emit in the state where the table TB (that is, the wafer stage 14) is aligned in the X and the Y directions in order to make the image optical path MLe agree with the rectangular aperture 141 of the image detector KES, so that also the photoelectric signal from the reception element 143 becomes a pulsed waveform with the time interval of approximately 10 to 20 ns.

Accordingly, the photoelectric signal from the reception element 143 is configured to be input to a sample/hold (hereinafter referred to as S/H) circuit 150A having an amplification operation shown in FIG. 25, and the S/H circuit 150A is configured to be switched between the sample and the hold activities in response to every 1-nm pulse signal for counting, which is generated by a receiver 62E in the laser interferometer 62.

Then, the control system 2 of the excimer laser light source 1 shown in FIG. 1 triggers pulsed light emission according to the coordinate position information transmitted from the laser interferometer 62 to the synchronization control system 66 and the main control system 32 in FIG. 1 via the stage control system 58. Namely, this embodiment is configured so that the pulsed light emission of the excimer laser light source 1 is performed according to the coordinate position of the table TB, and the S/H circuit 150A holds the peak value of the pulse signal waveform from the reception element 143 in synchronization with the pulsed light emission.

The peak value held by the S/H circuit 150A is converted into a digital value by an analog-to-digital (A-D) converter 152A, and the converted digital value is stored in a waveform memory circuit (RAM) 153A. An address when the RAM 153A performs a storage operation is generated by an up/down counter 151 which counts every 10-nm pulse signal for counting transmitted from the laser interferometer 62, and the move position of the table TB and the address when the RAM 153A performs a storage operation are nonambiguously corresponded to each other.

In the meantime, the peak intensity of the pulsed light from the excimer laser light source 1, has a fluctuation of approximately several percent for each pulse. Therefore, in the processing circuit in this embodiment, a photoelectric detector 155 for detecting an intensity is arranged within the illumination optical system (7A to 7Q) shown in FIG. 1 in order to prevent the image measurement accuracy from being deteriorated due to this fluctuation. The photoelectric signal (pulsed waveform) from the photoelectric detector 155 is captured by an S/H circuit 150B, an A-D converter 152B, and a RAM 153B (the address generation at the time of the storage operation is common to that of the RAM 153A), which are respectively equivalent to the above described S/H circuit 150A, the A-D converter 152A, and the RAM 153A.

In this way, the peak intensity of each pulsed light from the excimer laser light source 1 is stored in the RAM 153B in the state where the move position of the table TB and the address at the time of the storage operation of the RAM 153B are nonambigously corresponded.

The photoelectric detector 155 uses the mirror 7J within the illumination optical system shown in FIG. 1 as a partial transparent mirror, and is arranged to receive the pulsed light of approximately 1 to several percent, which passes through the rear side of the mirror 7J through a collective lens. If the photoelectric detector 155 is arranged in such a position, it serves also as a light quantity monitor for controlling the amount of exposure when each shot area on the wafer W is exposed.

As described above, the digital waveform stored in the RAM 153A or 153B is read into a waveform analyzing computer (CPU) 154, and the measured waveform according to the image intensity stored in the RAM 153A is standardized (divided) by the intensity fluctuation waveform of the illumination pulsed light stored in the RAM 153B. The standardized measured waveform is temporarily stored in the memory within the CPU 154, and at the same time, the central position of the image intensity to be measured is obtained by respective types of a waveform processing program.

In this embodiment, a test pattern image on the test reticle is detected with the edge of the aperture 141 of the image detector KES. Therefore, the central position of the image, which is analyzed by the CPU 154, is obtained as the coordinate position of the table TB (wafer stage 14) measured by the laser interferometer 62, when the center of the test pattern image and the edge of the aperture 141 agree with on the X-Y plane.

The information of thus analyzed central position of the test pattern is transmitted to the main control system shown in FIG. 1. The main control system 32 instructs the control system 2 of the excimer laser light source 1 and the wafer stage control system 58 in FIG. 1, and the CPU 154 in FIG. 25 of the operations for sequentially measuring the position of each projection image of the test pattern formed at a plurality of points (for example, ideal lattice points) on the test reticle.

Figure 26:
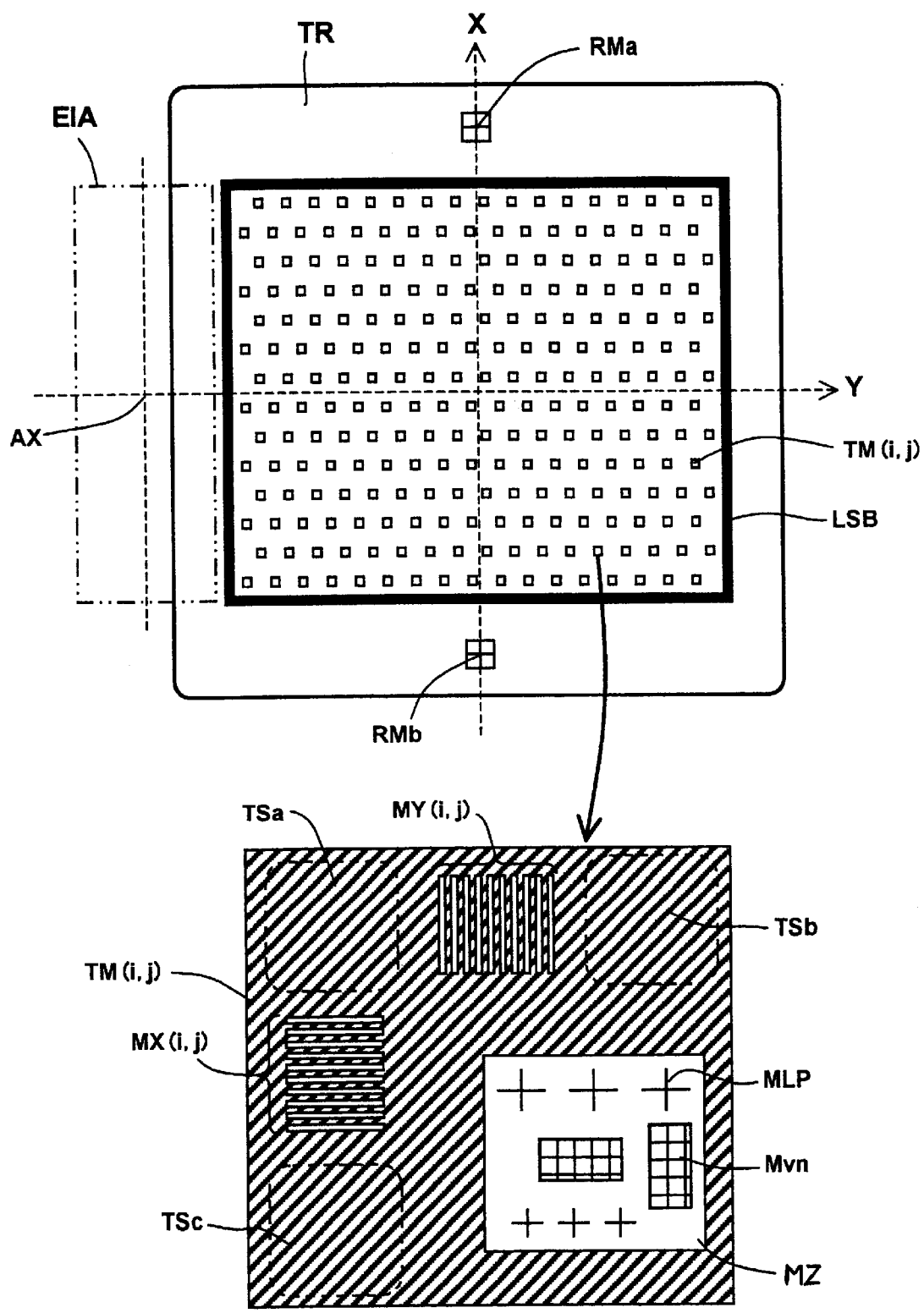
FIG. 26 is plan views showing the configuration of a test reticle on which measurement marks for measuring respective aberration characteristic types are formed, and the state of a measurement pattern group formed within one measurement mark area.

Here, the test reticle TR preferable for this embodiment is briefly explained by referring to FIG. 26. FIG. 26 is a plan view showing the entire pattern layout on the test reticle TR, and assumes that the center of the test reticle TR is the origin of the X-Y coordinate system. The direction of scan-exposure is the Y direction also in FIG. 26. On the left side of the test reticle TR in FIG. 26, also the effective projection area EIA indicated by a broken line is shown. Both ends of the effective projection area EIA in the non-scanning (X) direction are set to agree with the respective two sides, which extend in the Y direction, of the shading band LSB enclosing the pattern area of the test reticle TR as a rectangle.

Outside the shading band LSB of the test reticle TR, cross-shaped reticle alignment marks RMa and RMb are formed. The marks RMa and RMb are detected by a microscope for reticle alignment in the state where the test reticle TR is put on the reticle stage 8 (see FIG. 1) of the exposure apparatus, so that the test reticle TR is aligned with the reference points within the apparatus.

Inside the shading band LSB of the test reticle TR, test pattern areas TM(i,j), which are arranged in a matrix state with a predetermined pitch, are formed. Each of the test pattern areas TM(i,j) is formed by a rectangular shading layer (an oblique line portion) the entire size of which is approximately 1 to 2 mm, as expanded and shown in the lower portion of FIG. 26. In the shading layer, a Line & Space (L&S) pattern MX(i,j) having a periodicity in the X direction cycle and a L&S pattern MY(i,j) having a periodicity in the Y direction cycle are formed to be detected by the image detector KES. Also a LAMPAS mark MLP or a vernier mark Mvn, which are used to examine the resolution or the alignment precision, are formed in a transparent window MZ.

Additionally, shading parts TSa and TSc of a predetermined size are designed to be secured on both sides of the L&S pattern MX(i,j) in the X direction in the rectangular shading layer of the test pattern area TM(i,j). The squares of the shading parts TSa and TSc are set to be larger than that of the rectangular aperture 141 of the image detector KES on the projection image plane side. Similarly, shading parts TSa and TSb of the predetermined size are secured also on both side of the L&S pattern MY(i,j) in the Y direction.

It is assumed that the L&S patterns MX(i,j) and MY(i,j) shown in FIG. 26 have 10 transparent lines in the shading layer, and the width of the shading line between transparent lines and that of each transparent line are the same. However, the number of transparent lines, the ratio (duty) of the width of a transparent line to that of a shading line, etc. may be arbitrarily set. Note that the width of each transparent line in the cycle direction is set to be sufficiently resolvable by the projection optical system PL, and not to be extremely thick. By way of example, the line width is set in a range from $\Delta r$ to $4\Delta r$, which can be resolved by the projection optical system PL.

Figure 27:
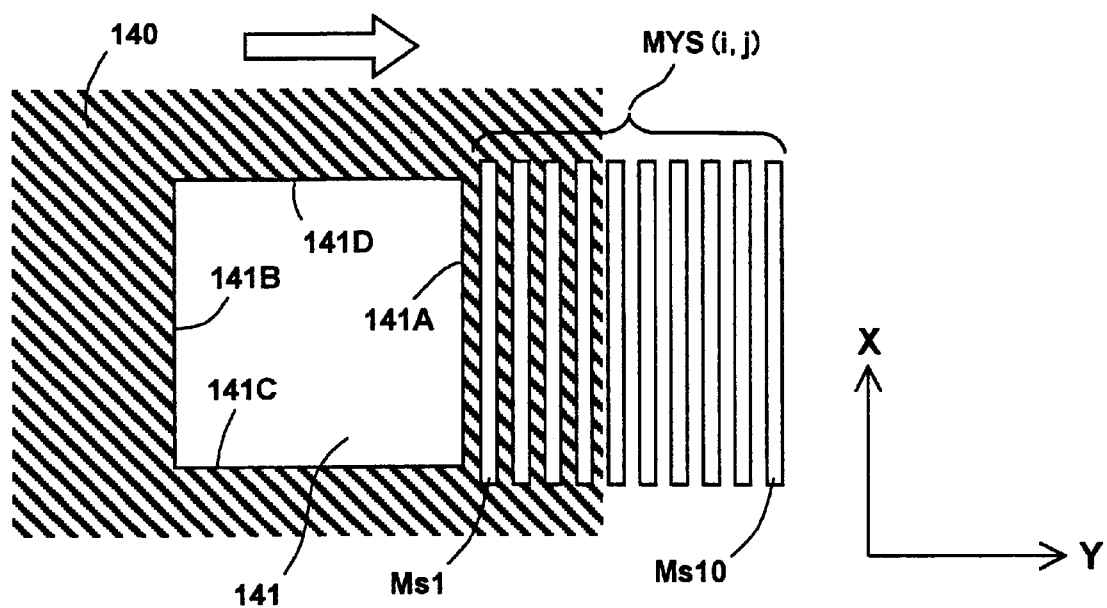
FIG. 27 is a schematic explaining the detection of the image of an L&S pattern on a test reticle, which is projected onto one location on a projection image plane.

When the test reticle TR shown in FIG. 26 is put on the reticle stage 8 of the exposure apparatus and aligned, the position of the wafer stage 14 is determined to be located in one test pattern area TM(i,j) to be measured by the rectangular aperture 141 of the image detector KES, as shown in FIG. 27.

FIG. 27 shows the positional relationship immediately before the rectangular aperture 141 scans the projection image MYS(i,j) of the L&S pattern MY(i,j) within one test pattern TM(i,j) in the Y direction. In the state shown in FIG. 27, the rectangular aperture 141 is completely shaded by the shading part TSb (or TSa) shown in FIG. 26. The rectangular aperture 141 moves from this position in FIG. 27 toward a first slit image (transparent line image) Ms1 in the right direction almost at a constant speed.

Figure 28:
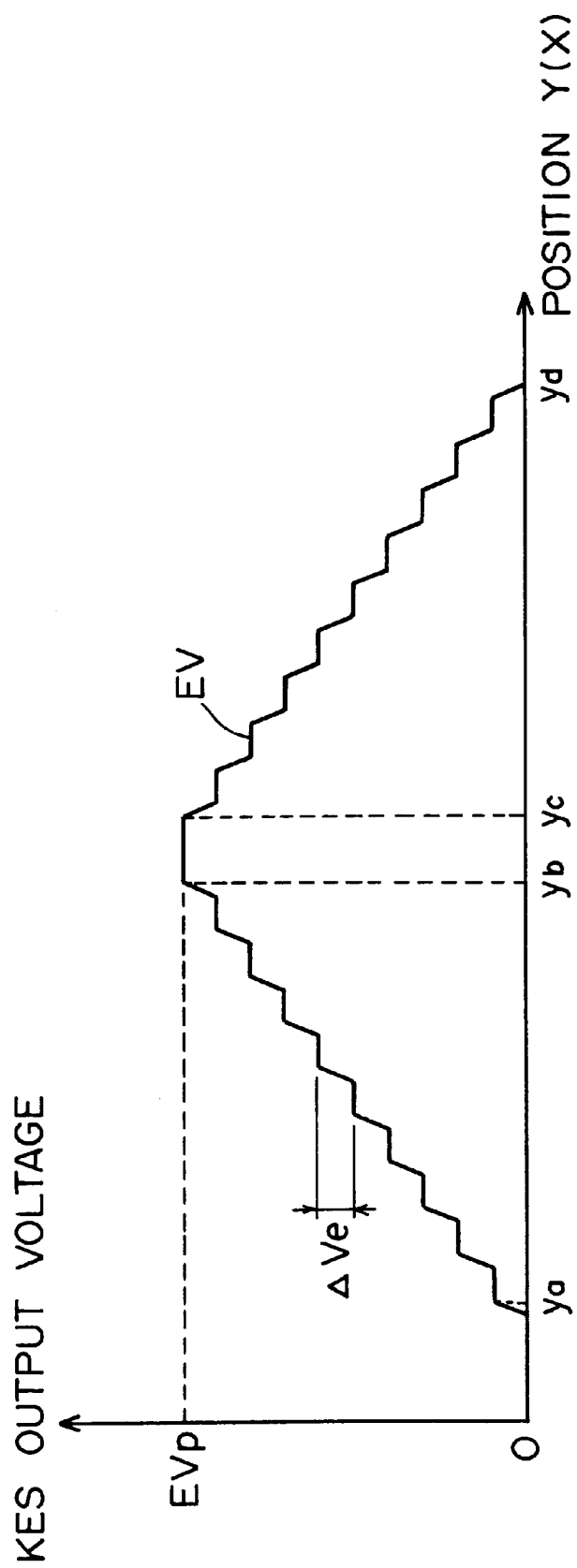
FIG. 28 is a chart exemplifying the waveform of the photoelectric signal output from the image detector.

At this time, the level of the photoelectric signal from the reception element 143 changes so that it rises the moment that an edge 141A on the right side of the rectangular aperture 141 traverses the first slit image Ms1 (position "ya"), and falls to "0" the moment or after an edge 141B on the right side of the rectangular aperture 141 traverses a tenth slit image Ms10 (position "yd"), as shown in FIG. 28.

FIG. 28 shows a signal waveform EV represented by taking the coordinate position of the wafer stage 14 (rectangular aperture 141) in the Y (or X) direction as the horizontal axis, and the voltage level of the photoelectric signal from the reception element 143 as the vertical axis. The signal waveform EV increases in a stairs state as the first slit image Ms1 to the tenth slit image Ms10 of the projection image MYS(i,j) sequentially go into the rectangular aperture 141, and reaches a maximum value EVp at a position "yb". Thereafter, when the wafer stage 14 passes through a position "yc", the signal waveform EV decreases in a stairs state as the slit images go out of the rectangular aperture 141 sequentially from Ms1 to Ms10.

A stepwise voltage change amount $\Delta Ve$ configuring such a waveform EV in the stairs state corresponds to the quantity of light of one of the slit images within the projection image MYS(i,j). The important portions in the position measurement using the signal waveform EV are the rising and the falling portions between the respective steps. The signal waveform EV in the stairs state is temporarily stored in the RAM 153A in FIG. 25. Then, the correction (division) of the intensity fluctuation of each illumination pulsed light is made by the CPU 154 for each data (voltage value) at each address in the RAM 153A.

Figures 29A, 29B:
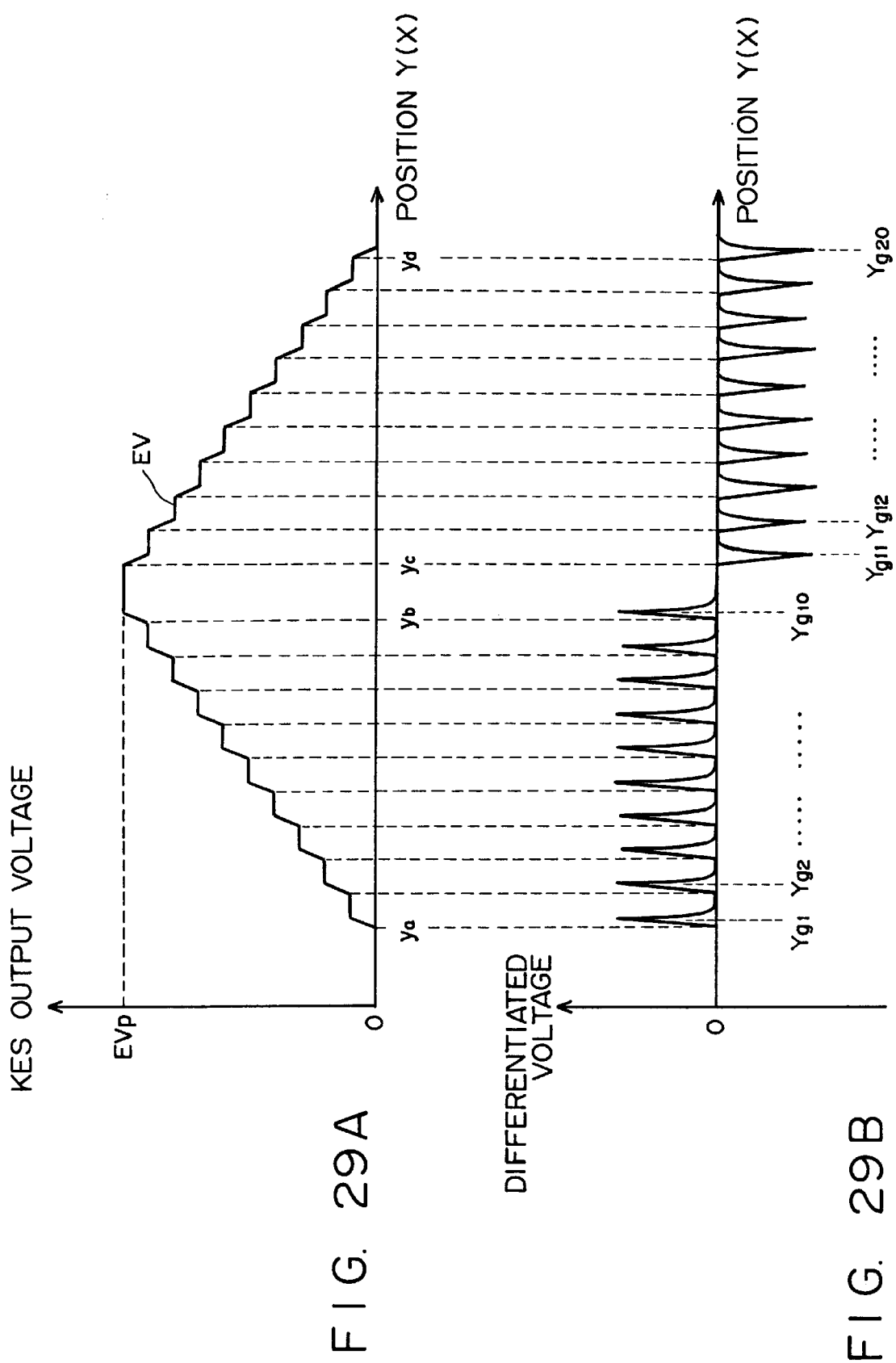
FIG. 29 is a chart showing the waveform of the signal output from the image detector and its differential signal.

Thus standardized signal waveform EV is further smoothed by the CPU 154, and the smoothed signal waveform is differentiated so that the rising and the falling positions between the respective steps are emphasized. Since the differentiated waveform is a rising waveform between the respective steps of the signal waveform EV again shown in FIG. 29(A) in the interval from the position "ya" to the position "yb" as shown in FIG. 29(B), it becomes a positively differentiated pulse. Additionally, since the waveform is a falling waveform between the respective steps of the signal waveform EW in the interval from the position "yc" to the position "yd", it becomes a negatively differentiated pulse. FIG. 29(A) again illustrates FIG. 8 for ease of understanding of the correspondence between the positions on the differentiated pulse waveform in FIG. 29(B) and the respective step positions on the original signal waveform EV.

After the CPU 154 shown in FIG. 25 makes a correspondence between the differentiated waveform shown in FIG. 29(B) and the Y (or X) coordinate position and stores the correspondence in its internal memory, it calculates the gravity center positions Yg1, Yg2, . . . , Yg20 for respective 20 pulses in the differentiated waveform, and determines the position YG(i,j) obtained by adding and averaging the respective positions Yg1 to Yg20. This position YG(i,j) is the Y coordinate value of the wafer stage 14, which is measured by the laser interferometer 62 when the central point of the projection image MYS(i,j) in the Y direction in FIG. 27 perfectly agrees with the median point of the segment linking the two edges 141A and 141B of the rectangular aperture 141.

As described above, the Y coordinate position of the projection image MYS(i,j) of each L&S pattern MY(i,j) within the test pattern areas TM(i,j) formed at the plurality of locations on the test reticle TR is sequentially measured. Also the X coordinate position of the projection image MXS(i,j) of each L&S pattern MX(i,j) within the test pattern areas TM(i,j) is measured with the exactly the same procedures.

In this case, the rectangular aperture 141 of the image detector KES is scanned in the X direction for the projection image MXS(i,j), and a pair of edges 141C and 141D which stipulate the width of the rectangular aperture 141 in the X direction in FIG. 27 operate as a knife-edge for the projection image MXS(i,j). Accordingly, the waveform EV of the photoelectric signal from the reception element 143 and its differentiated waveform are exactly the same as those shown in FIGS. 29(A) (B). However, since the central position XG(i,j) of the projection image MXS(i,j) in the X direction must be obtained, the pulse signal for counting from the receiver 62D within the laser interferometer 62 shown in FIG. 25 is switched to the pulse signal for counting, which is obtained from the receiver within the laser interferometer (16X in FIG. 13) measuring the move position of the wafer stage 14 in the X direction.

In this way, the projection coordinate position [XG(i,j), YG(i,j)] at the ideal lattice point stipulated by the L&S patterns MX(i,j) and MY(i,j) within each test pattern area TM(i,j) on the test reticle TR can be measured. By obtaining the difference in the X-Y direction between the measurement result and the coordinate position of each ideal lattice point on the test reticle TR, the static image distortion vector DV(Xi,Yj) at each ideal lattice point, which explained in FIGS. 14 or 15, can be obtained.

With the above described distortion measurement method, the static image distortion vector DV(Xi,Yj) is obtained after measuring each projection coordinate position [XG(i,j),YG(i,j)] of the L&S patterns MX(i,j) and MY(i,j). However, the image distortion vector DV(Xi,Yj) can be obtained without actually measuring each projection coordinate position [XG(i,j),YG(i,j)].

That is, the coordinate position of the ideal lattice point stipulated by the L&S patterns MX(i,j) and MY(i,j) on the test reticle TR is known beforehand in a design, also the projection image position (ideal projection position) when the ideal lattice point is projected through an ideal projection optical system PL is known beforehand in the design. Therefore, by way of example, at the stage where the differentiated waveform shown in FIG. 29(B) is generated in a memory, the reference address corresponding to the ideal projection position among the addresses in the memory is set by software, the position obtained by adding and averaging the respective gravity center positions of the 20 pulses of the differentiated waveform shown in FIG. 29(B) is determined as an identified address in the memory, and the difference value between the identified address and the above described reference address is multiplied by the value of the resolution (such as 10 nm) of the measurement pulse signal from the laser interferometer 62 (or 16X), so that the image distortion vector DV(Xi,Yj) can be directly calculated.

For the above described projection image detection using the image detector KES, there is a matter to be further considered. The matter is that the intensity distribution of unnecessary interference fringes is superposed on the intensity distribution of the pulsed illumination light irradiated on the reticle R with a contrast of several percent or so due to the use of the first and the second fly-eye lenses 7C and 7G shown in FIG. 1.

Therefore, When the wafer W is scan-exposed, the vibration mirror 7D arranged between the first and the second fly-eye lenses 7C and 7G in FIG. 1 is vibrated, a plurality of pulsed illumination lights are irradiated while deflecting the pulsed illumination light incident on the second fly-eye lens 7G by an infinitesimal amount in the non-scanning direction intersecting the moving (Y) direction of the reticle R at the time of scan-exposure, and the interference fringes is infinitesimally moved in the non-scanning direction on the reticle R (and the wafer W) for each of the plurality of pulsed illumination lights, so that the contrast of the interference fringes superposed on the pattern image which is projected and exposed onto the wafer W is sufficiently decreased by the accumulation effect of the resist layer.

However, the accumulation effect by the resist layer cannot be used when a projection image is detected with the image detector KES, unlike the case of the scan-exposure of the wafer W. Therefore, it is desirable to obtain a similar accumulation effect, for example, by a hardware process with the circuit configuration where the signal processing circuit in FIG. 25 is partially changed, or by a software process using the CPU 154.

Specifically, the method for sufficiently reducing the moving speed when the projection image MYS(i,j) or MXS(i,j) of the L&S pattern is scanned with the rectangular aperture 141 as shown in FIG. 27, and for providing a plurality of trigger signals to the control system 2 of the excimer laser light source 1 in response to one pulse of the pulse signal for counting from the laser interferometer 62 (or 16X in FIG. 13) in the state where the vibration mirror 7D is vibrated at high speed, can be adopted.

Figure 30:
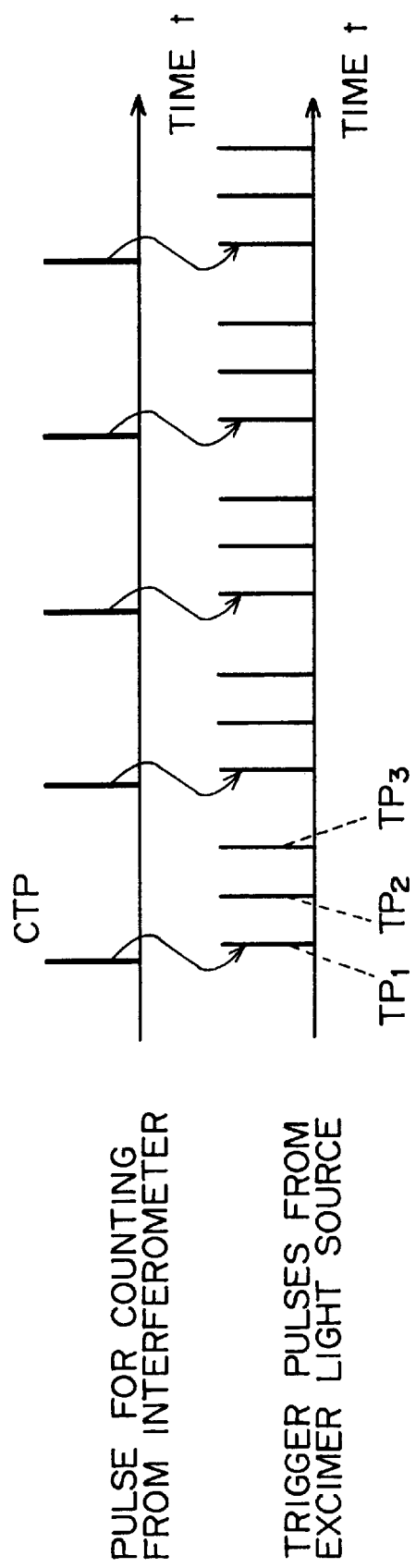
FIG. 30 is a timing chart showing the relationship between the measurement pulse of a laser interferometer for a wafer stage and the trigger pulse of an excimer laser light source.
Figure 31:
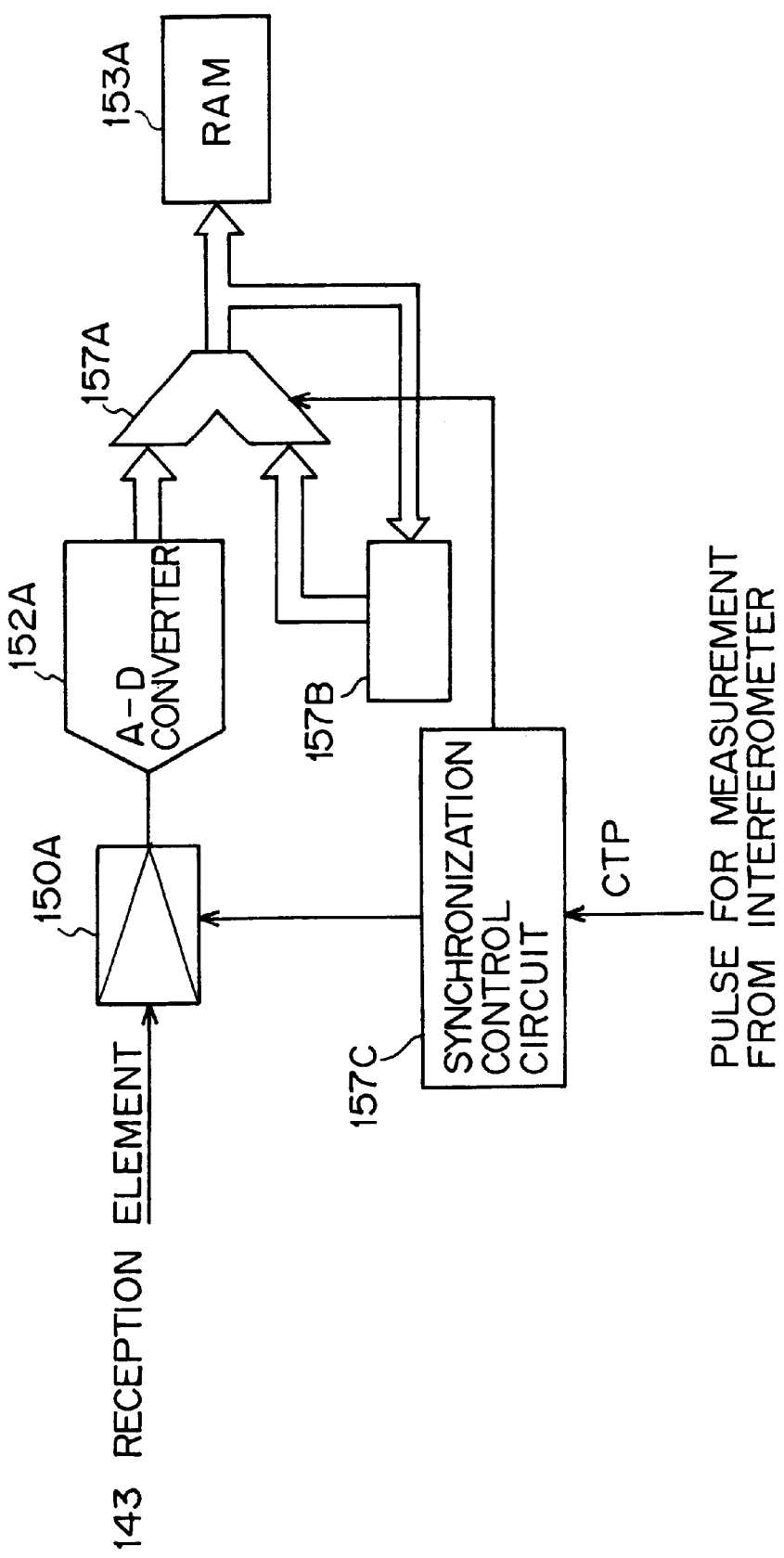
FIG. 31 is a circuit diagram exemplifying the modification of the processing circuit which digitally converts the photoelectric signal from the image detector and stores the converted signal.

Therefore, the method for obtaining the accumulation effect by the hardware process is briefly explained by referring to FIGS. 30 and 31. First of all, for example, 3 trigger pulses TP1, TP2, and TP3 are configured to be generated in response to one pulse of the pulse signal CP for counting from the laser interferometer 62 (or 16X) intended to measure the position of the wafer stage 14 as shown in FIG. 30, and the excimer laser light source 1 is made to oscillate in response to the respective trigger pulses TP1, TP2, and TP3.

Then, part of the signal processing circuit shown in FIG. 25 is changed to that shown in FIG. 31. In FIG. 31, the circuit is configured in a way such that an accumulator 157A which adds the output data of the A-D converter 152A and the data temporarily stored in a register 157B is connected next to the A-D converter 152A which converts the peak value of the photoelectric signal from the reception element 143 of the image detector KES into a digital value, and the result of the addition is stored in a RAM 253A similar to that shown in FIG. 25.

Additionally, the circuit is configured in a way such that a synchronization circuit 157C which outputs the trigger pulses TP1, TP2, and TP3 in response to the pulse signal for counting CTP from the interferometer is arranged to synchronize sequences, and the sample and the hold operations of the S/H circuit 150A are switched according to the respective trigger pulses TP1, TP2, and TP3. These trigger pulses TP1, TP2, and TP3 are transmitted also to the accumulator 157A, which sequentially adds the data output from the A-D converter 152A every three trigger pulses TP1, TP2, and TP3 (every three pulsed lights emission).

In such a configuration, the register 157B operate to be reset to "0" at the rising edge of the pulse signal for counting CTP from the interferometer, and the synchronization circuit 157C outputs the first trigger pulse TP1 after the register 157B is reset to "0". The S/H circuit 150A and the A-D converter 152A begin to operate in response to the output trigger pulse TP1. Then, the peak value EV1 of the signal output from the reception element 143 according to the first pulsed light emission is applied to one of input terminals of the accumulator 157.

Since the data of the register 157B is "0" at this time, the peak value EV1 emerges in the output of the accumulator 157A. This output is immediately transmitted to the register 157B and stored. After a predetermined amount of time elapses, the synchronization circuit 157C outputs the second trigger pulse TP2. Then, the peak value EV2 of the signal output from the reception element 143 according to the second pulsed light emission is applied to one of the input terminals of the accumulator 157A in a similar manner.

As a result, the addition value of the peak value EV2 from the A-D converter 152A and the peak value EV1 from the register 157B emerges in the output of the accumulator 157A, and this addition value is again transmitted to the register 157B. Similar operations are performed also for the third trigger pulse TP3. Consequently, the addition value of the peak values EV1, EV2, and EV3 which are respectively obtained by the three pulsed light emissions emerges in the output of the accumulator 157A, and this addition value is stored at a specified address in the RAM 153A.

In the above described embodiment, the three trigger pulses TP1, TP2, and TP3 are generated for one pulse of the pulse signal for counting from the interferometer. While these trigger pulses are generated, the angle of the vibration mirror 7D is infinitesimally changed. Therefore, the contrast component of the interference fringes superposed for each pulsed light emission on the image MXS(i,j) or MYS(i,j) projected onto the shading plate 140 of the image detector KES, is averaged, whereby the distortion of the signal waveform EV shown in FIG. 28 due to the interference fringes is reduced.

Except for the above described method, there are methods for reducing the precision deterioration due to the interference fringes when an image is measured using the image detector KES. One of them is a method for scanning the rectangular aperture 141 of the image detector KES a plurality of times for one projected L&S pattern image MXS(i,j) or MYS(i,j). In this case, the signal processing circuit is assumed to be the above described circuit shown in FIG. 25, the waveform process like the one shown in FIG. 29(A) (B) is performed in each of the plurality of times of the scanning for the rectangular aperture 141, and the central position (or the image distortion vector) of the projection image is averaged on the software of the CPU 154 after the central position (or the image distortion vector) is obtained for each scanning.

Since the angle of the vibration mirror 7D is infinitesimally changed while the rectangular aperture 141 is scanned a plurality of times as described above, the position of the interference fringes is infinitesimally shifted in each scanning for the rectangular aperture 141. As a result, the central position (or the image distortion vector) of the projection image which can possibly scatter and be measured due to the influence of the interference fringes contrast can be averaged and obtained, thereby improving the measurement accuracy that much.

In the above described configuration, the wafer stage 14 is scanned in the X or the Y direction when a projection image is detected with the image detector KES. However, a similar distortion measurement can be made also by making the image detector KES stationary at a certain measurement position, and by infinitesimally moving the reticle R in the X or the Y direction. Additionally, the image detector KES (wafer stage 14) and the reticle R may be synchronously moved at a speed rate different from the initial speed rate, for example, in the Y direction (scan-exposure direction), and the signal waveform obtained from the reception element 143 may be analyzed during that time period.

In this case, both of the rectangular aperture 141 and the projection image MYS(i,j) move in one direction along the Y direction with a constant speed difference, and the projection image MYS(i,j) is relatively scanned by the rectangular aperture 141 by the speed difference, so that also the signal from the reception element 143 becomes the waveform in a stairs state. When both of the reticle R and the image detector KES are synchronously moved as described above, strictly speaking, the static distortion characteristic at an ideal lattice point is not truly measured. However, if the waveform of the photoelectric signal at that time is analyzed, the averaged image distortion vector in a local range, where the L&S pattern projection image MYS(i,j) is scanned and moved within the projection field IF, that is, the dynamic distortion characteristic can be known.

Figure 32:
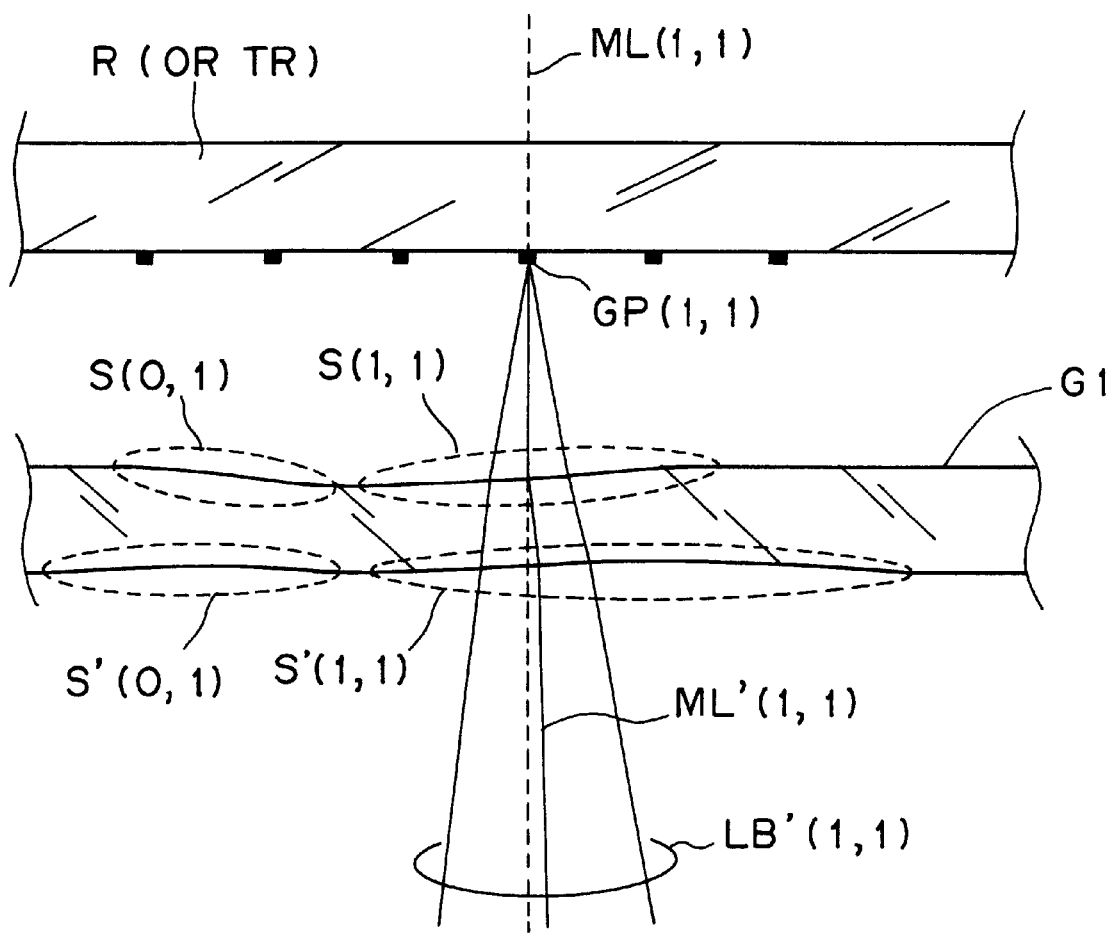
FIG. 32 is a schematic exaggeratingly exemplifying the case where both sides of an image distortion correction plate are polished.

When the image distortion correction plate G1 is polished with the polishing processor shown in FIG. 22 based on the result of the above described automatic measurement, not only one side of the image distortion correction plate G1 as shown in FIG. 20, but both of its sides may be polished as show in FIG. 32. FIG. 32 exaggeratingly shows part of the section of the image distortion correction plate G1 through which the image formation luminous flux LB'(1,1) from one lattice point GP(1,1) on the reticle R or the test reticle TR passes.

In the case of FIG. 32, polishing areas S'(1,1) and S'(0,1) are set on the back surface of the image distortion correction plate G1 (on the projection optical system PL side) in correspondence with polishing areas S(1,1) and S(0,1) on the front surface. Also each of the polishing areas S'(1,1) and S'(0,1) on the back surface is polished to be a slope of a wavelength order in order to give an infinitesimal deflection angle optimum for the image formation luminous flux (principal ray).

By way of example, the image formation luminous flux LB'(1,1) shown in FIG. 32 is deflected by the two infinitesimal slopes of the polishing areas S(1,1) and S'(1,1). Accordingly, if the tilt directions and amounts of the polishing areas S(1,1) and S'(1,1) are set to be almost the same, only the local areas can be modified on a tilted parallel plate, so that the deflection-corrected principal ray MB'(1,1) can be restored to be almost parallel to the optical axis AX. Therefore, there is an advantage that the principal ray MB'(1,1) from the object point GP(1,1) becomes almost vertical to the projection image plane of the projection optical system PL, and the telecentric state is maintained.

Additionally, if both sides of the image distortion correction plate G1 are polished, a plurality of adjacent polishing areas which cannot but overlap among the polishing areas S(i,a) and S(i,b) can be separated on the front and the back surfaces of the image distortion correction plate G1 even if they exist, as explained earlier by referring to FIG. 21. As a result, there is an additional advantage that the joining of the polished planes on the same surface becomes smooth, which leads to the implementation of a more precisely distortion correction.

According to the above described embodiment, optical correction members (G1, G3, G4, etc.) to be inserted in the projection optical path between the mask (reticle R) and the substrate to be exposed (wafer W) are polished by using the dynamic aberration information which is added and averaged, and specific to the scan-exposure, thereby obtaining an effect of allowing the surface shapes and the areas of the optical correction members to be designed with high precision.

Furthermore, since also the surface shape to be polished can be much moderately set, a significant effect of improving the polishing processing accuracy can be obtained.

According to the above described embodiment, a satisfactory correction can be made also to the aberrations such as an astigmatism/coma characteristic, image plane curvature, or a telecentric error other than the distortion characteristic among the various aberration characteristics which become problems in the case of the scan-exposure method.

Normally, the astigmatism aberration occurring in the case of the static exposure method can be corrected by infinitesimally tilting to the plane vertical to the projection optical axis the parallel plate (quartz, etc.) inserted between the lens element which is closest to the image side in the projection optical system and the substrate to be exposed.

In the case of the scan-exposure method, the area contributing to the exposure within the projection field is a rectangular slit shape or an arc-slit shape. Moreover, considering that the astigmatism characteristic which is added and averaged in the scanning direction becomes dynamic, the dynamic astigmatism aberration may increase in the center portion of the slit-shaped projection area, or non-linear (or random) astigmatism may occur in some cases.

Accordingly, it becomes possible to make an astigmatism correction with high precision by locally modifying the surface of the astigmatism/coma correction plate arranged in the neighborhood of the image plane in the optical path of an exposure light, whereby an effect of removing these aberrations can be obtained.

Furthermore, the image plane curvature among the respective optical aberrations can be corrected by replacing the lens element having a long curvature radius, which is arranged between the projection optical system and the substrate to be exposed, with a lens element of the same diameter having a slightly different curvature radius, in the case of the static exposure method.

In the case of the scan-exposure method, since the static image plane curvature characteristic is added and averaged in the scanning direction, a non-linear (random) image plane curvature error, which cannot be modified only by correcting the image plane tilt and the image plane curvature with replacement of lens elements in the static exposure method, can possibly remain.

According to the above described embodiment, an image plane curvature correction plate which can correct a non-linear (random) image plane curvature error with high accuracy, can be generated, whereby the projection image plane by the projection optical system can be made into a parallel plane which is entirely or locally even, and a DOF (Depth of Focus) can be significantly improved.

Additionally, the technique for correcting respective aberration characteristic types or the technique for manufacturing correction plates in the above described embodiment is essential especially when a circuit pattern having a minimum line width of 0.08 to 0.2 $\mu$m or so is projected and exposed onto the substrate to be exposed to which a planarization technique is applied through a high-NA projection optical system with the image side numerical aperture of 0.65 or more.

However, since the respective static aberrations within the projection area are averaged in the scanning direction in the scan-exposure method explained in the embodiments of this application, the aberration (image quality) occurring in the image transferred onto the exposed substrate can possibly deteriorate in comparison with the portions within the projection area, where the respective static aberrations are minimized.

Accordingly, the averaging in the state where an image deterioration occurs must not be performed. Therefore, the correction using a reduction is made by infinitesimally moving the lens elements and optical members so as to minimize the respective aberrations as little as possible when the projection optical system itself is assembled or adjusted. Furthermore, the positions of the lens elements or the optical members within the lens barrel are infinitesimally adjusted, etc. in the state where the lens barrel of the projection optical system is installed in the body of the apparatus, and all possible efforts must be made to remove a liner aberration (an aberration characteristic which can be function-approximated) from a calculation value.

Then, the optical correction members are processed to correct an aberration for the non-linear error (random component) which remains after the linear aberration is removed, whereby the linear and the random aberration components can be suppressed almost to "0".

As described above, in this embodiment, a dynamic distortion characteristic is determined based on the result of actual test printing with a scan-exposure method. This method is applicable also to the case where the respective image formation aberration types such as a dynamic telecentric error characteristic, a dynamic astigmatism/coma characteristic, etc. are measured, in exactly the same manner. Additionally, in this embodiment, a dedicated device for examining and measuring mark projection images TM'(i,j) at a plurality of positions on a test-printed wafer, or an alignment system of a projection exposure apparatus is required. However, since the position of a mark projection image which is actually formed on a resist layer, the resolution state of a projection image, the difference due to the directionality of an L&S pattern image, etc. are actually measured, measurements based on the actual optical characteristics of the illumination optical system and the projection optical system PL of the projection exposure apparatus can be made.

The exposure apparatus according to this embodiment is applicable also to an exposure apparatus of a step-and-repeat type, which exposes a pattern of a mask in a state where the mask and a substrate are made stationary, and sequentially stepmoves the substrate.

Additionally, as a projection optical system, a material which passes a far-ultraviolet ray through, such as quartz or fluorite, is used as a glass material when the far-ultraviolet light such as an excimer laser, etc. is used. If an $F_2$ laser or an X ray is used, an optical system such as a catadioptric system or a dioptric system can be used. As a reticle, a reflection type my be used.

Furthermore, if a linear motor (refer to U.S. Pat. No. 5,623,853 or U.S. Pat. No. 5,528,118) is used for a wafer stage or a reticle stage, either of an air floating type using an air bearing and a magnetic floating type using Lorentz force or reactance force may be used. Still further, a stage may be of a type moving along a guide or of a guideless type having no guide.

Still further, the repulsion force generated by the moving of a wafer stage may be mechanically freed to a floor (the earth) by using a frame member, as recited in the Japanese laid-open Publication No. 8-166475 (U.S. Pat. No. 5,528,118).

Still further, the repulsion force generated by the moving of a reticle stage may be freed to a floor (the earth) by using a frame member, as recited in the Japanese laid-open Publication No. 8-330224.

Optical adjustments are made by embedding the above described illumination optical system and the projection optical system, which are composed of a plurality of optical elements, wires and pipes are connected after a reticle stage and a wafer stage, which are composed of many mechanical parts, in an exposure apparatus itself, and overall adjustments (electricity adjustment, operation verification, etc.) are further made, so that the exposure apparatus according to this embodiment can be manufactured. It is desirable to manufacture the exposure apparatus in a clean room where the temperature, the degree of cleanliness, etc. are managed.

Still further, a semiconductor device is manufactured by: a step of designing the functionality and the performance of the device; a step of manufacturing a wafer from a silicon material; a step of exposing a reticle pattern onto a wafer with the above described exposure apparatus according to the embodiment; a step of assembling the device (including a dicing process, a bonding process, a packaging process, etc.); and a step of making an examination.

As described above, according to the present invention, correction optical members (G1, G3, G4, etc.) which are locally polished to correct dynamic aberration characteristics are inserted in a projection optical path between a mask (reticle R) and a substrate to be exposed (wafer W) by using the dynamic aberration information which is inherent in a scan-exposure apparatus and is added and averaged in the scanning direction, whereby a significantly high aberration correction accuracy at the time of exposure can be obtained.

Accordingly, the accuracy of distortion matching or mixing & matching can be kept to be several to several tens nm, when a plurality of projection exposure apparatuses are mixed and used at the time of overlay and exposure on a manufacturing line of a semiconductor device, whereby a significant effect of improving the yield of semiconductor device manufacturing can be realized.

What is claimed is:

1. An exposure apparatus exposing a substrate by projecting an image of a pattern of a mask onto the substrate, comprising:

a projection optical system, which is arranged between the mask and the substrate, and which projects the image of the pattern of the mask onto the substrate; and an astigmatism correction plate which corrects a non-linear astigmatism characteristic of the image of the pattern, astigmatic aberration of the image at a plurality of positions within a projection area of said projection optical system having a non-linear relation with each other.

2. The exposure apparatus according to claim 1, further comprising a measurement device, which is arranged on an image plane side of said projection optical system, measuring the astigmatism aberration at each of the plurality of positions within the projection area.

3. The exposure apparatus according to claim 1, further comprising an image plane curvature correction member, which is arranged between the mask and the substrate, correcting non-linear image plane curvature of the image of the pattern within the projection area of said projection optical system.

4. The exposure apparatus according to claim 1, further comprising:

a distortion correction member, which is arranged between the mask and the substrate, respectively correcting non-linear distortions of the image of the pattern within the projection area of said projection optical system.

5. An exposure apparatus exposing a substrate by projecting an image of a pattern of a mask onto the substrate, comprising:

a projection optical system, which is arranged between the mask and the substrate, and which projects the image of the pattern of the mask onto the substrate; and a coma correction plate, which is arranged between the mask and the substrate, which corrects a non-linear coma characteristic of the image of the pattern, comatic aberration of the image of a plurality of positions within the projection area of said projection optical system having a non-linear relation with each other.

6. The exposure apparatus according to claim 5, further comprising a measurement device, which is arranged on an image plane side of said projection optical system, measuring the comatic aberration at each of the plurality of positions within the projection area.

7. The exposure apparatus according to claim 5, further comprising an image plane curvature correction member, which is arranged between the mask and the substrate, correcting non-linear image plane curvatureof the image of the pattern within the projection area of said projection optical system.

8. The exposure apparatus according to claim 5, further comprising:

a distortion correction member, which is arranged between the mask and the substrate, respectively correcting non-linear distortions of the image of the pattern within the projection area of said projection optical system.

9. A projection exposure apparatus which scan-exposes a substrate with a pattern on a mask, comprising:
- a projection optical system having a predetermined image formation characteristic;
- a driving mechanism which moves the mask and the substrate in a one-dimensional scanning direction relative to said projection optical system;
- a restricting mechanism that restricts an image of the pattern, which is projected on an image plane side of said projection optical system, to within a projection area having a predetermined width in the one-dimensional scanning direction; and
- at least one optical correction element which is arranged within said projection optical system, and is optically processed to correct an average vector obtained by averaging image distortion vectors at a plurality of image points existing along the one-dimensional scanning within the projection area at each of a plurality of positions in a non-scanning direction intersecting the one-dimensional scanning direction within the projection area.

10. The apparatus according to claim 9, wherein
said optical correction element is arranged in a telecentric space where a principal ray becomes almost vertical to an object plane or an image plane of said projection optical system in an image formation optical path of said projection optical system.

11. The apparatus according to claim 10, wherein
said optical correction element is made of a transparent optical glass material arranged at least one of the object plane side and the image plane side, and a surface portion corresponding to the projection area of the transparent optical glass material is optically processed to have a locally different surface shape in order to make the average vector at each of the plurality of positions in the non-scanning direction almost identical.

12. The apparatus according to claim 11, wherein
the transparent optical glass material is held in a state of being parallel to the object plane or the image plane of said projection optical system, or a state of being tilted relative to the object plane or the image plane.

13. The apparatus according to claim 11, wherein
a surface shape of a surface of the transparent optical glass material is optically and locally processed so that a random error component obtained by removing a linear error component from the average vector at each of the plurality of positions in the non-scanning direction is within $\pm(\Delta r/10)$, if a minimum size of a pattern image which can be resolved on the image plane side through said projection optical system is $\Delta r$.

* * * * *